United States Patent
Hatakeyama et al.

(10) Patent No.: US 7,514,204 B2
(45) Date of Patent: Apr. 7, 2009

(54) RESIST COMPOSITION AND PATTERNING PROCESS

(75) Inventors: Jun Hatakeyama, Joetsu (JP); Wataru Kusaki, Joetsu (JP); Yuji Harada, Joetsu (JP); Takao Yoshihara, Joetsu (KR)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 10 days.

(21) Appl. No.: 11/976,279

(22) Filed: Oct. 23, 2007

(65) Prior Publication Data

US 2008/0096131 A1 Apr. 24, 2008

(30) Foreign Application Priority Data

Oct. 24, 2006 (JP) .............................. 2006-288456

(51) Int. Cl.
*G03F 7/004* (2006.01)
*G03F 7/30* (2006.01)

(52) U.S. Cl. .................... 430/270.1; 430/326; 430/905; 430/907; 430/910

(58) Field of Classification Search .............. 430/270.1, 430/326, 905, 907, 910
See application file for complete search history.

(56) References Cited

U.S. PATENT DOCUMENTS

| | | | |
|---|---|---|---|
| 5,278,022 A * | 1/1994 | Wade et al. | ................. 430/176 |
| 5,714,625 A | 2/1998 | Hada et al. | |
| 6,004,724 A | 12/1999 | Yamato et al. | |
| 6,063,953 A | 5/2000 | Hada et al. | |
| 6,261,738 B1 | 7/2001 | Asakura et al. | |
| 6,512,020 B1 | 1/2003 | Asakura et al. | |
| 6,977,131 B2 * | 12/2005 | Tao | .......................... 430/270.1 |
| 7,125,641 B2 * | 10/2006 | Harada et al. | ............ 430/270.1 |

FOREIGN PATENT DOCUMENTS

| | | |
|---|---|---|
| JP | 2906999 B2 | 11/1995 |
| JP | 9-95479 A | 4/1997 |
| JP | 9-230588 A | 9/1997 |
| JP | 9301948 A | 11/1997 |
| JP | 2000-314956 A | 11/2000 |
| JP | 2005-264131 A | 9/2005 |

OTHER PUBLICATIONS

Lin, B.J., Proc. SPIE, vol. 4690, pp. xxix-xlii.
Owa, Soichi et al., Proceedings fo SPIE, vol. 5040, pp. 724-733, 2003.
Arimitsu, Koji et al., Journal of Photopolymer Science and Technology, vol. 8, No. 1, pp. 43-46, 1995.
Arimitsu, Koji et al., Journal of Photopolymer Science and Technology, vol. 9, No. 1, pp. 29-30, 1996.
$2^{nd}$ International Symposium on Immersion Lithography, Sep. 12-15, 2005, "Defectivity Data Taken with a Full-Field Immersion Exposure Tool".
$2^{nd}$ Immersion Workshop, Jul. 11, 2003, "Resist and Cover Material Investigation for Immersion Lithography".

* cited by examiner

*Primary Examiner*—John S Chu
(74) *Attorney, Agent, or Firm*—Birch, Stewart, Kolasch & Birch, LLP

(57) ABSTRACT

A resist composition comprises a polymer which increases its alkali solubility under the action of an acid as a base resin, and a copolymer comprising recurring units containing a sulfonic acid amine salt and recurring units containing at least one fluorine atom as an additive. The composition is suited for immersion lithography.

12 Claims, No Drawings

RESIST COMPOSITION AND PATTERNING PROCESS

CROSS-REFERENCE TO RELATED APPLICATION

This non-provisional application claims priority under 35 U.S.C. §119(a) on Patent Application No. 2006-288456 filed in Japan on Oct. 24, 2006, the entire contents of which are hereby incorporated by reference.

TECHNICAL FIELD

This invention relates to resist compositions for use in the lithography technology for the microfabrication of semiconductor devices or the like, especially the immersion photolithography utilizing an ArF excimer laser of wavelength 193 nm as the light source and interposing water between a projection lens and a wafer. It also relates to a patterning process using the resist compositions.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source.

As the light source used in the lithography for resist pattern formation, g-line (436 nm) or i-line (365 nm) from a mercury lamp was widely used. One means believed effective for further reducing the feature size is to reduce the wavelength of exposure light. For the mass production process of 64 MB dynamic random access memories (DRAM, processing feature size 0.25 μm or less) and later ones, the exposure light source of i-line (365 nm) was replaced by a KrF excimer laser having a shorter wavelength of 248 nm.

However, for the fabrication of DRAM with a degree of integration of 256 MB and 1 GB or more requiring a finer patterning technology (processing feature size 0.2 μm or less), a shorter wavelength light source is required. Over a decade, photolithography using ArF excimer laser light (193 nm) has been under active investigation.

It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices.

For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE Vol. 4690 xxix).

In the ArF immersion lithography, the space between the projection lens and the wafer is filled with water. Since water has a refractive index of 1.44 at 193 nm, pattern formation is possible even using a lens with NA of 1.0 or greater. Theoretically, it is possible to increase the NA to 1.35. The resolution is improved by an increment of NA. A combination of a lens having NA of at least 1.2 with ultra-high resolution technology suggests a way to the 45-nm node (see Proc. SPIE Vol. 5040, p724).

Several problems associated with the presence of water on resist were pointed out. Because the photoacid generator in the resist film, the acid generated therefrom upon exposure, and the amine compound added to the resist as a quencher can be leached in water in contact with the resist film, pattern profile changes occur. The pattern collapses due to swelling of the resist film with water.

With respect to the leaching of resist components into water, a study started from the standpoint of preventing the projection lens of the lithography system from contamination. Several lithography system manufacturers proposed the limit of leach-outs.

For overcoming these problems, it was proposed to provide a protective coating of perfluoroalkyl compound between the resist film and water (see the 2nd Immersion Workshop, Jul. 11, 2003, Resist and Cover Material Investigation for Immersion Lithography). The provision of such a protective coating avoids direct contact between the resist film and water and inhibits the resist film from being leached with water.

However, protective coatings made of perfluoroalkyl compounds use fluorocarbons like Freon® as the diluent for controlling a coating thickness. As is well known, the use of fluorocarbons is a consideration in view of environmental protection. In addition, the protective coating must be stripped prior to development of the resist film. Therefore, special units for coating and stripping of the protective film must be added to the existing system. Fluorocarbon solvents add to the expense. These factors raise serious problems on practical use.

One means proposed for mitigating practical drawbacks of the protective film of solvent stripping type is a protective film of the type which is soluble in alkaline developer (JP-A 2005-264131). The alkali-soluble protective film is epoch-making in that it eliminates a need for a stripping step or a special stripping unit because it can be stripped off at the same time as the development of a photoresist film.

The ArF immersion lithography systems commercially available at the present are designed such that water is partly held between the projection lens and the wafer rather than immersing the resist-coated substrate fully in water, and exposure is carried out by scanning the wafer-holding stage at a speed of 300 to 550 mm/sec. Because of such high-speed scanning, water cannot be held between the projection lens and the wafer, and water droplets are left on the surface of the resist film or protective film after scanning. It is believed that residual droplets cause defective pattern formation.

To eliminate the droplets remaining on the surface of the resist or protective film after scanning, it is necessary to improve the flow or mobility of water on the relevant coating film. It is reported that the number of defects associated with the immersion lithography can be reduced by increasing the receding contact angle of the resist or protective film with water. See 2nd International Symposium on Immersion Lithography, 12-15 Sep. 2005, Defectivity data taken with a full-field immersion exposure tool, Nakano et al. It is noted that the method of measuring a receding contact angle includes a sliding method of inclining a substrate and a suction method of sucking up water, with the sliding method being widely accepted.

If residues are left on the resist film after development, there arise defects which are known as blobs. The blob defects occur because the protective coating or resist material is precipitated during rinsing after development and deposited on the resist film again, and are found more often when the resist film after development is more hydrophobic. For the resist for use in the immersion lithography in combination with a protective coating, if mixing occurs between the protective coating and the resist coating, the hydrophobic protective coating can be left on the surface of the resist coating after development, leading to blob defects on the resist coating. It is then necessary to prevent intermixing between the protective coating and the resist coating so that no protective coating is left after development.

In the electron beam writing lithography, there arises a problem that electric charges accumulate in the resist coating during exposure. The charge accumulation may be avoided by forming a water-soluble antistatic coating on the photoresist. The antistatic coating is formed of materials comprising a water-soluble polymer and an amine salt of sulfonic acid added thereto. The negative charges generated by electron beam exposure are transferred through the antistatic coating to the earth side of a wafer chuck where they are released. However, the antistatic coating, when formed on the photoresist coating, adds an additional coating step and a coating material cost to the overall process, which are undesirable. It would be desirable to have a photoresist having an antistatic function, eliminating a need for a separate antistatic coating.

DISCLOSURE OF THE INVENTION

An object of the invention is to provide a photoresist composition which when coated as photoresists, forms a resist layer having a surface modified so as to contain an amine salt of sulfonic acid, wherein the resist layer prevents intermixing between resist and protective layers when a protective layer is formed on the resist layer, and the resist layer on Its surface is more hydrophilic after exposure and development, thus preventing blob defects from generating, and which composition, when used as electron beam resists, is effective for preventing accumulation of charge on the resist film surface due to charging during e-beam exposure.

Another object is to provide a patterning process using the resist composition.

In a first aspect, the invention provides a resist composition comprising a polymer which increases its alkali solubility under the action of an acid as a base resin, and a copolymer comprising recurring units containing a sulfonic acid amine salt and recurring units containing at least one fluorine atom as an additive.

In a preferred embodiment, the copolymer has the general formula (1).

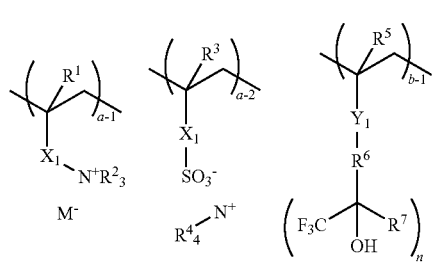

(1)

-continued

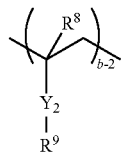

Herein $R^1$, $R^3$, $R^5$, and $R^8$ are each independently hydrogen or methyl. $X_1$ and $Y_2$ are each independently selected from the group consisting of a single bond, —O—$R^{10}$—, —C(=O)—O—$R^{10}$—, —C(=O)—NH—$R^{10}$—, a straight or branched $C_1$-$C_4$ alkylene, and phenylene group, wherein $R^{10}$ is a straight, branched or cyclic $C_1$-$C_{10}$ alkylene group which may contain an ester or ether group. The subscript n is equal to 1 or 2. In case of n=1, $Y_1$ is selected from the group consisting of a single bond, —O—$R^{10}$—, —C(=O)—O—$R^{10}$—, —C(=O)—NH—$R^{10}$—, a straight or branched $C_1$-$C_4$ alkylene, and phenylene group, wherein $R^{10}$ is as defined above. In case of n=2, $Y_1$ is selected from the group consisting of —O—$R^{101}$=, —C(=O)—O—$R^{101}$=, —C(=O)—NH—$R^{101}$=, a straight or branched $C_1$-$C_4$ alkylene group with one hydrogen atom eliminated, and a phenyl group with one hydrogen atom eliminated, wherein $R^{101}$ is a straight, branched or cyclic $C_1$-$C_{10}$ alkylene group with one hydrogen atom eliminated which may contain an ester or ether group. $X_2$ is selected from the group consisting of a single bond, —O—$R^{11}$—, —C(=O)—O—$R^{11}$—, a straight or branched $C_1$-$C_4$ alkylene, and phenylene group, wherein $R^{11}$ is a straight, branched or cyclic $C_1$-$C_{10}$ alkylene group which may contain an ester or ether group and may contain a fluorine atom. $R^2$ and $R^4$ are each independently selected from the group consisting of hydrogen, a straight, branched or cyclic $C_1$-$C_{20}$ alkyl or $C_2$-$C_{20}$ alkenyl group which may contain a hydroxy, ether, ester, cyano, amino group, double bond or halogen atom, and a $C_6$-$C_{10}$ aryl group, plural $R^2$ or $R^4$ may bond together to form a ring of 3 to 20 carbon atoms. $M^-$ is a non-nucleophilic counter ion. $R^6$ is a straight, branched or cyclic $C_1$-$C_{12}$ alkylene group. $R^7$ is hydrogen, fluorine, methyl, trifluoromethyl or difluoromethyl, or $R^7$ may bond with $R^6$ to form a ring which may contain an ether group, fluorinated alkylene group or trifluoromethyl group. $R^9$ is a straight, branched or cyclic $C_1$-$C_{20}$ alkyl group which has at least one fluorine atom substituted thereon and which may contain an ether, ester or sulfonamide group. The subscripts (a-1), (a-2), (b-1), and (b-2) are numbers in the range: $0 \leq (a-1) < 1.0$, $0 \leq (a-2) < 1.0$, $0 < (a-1)+(a-2) < 1.0$, $0 \leq (b-1) < 1.0$, $0 \leq (b-2) < 1.0$, $0 < (b-1)+(b-2) < 1.0$, and $0.5 \leq (a-1)+(a-2)+(b-1)+(b-2) \leq 1.0$.

When the resist composition is used to form a resist layer, the resist layer has a sulfonic acid salt oriented on its surface, which prevents intermixing between resist and protective layers when a protective layer is formed on the resist layer. The resist layer on its surface is more hydrophilic after development, thus preventing blob defects from generating.

Typically the resist composition is a chemically amplified resist composition which may be either positive or negative. When the resist composition is positive, the base resin is specifically a polymer comprising recurring units having acid labile groups and recurring units having hydroxy groups and/or adhesive groups of lactone ring.

Where the base resin includes recurring units having hydroxy groups and/or adhesive groups of lactone ring, the chemically amplified positive resist composition ensures tight adhesion to a substrate. Where the base resin includes recurring units having acid labile groups, the acid labile groups are deprotected with the acid generated by the acid generator during exposure so that the exposed area of resist is converted to be soluble in a developer, ensuring that a pattern is formed at a very high precision.

Also preferably the resist composition further comprises at least one member selected from among an organic solvent, a basic compound, a dissolution regulator, a crosslinker, and a surfactant.

The inclusion of an organic solvent can facilitate to coat the resist composition to substrates or the like. The inclusion of a basic compound can hold down the diffusion rate of acid within the resist film, leading to a further improved resolution. The inclusion of a dissolution regulator can increase the difference in dissolution rate between exposed and unexposed areas, leading to a further improved resolution. The addition of a surfactant can further facilitate or control the coating operation of the resist composition. For the chemically amplified resist composition which is negative, a crosslinker is compounded.

In another aspect, the invention provides a pattern forming process comprising the steps of applying the aforementioned resist composition onto a substrate to form a coating, heat treating the coating and exposing it to high-energy radiation, and developing the exposed coating with a developer. The step of heat treatment may be included after the exposing step and before the developing step. The process may further include subsequent steps such as etching, resist removal and cleaning. Preferably the high-energy radiation has a wavelength of 180 to 250 nm.

In preferred embodiments, the exposing step is by immersion lithography involving exposing the coating to high-energy radiation through a liquid. The process may further comprise the step of forming a protective coating so that the protective coating intervenes between the photoresist coating and the liquid during the immersion lithography. The protective coating is typically an alkali-soluble protective film based on a polymer having an α-trifluoromethylhydroxy group.

The immersion lithography may involve using high-energy radiation having a wavelength of 180 to 250 nm, introducing a liquid between the resist-coated substrate and a projection lens, and exposing the substrate to the high-energy radiation through the liquid. The liquid is typically water.

BENEFITS OF THE INVENTION

The resist film formed from the inventive resist composition has a surface which is made hydrophilic to prevent blob defects from generating on the resist film after development. The resist film also prevents intermixing between the resist film and a protective layer which is formed in the immersion lithography for protecting the resist film, thus preventing the pattern profile from being degraded.

DESCRIPTION OF THE PREFERRED EMBODIMENTS

The terms "a" and "an" herein do not denote a limitation of quantity, but rather denote the presence of at least one of the referenced item.

As used herein, the notation ($C_n$-$C_m$) means a group containing from n to m carbon atoms per group.

In the immersion lithography, a protective layer is formed on a photoresist layer, and water is held between the protective layer and a projection lens. The photoresist layer having a specific polymer additive compounded therein is effective for preventing intermixing between the resist layer and the protective layer and presents a surface which is hydrophilic after development, for preventing defect generation. Further studying the composition and compounding of the polymer additive, we have completed the invention.

Polymeric Surfactant

The resist composition of the invention is defined as comprising a polymer which increases its alkali solubility under the action of an acid as a base resin, and a copolymer comprising recurring units containing a sulfonic acid amine salt and recurring units containing at least one fluorine atom as an additive.

In a preferred embodiment, the recurring units containing a sulfonic acid amine salt and recurring units containing at least one fluorine atom are represented by the general formula (1).

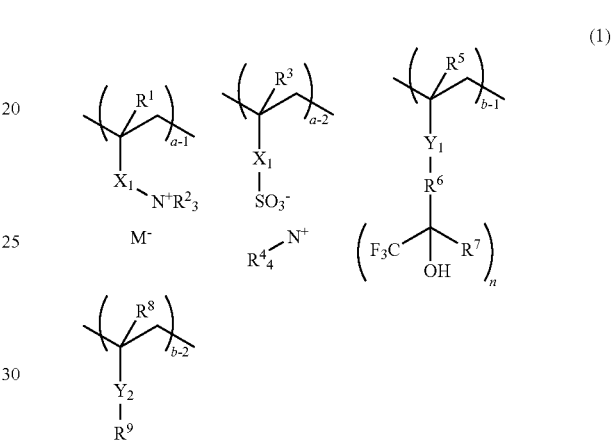

Herein $R^1$, $R^3$, $R^5$, and $R^8$ are each independently hydrogen or methyl. $X_1$ and $Y_2$ are each independently a single bond, —O—$R^{10}$—, —C(=O)—O—$R^{10}$—, —C(=O)—NH—$R^{10}$—, a straight or branched $C_1$-$C_4$ alkylene, or phenylene group, wherein $R^{10}$ is a straight, branched or cyclic $C_1$-$C_{10}$ alkylene group which may contain an ester or ether group. The subscript n is 1 or 2. In case of n=1, $Y_1$ is a single bond, —O—$R^{10}$—, —C(=O)—O—$R^{10}$—, —C(=O)—NH—$R^{10}$—, a straight or branched $C_1$-$C_4$ alkylene group or phenylene group, wherein $R^{10}$ is as defined above. In case of n=2, $Y_1$ is —O—$R^{101}$=, —C(=O)—O—$R^{101}$=, —C(=O)—NH—$R^{101}$=, a straight or branched $C_1$-$C_4$ alkylene group with one hydrogen atom eliminated, or a phenyl group with one hydrogen atom eliminated, wherein $R^{101}$ is a straight, branched or cyclic $C_1$-$C_{10}$ alkylene group with one hydrogen atom eliminated which may contain an ester or ether group. $X_2$ is a single bond, —O—$R^{11}$—, —C(=O)—O—$R^{11}$—, a straight or branched $C_1$-$C_4$ alkylene group or phenylene group, wherein $R^{11}$ is a straight, branched or cyclic $C_1$-$C_{10}$ alkylene group which may contain an ester or ether group and may contain a fluorine atom. $R^2$ and $R^4$ are each independently hydrogen or a straight, branched or cyclic $C_1$-$C_{20}$ alkyl group or $C_2$-$C_{20}$ alkenyl group which may contain a hydroxy, ether, ester, cyano, amino group, double bond or halogen atom, or a $C_6$-$C_{10}$ aryl group, two or three $R^2$ or two, three or four $R^4$ may bond together to form a ring of 3 to 20 carbon atoms. $M^-$ is a non-nucleophilic counter ion. $R^6$ is a straight, branched or cyclic $C_1$-$C_{12}$ alkylene group. $R^7$ is a hydrogen atom, fluorine atom, methyl group, trifluoromethyl group or difluoromethyl group, or $R^6$ and $R^7$ may bond together to form an aliphatic ring of 2 to 12 carbon atoms, preferably 3 to 10 carbon atoms, with the carbon atom to which they are attached, which ring may contain an ether group, fluorinated alkylene group or trifluoromethyl group, $R^9$ is a straight, branched or cyclic $C_1$-$C_{20}$ alkyl group which has at least one fluorine atom substituted thereon and which may contain an ether, ester or sulfonamide group. The subscripts (a-1), (a-2), (b-1), and (b-2) are numbers in the range: $0 \leq (a-1) < 1.0$, $0 \leq (a-2) < 1.0$, $0 < (a-1) + (a-2) < 1.0$, $0 \leq (b-1) < 1.0$, $0 \leq (b-2) < 1.0$, $0 < (b-1) + (b-2) < 1.0$, and $0.5 \leq (a-1) + (a-2) + (b-1) + (b-2) \leq 1.0$.

The photoresist composition of the invention is characterized by the addition of a surfactant in polymeric form having a hydrophilic sulfonic acid amine salt and a fluoroalkyl group, as represented by formula (1). When a photoresist layer is formed, the surfactant in polymeric form having a sulfonic acid amine salt and a fluoroalkyl group is oriented on the resist layer surface, whereby the resist layer surface becomes hydrophilic. Following formation of the photoresist layer, a protective coating is applied as a topcoat. The protective coating is preferably formed of such a material that meets both alkali solubility and water repellency, the material comprising a polymer having α-trifluoromethylhydroxy groups as a base in a solvent in which the resist layer is not dissolved and which is selected from higher alcohols of 4 or more carbon atoms, ethers, alkanes, fluorine atoms and the like. Since the surfactant in polymeric form having a sulfonic acid amine salt and a fluoroalkyl group is not soluble at all in the solvent for the protective coating material, it provides a barrier layer for preventing intermixing between the protective layer and the resist layer. Thus, the profile of a resist pattern after development remains unchanged whether or not a protective layer is used. A resist pattern of good profile is always obtainable.

In resist compositions based on alicyclic polymers for use in the ArF lithography, a sulfonic acid fluorinated at α-position such as perfluorobutanesulfonic acid is used as the photoacid generator. Due to the electron withdrawing effect at α-position, this sulfonic acid has a very high acidity enough for efficient deprotection reaction to proceed. Upon exposure, the photoacid generator generates a sulfonic acid fluorinated at α-position, which has a higher strength than the sulfonic acid not fluorinated at α-position in recurring units (a-1) in formula (1), so that anion exchange occurs with the sulfonic acid in recurring units (a-1). Although the sulfonic acid not fluorinated at α-position in recurring units (a-1) is released as a result of anion exchange, it is a weak acid which has not an acid strength sufficient for deprotection reaction to proceed. Since the sulfonic acid amine salt in recurring units (a-1) functions as a quencher to the acid generated upon exposure, the addition of such a sulfonic acid amine salt ensures that a resist film is provided with a rectangular profile at its top or a hole pattern is improved in side lobe resistance. If the function as quencher of the sulfonic acid amine salt is too strong as a result of excess amounts or other factors, there can result a top-bulged profile.

In recurring units (a-2) in formula (1), the sulfonic acid has an apposition on the polymer side. If the sulfonic acid is not fluorinated at α-position, it functions as a quencher likewise. Where both recurring units (a-1) and (a-2) In formula (1) are fluorinated at α-position and the acid generated by the photoacid generator is a ultra-strong acid fluorinated at α-position, little anion exchange occurs therebetween. Also where recurring units (a-1) and (a-2) in formula (1) are not fluorinated at α-position and the acid generated by the photoacid generator is a sulfonic acid not fluorinated at α-position, little anion exchange occurs therebetween. Then the profile of resist film remains substantially unchanged after development. The identity of sulfonic acid in recurring units (a-1) and (a-2) in formula (1) depends on the type of base polymer in the resist composition, the type and strength of acid generated by the photoacid generator, and the profile of resist pattern after development.

The recurring units (a-1) in formula (1) are in salt form resulting from neutralization reaction of recurring units having amino groups with sulfonic acid. Examples of suitable polymerizable monomers from which recurring units (a-1) are derived are given below.

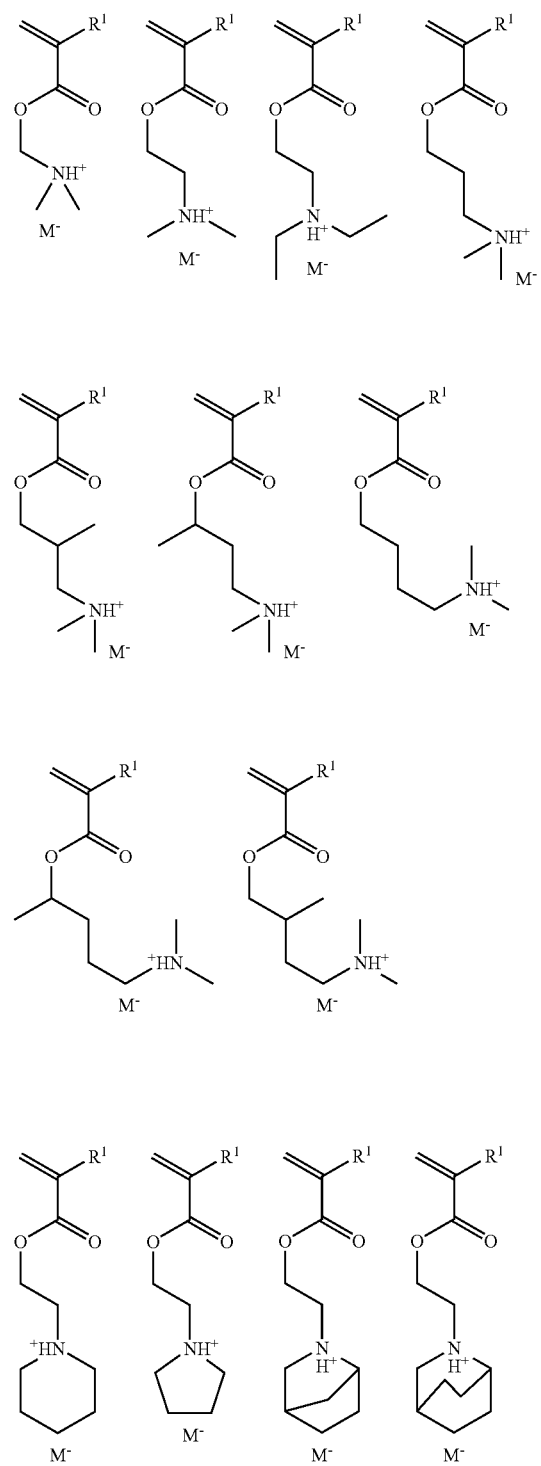

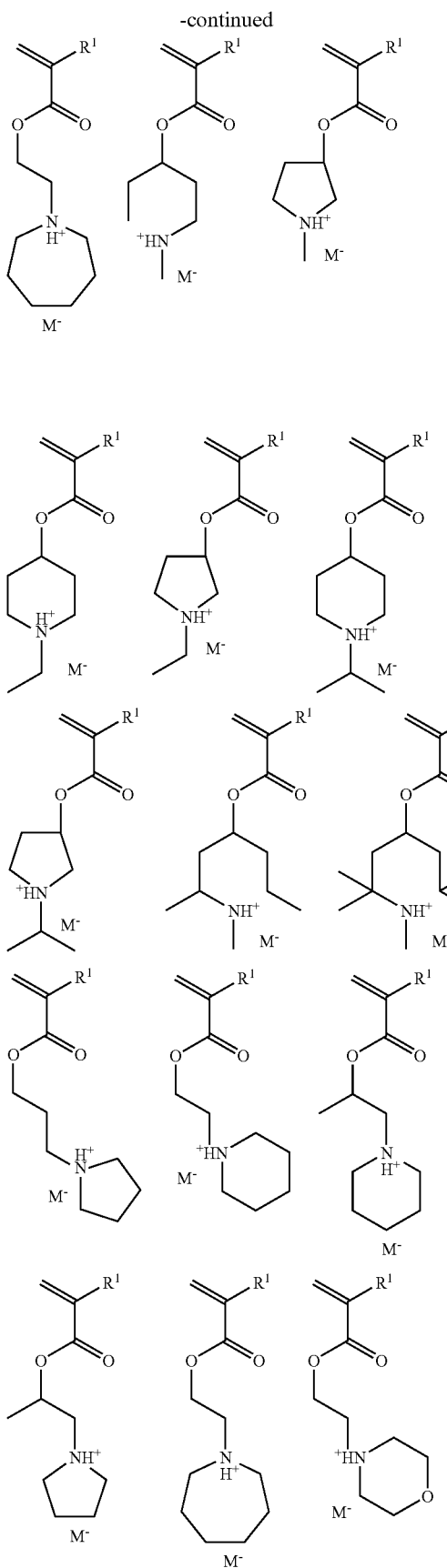

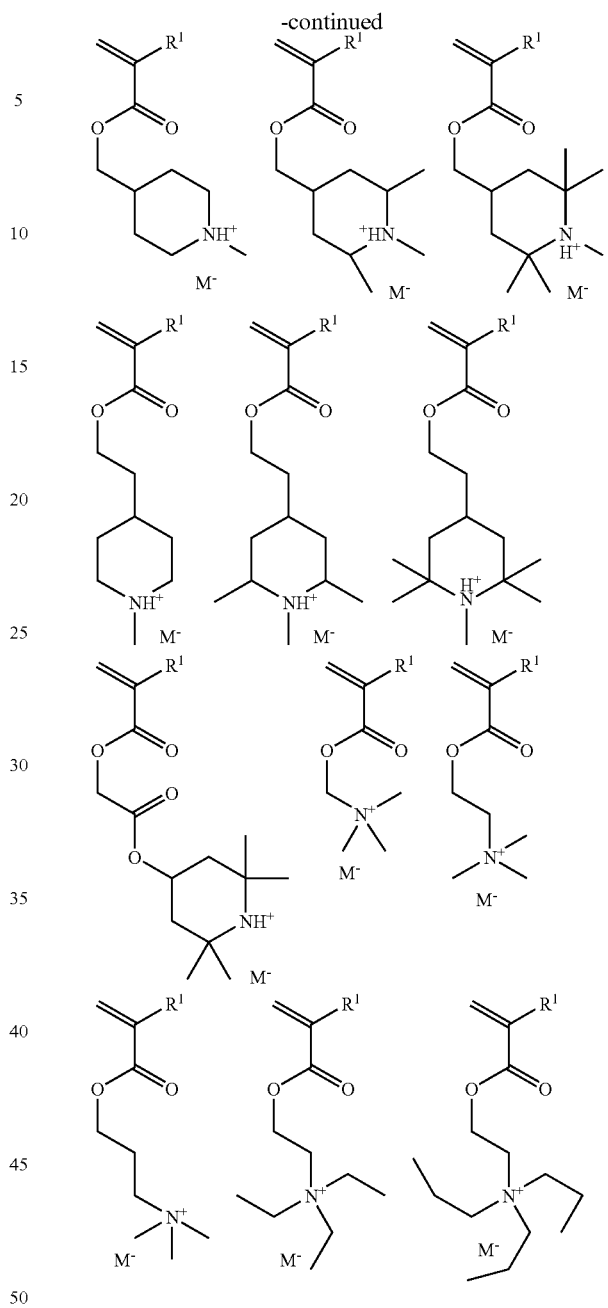

Herein $R^1$ is as defined above, and $M^-$ is a sulfonate ion.

Examples of the non-nucleophilic counter ion represented by $M^-$ include halide ions such as chloride and bromide ions; fluoroalkylsulfonate ions such as triflate, 1,1,1-trifluoroethanesulfonate, nonafluorobutanesulfonate, perfluoro-4-ethylcyclohexylsulfonate, perfluoro-n-octylsulfonate and perfluoro-2-ethoxyethylsulfonate; arylsulfonate ions such as tosylate, benzenesulfonate, 4-fluorobenzenesulfonate, 1,2,3,4,5-pentafluorobenzenesulfonate, mesitylenesulfonate, 2,4,6-triisopropylbenzenesulfonate, naphthylsulfonate, and pyrenesulfonate; allylsulfonate ions such as mesylate and butanesulfonate; imide acids such as bis(trifluoromethylsulfonyl)imide, bis(perfluoroethylsulfonyl)imide and bis(perfluorobutylsulfonyl)imide; methide acids such as tris(trifluoromethylsulfonyl)methide and tris(perfluoroethylsulfonyl)methide; sulfonates having fluorine substituted at alphaposition as represented by the following formula (K-1) and sulfonates having fluorine substituted at alpha- and beta-positions as represented by the following formula (K-2).

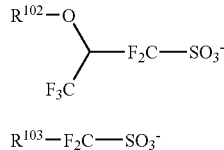
(K-1)

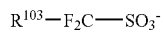
(K-2)

In formula (K-1), $R^{102}$ is a hydrogen atom, straight, branched or cyclic $C_1$-$C_{20}$ alkyl or acyl group, $C_2$-$C_{20}$ alkenyl group, or $C_6$-$C_{20}$ aryl or aryloxy group. In formula (K-2), $R^{103}$ is a hydrogen atom, straight, branched or cyclic $C_1$-$C_{20}$ alkyl group, $C_2$-$C_{20}$ alkenyl group, or $C_6$-$C_{20}$, aryl group which may be substituted with fluorine atoms and which may have a carbonyl, ether, ester, hydroxy or carboxyl group.

The monomer from which recurring units (a-1) are derived is not a sulfonic acid salt of the aforementioned amino compound having a double bond, but is obtainable by polymerizing an amino compound having a double bond and neutralizing the resulting polymer with a sulfonic acid into a sulfonic acid salt.

The recurring units (a-2) in formula (1) are in salt form resulting from neutralization reaction of sulfo groups with amines. Examples of suitable polymerizable monomers from which recurring units (a-2) are derived are given below.

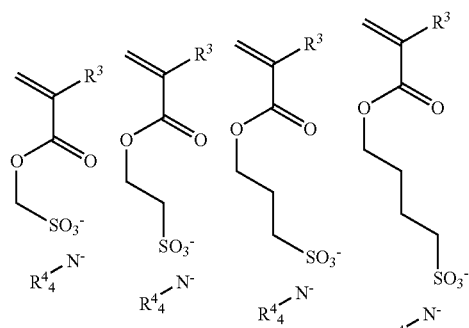

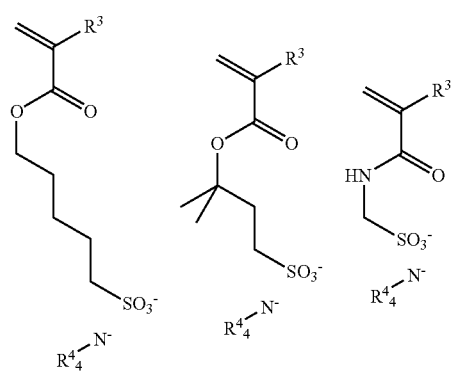

-continued

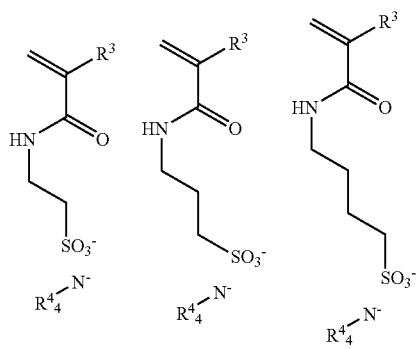

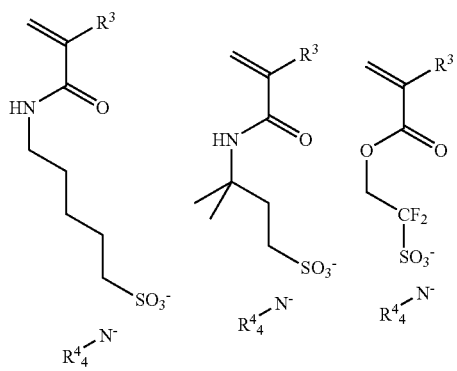

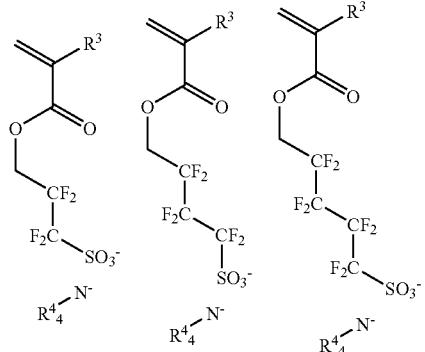

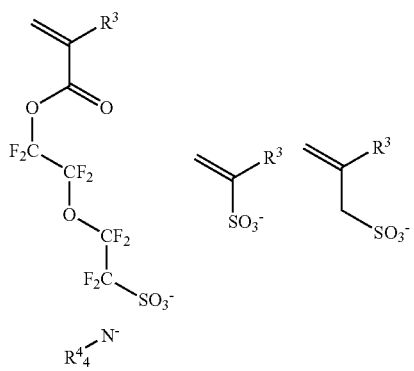

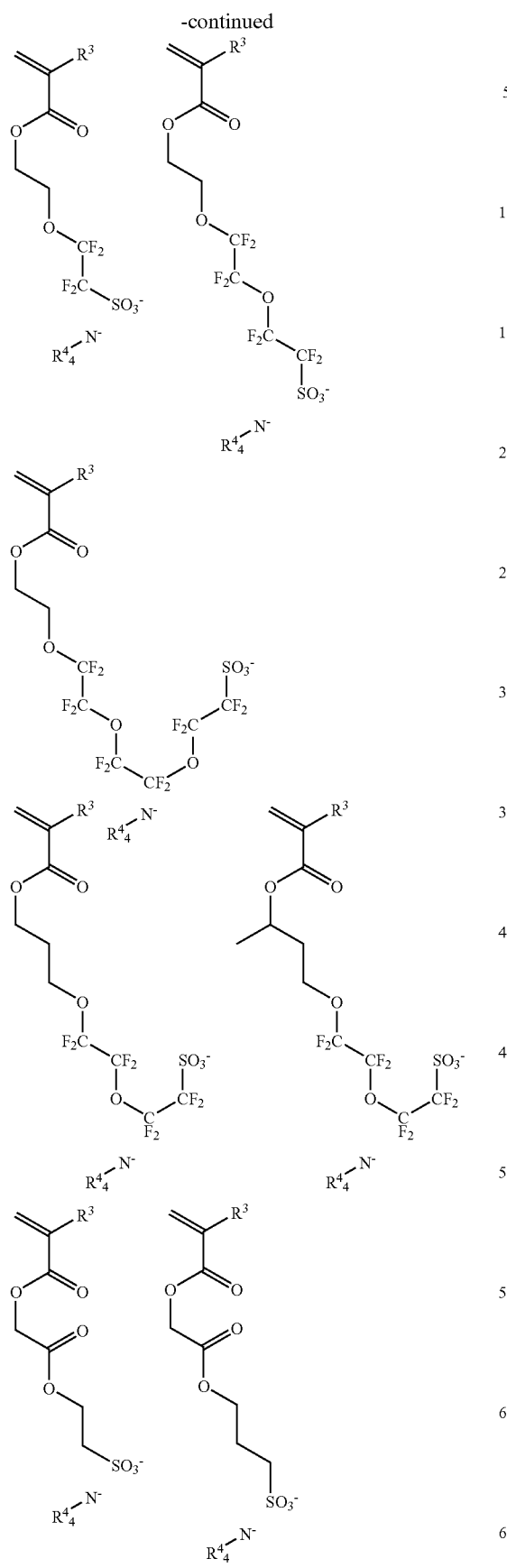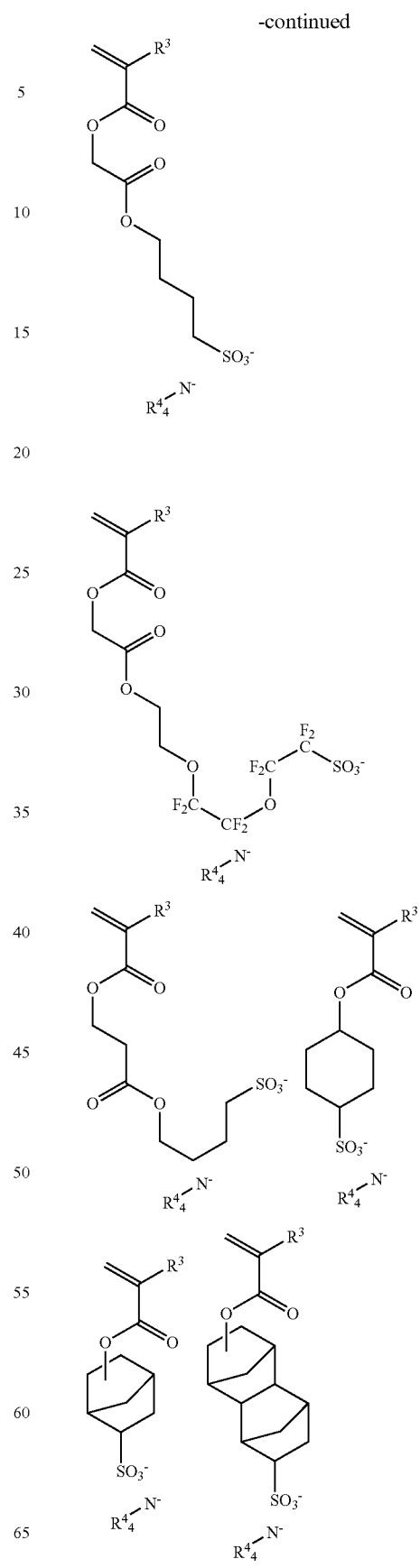

-continued

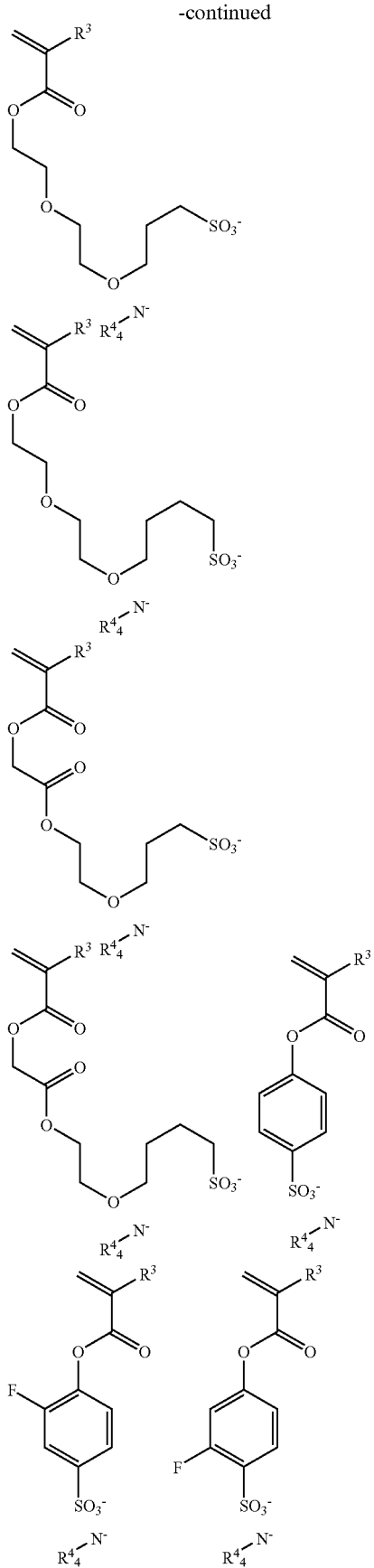

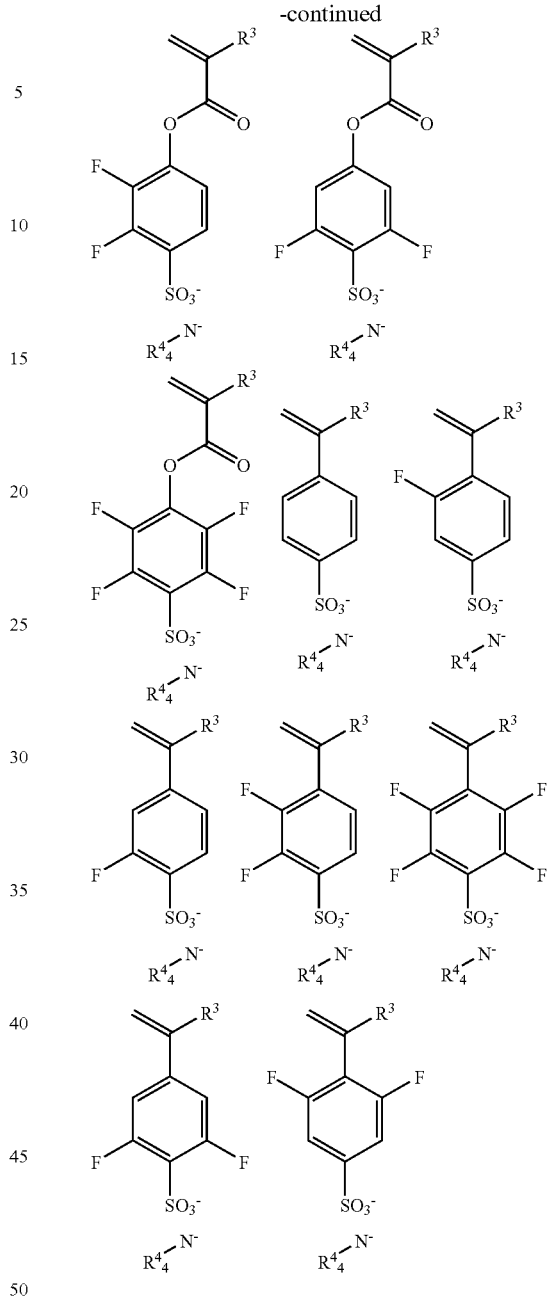

Herein $R^3$ and $R^4$ are as defined above.

The amine serving as a pairing ion with sulfonic acid in recurring units (a-2) may be the same as the amine compound to be added to resist compositions as a quencher, which will be described later.

The monomer from which recurring units (a-2) are derived is not an amine salt of the aforementioned sulfonic acid having a double bond, but is obtainable by polymerizing a sulfo group-containing compound having a double bond and neutralizing the resulting polymer with an amine into a sulfonic acid salt, or by polymerizing an alkali metal salt of a sulfonic acid having a double bond, eliminating the alkali metal from the resulting polymer, and neutralizing the polymer with an amine compound.

Examples of suitable monomers from which recurring units (b-1) having an α-trifluoromethylalcohol group in formula (1) are derived are given below.
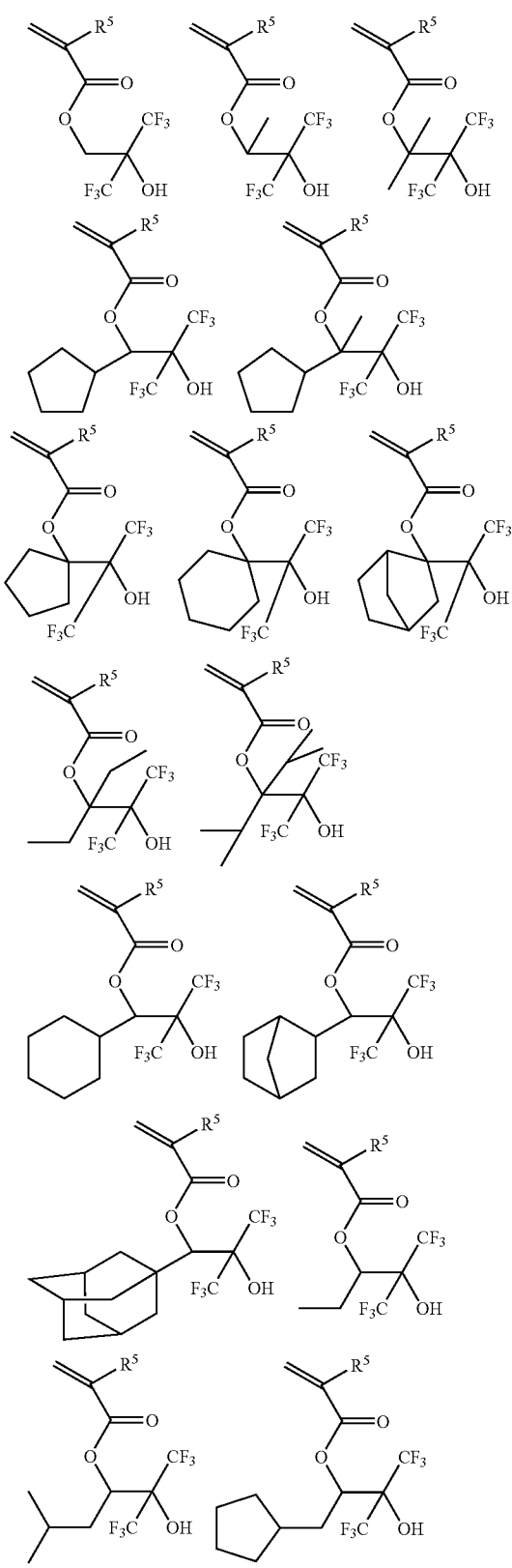
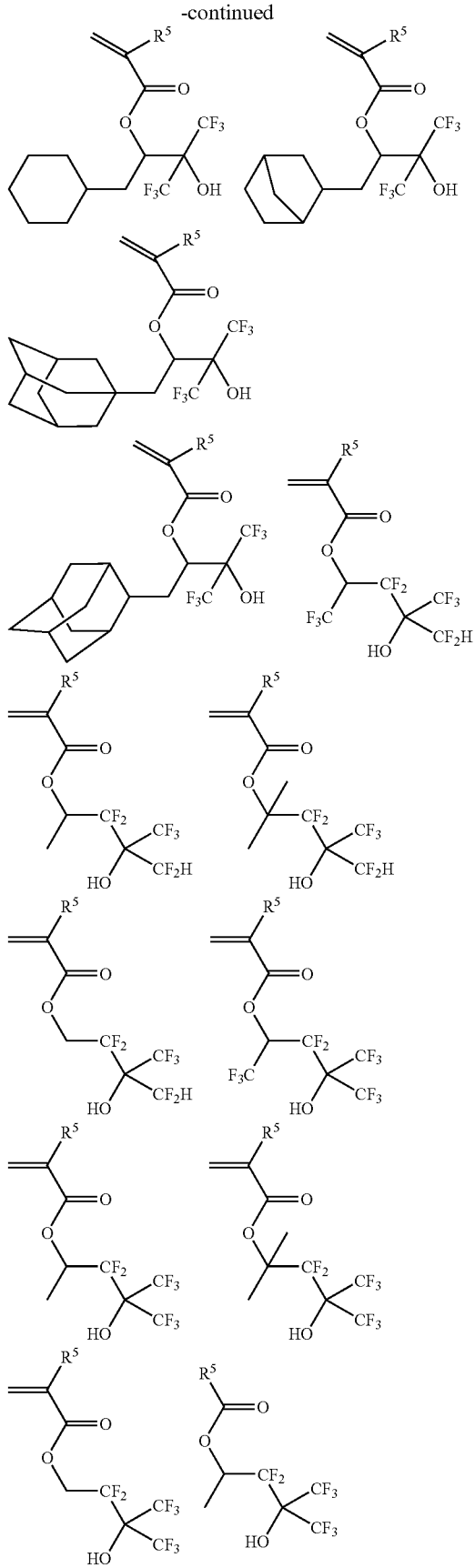

-continued
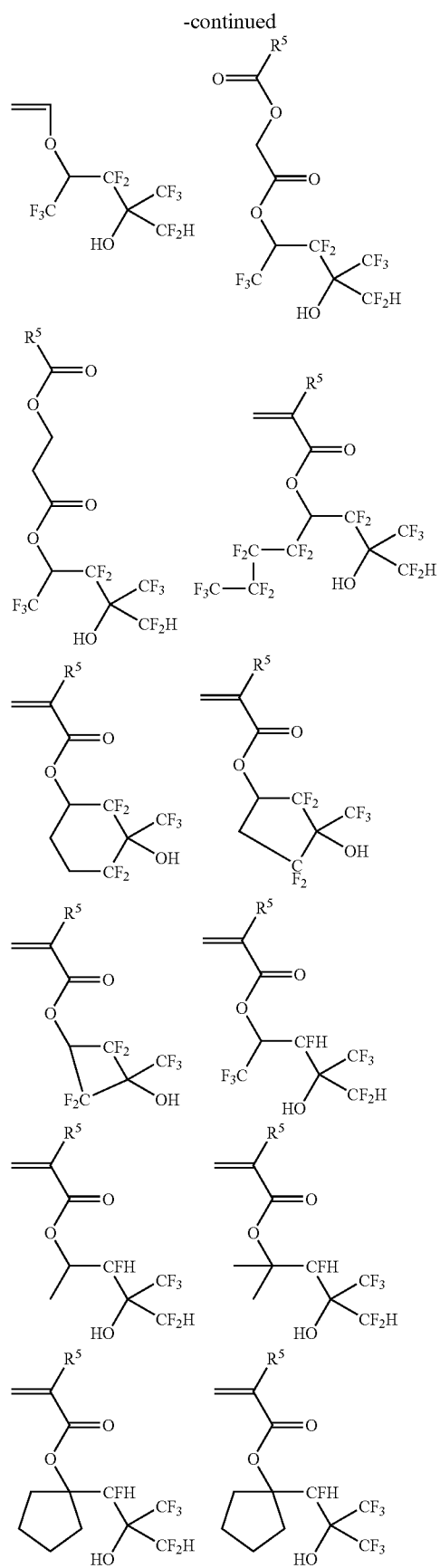
-continued
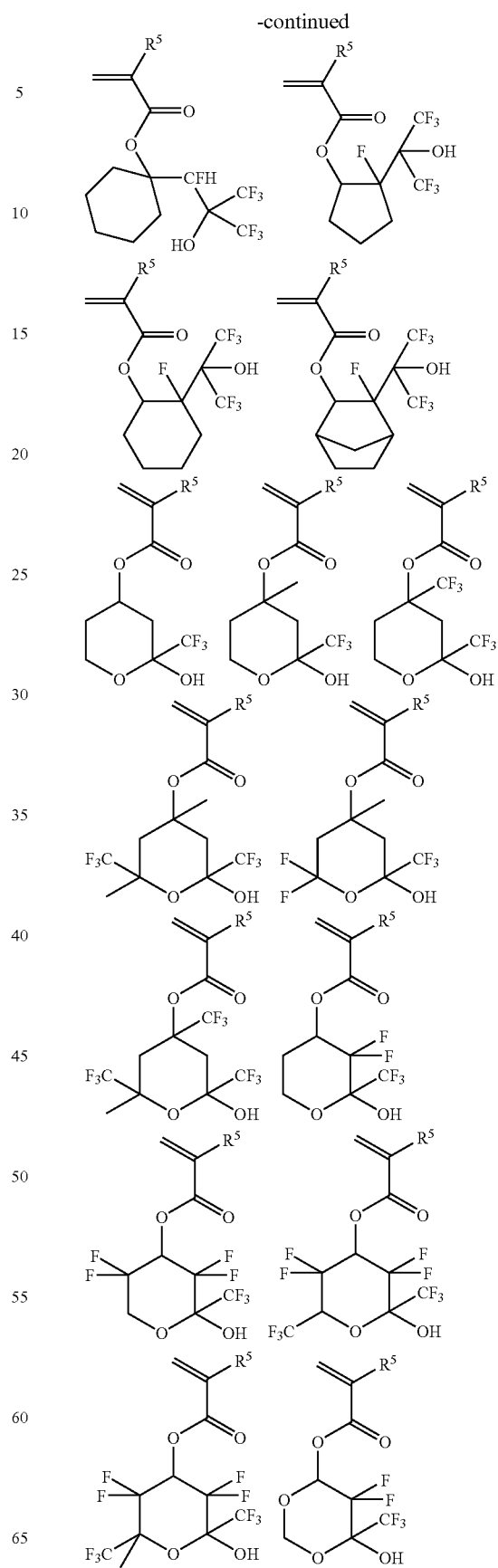

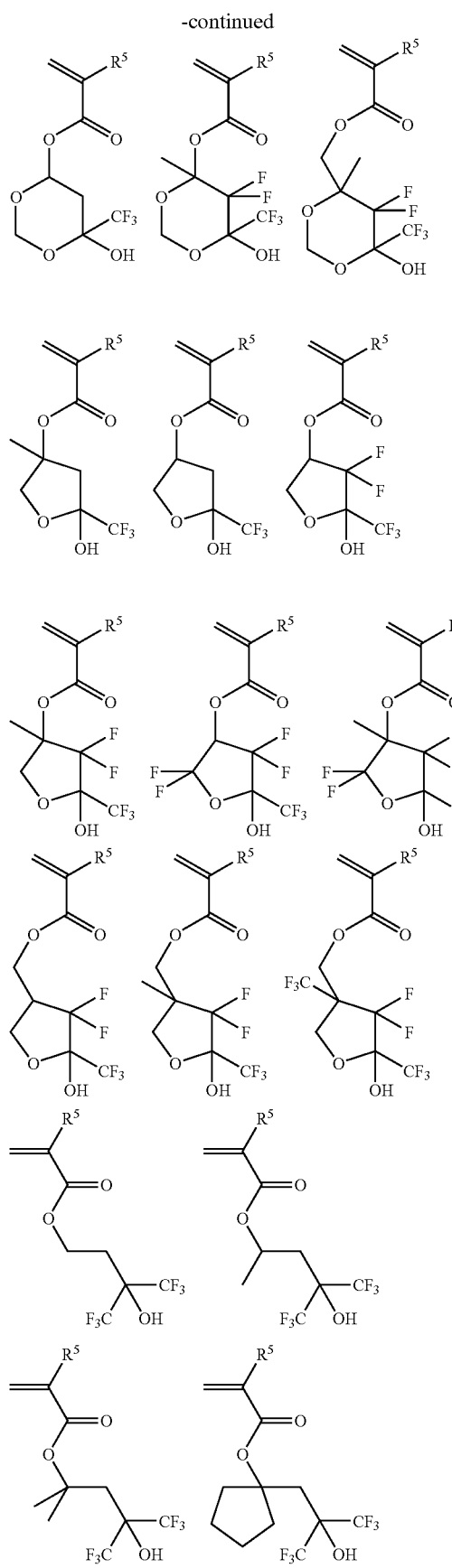
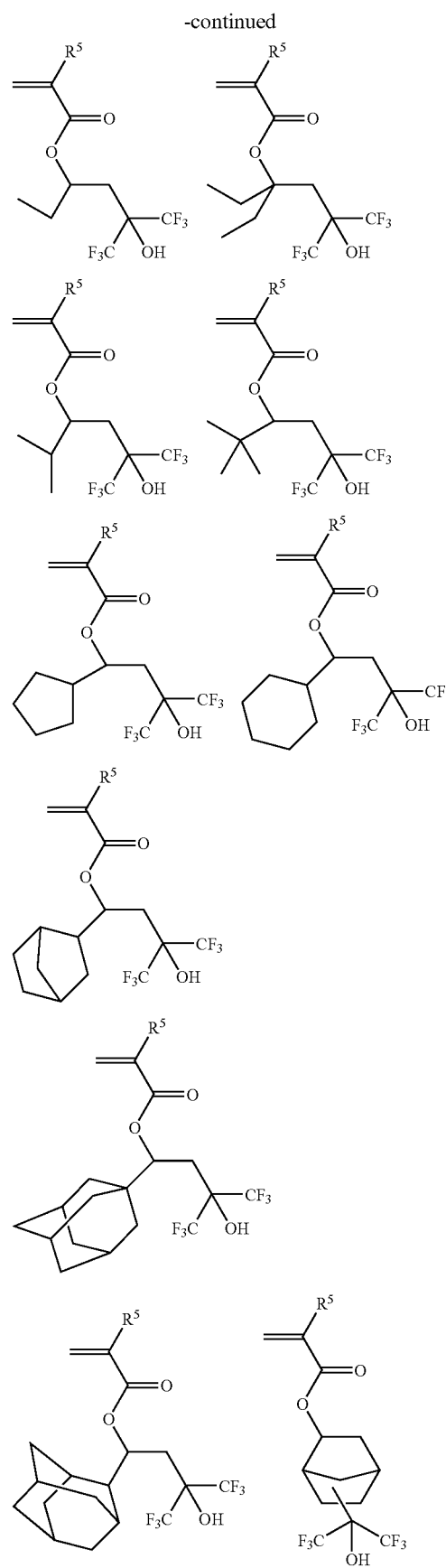

-continued
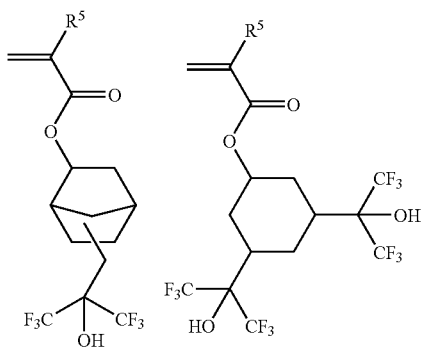
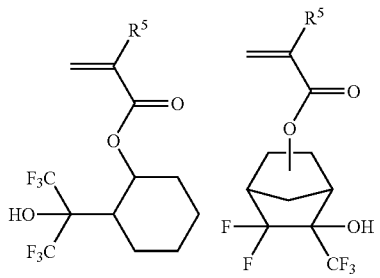
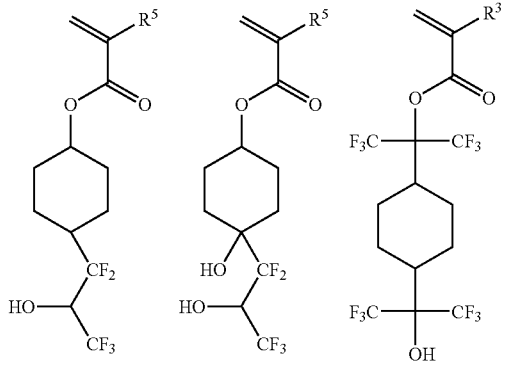
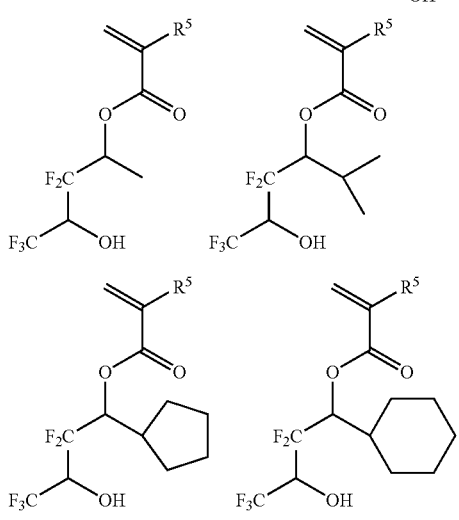
-continued
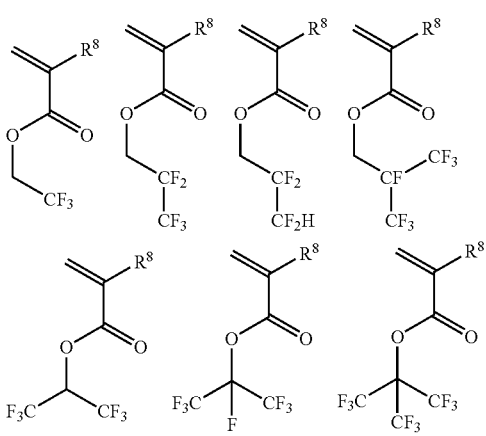
Herein $R^5$ is as defined above.
Examples of recurring units (b-2) in formula (1) are given below.

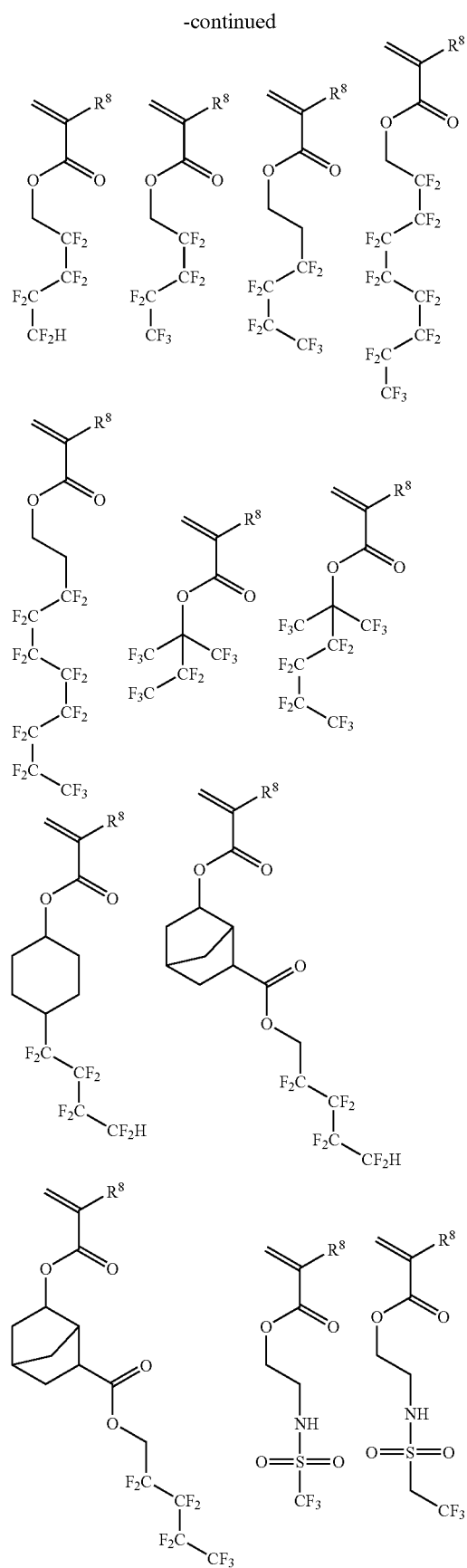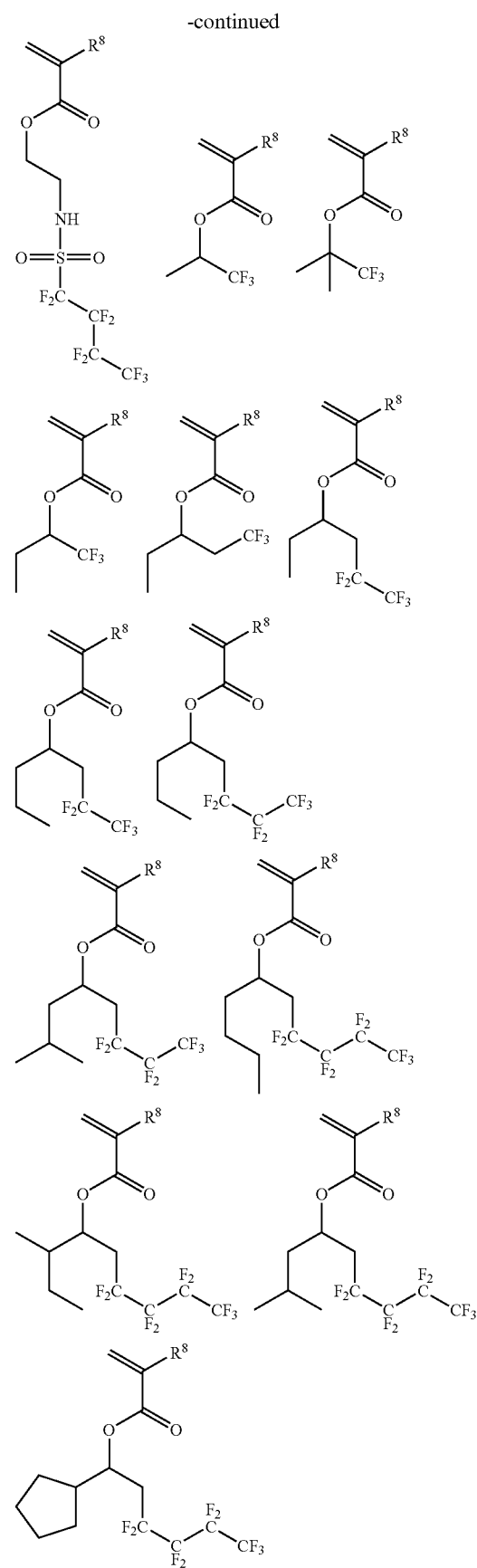

-continued
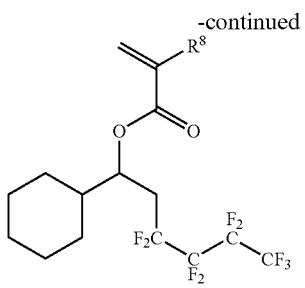
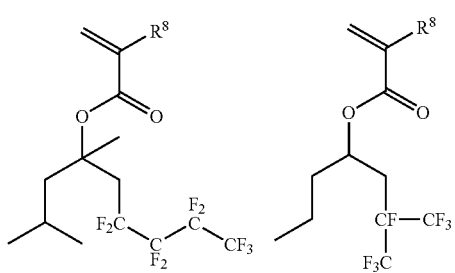
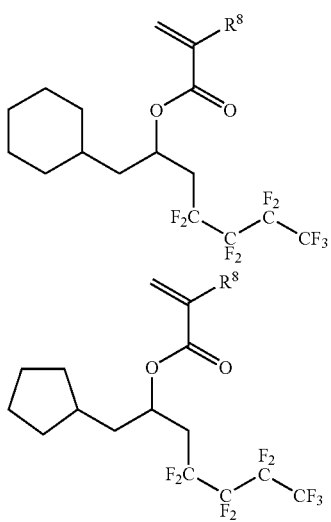
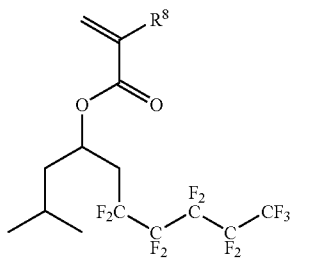
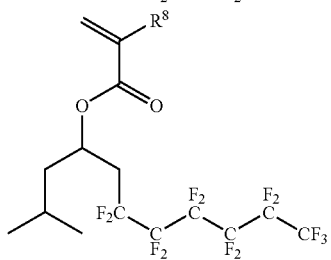
-continued
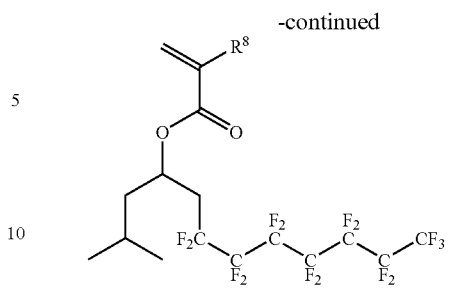
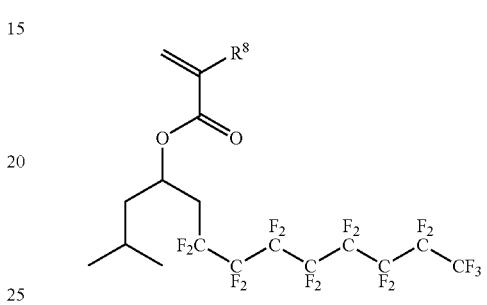
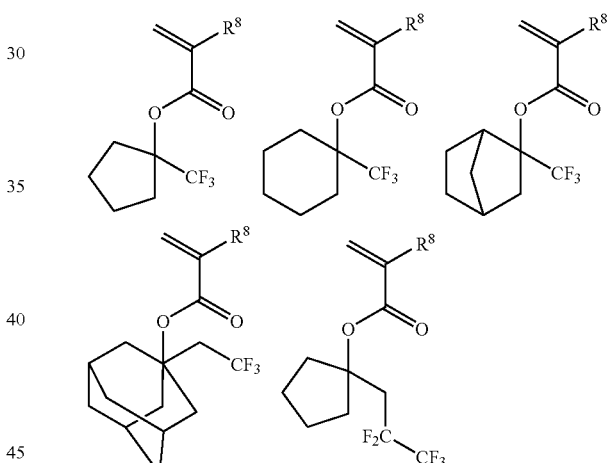
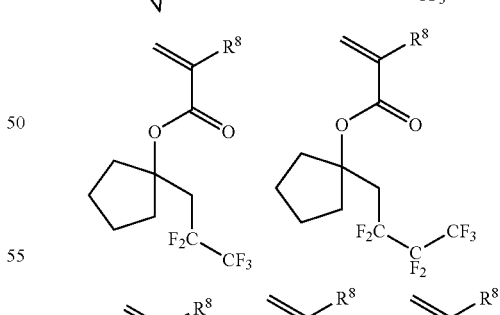
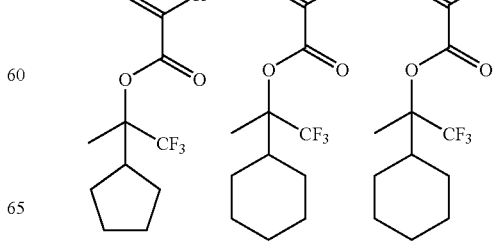

-continued

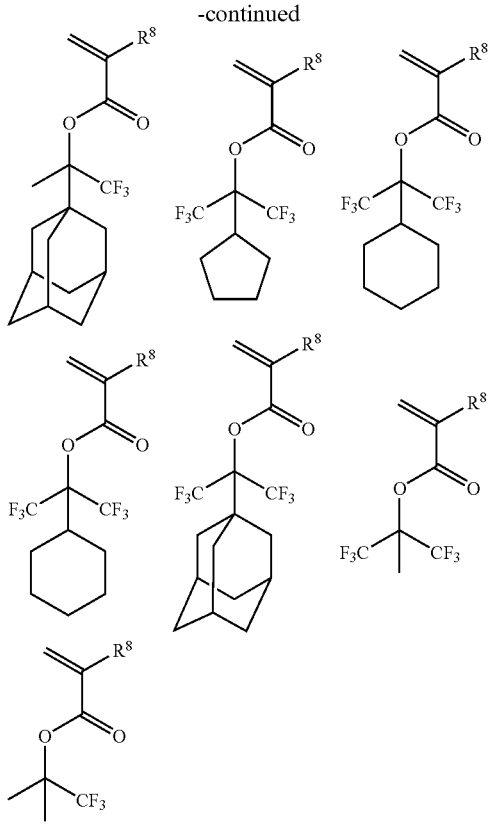
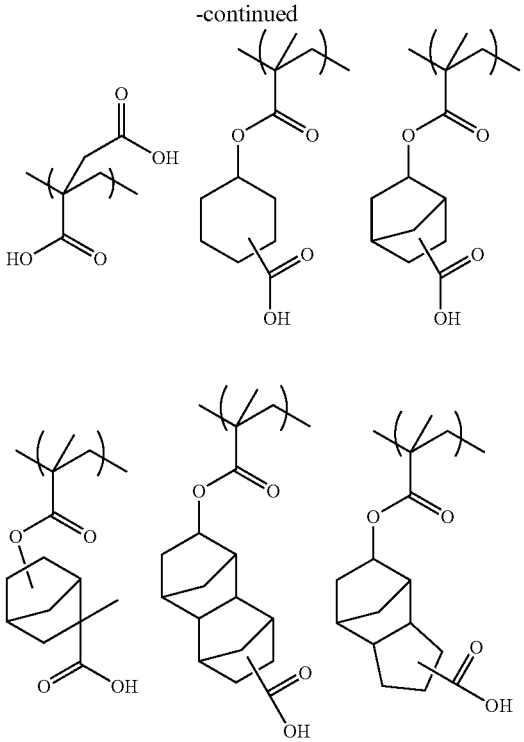

Herein R⁸ is as defined above.

While the polymer to be added to the resist composition of the invention comprises recurring units (a-1), (a-2), (b-1), and (b-2) in formula (1), recurring units "c" having a carboxyl group may be copolymerized therein, if desired, for the purpose of improving alkali solubility and/or rendering the resist after development more hydrophilic.

Examples of recurring units "c" having a carboxyl group are given below.

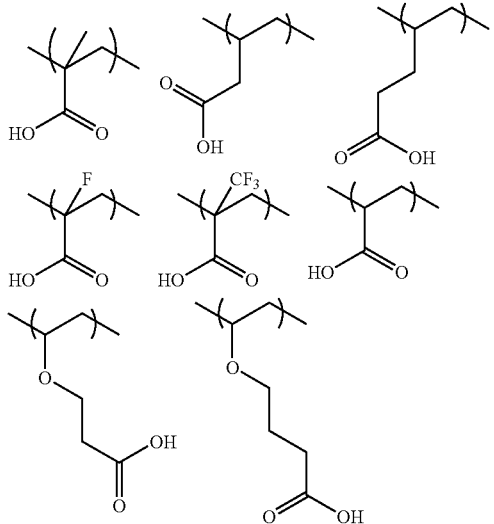
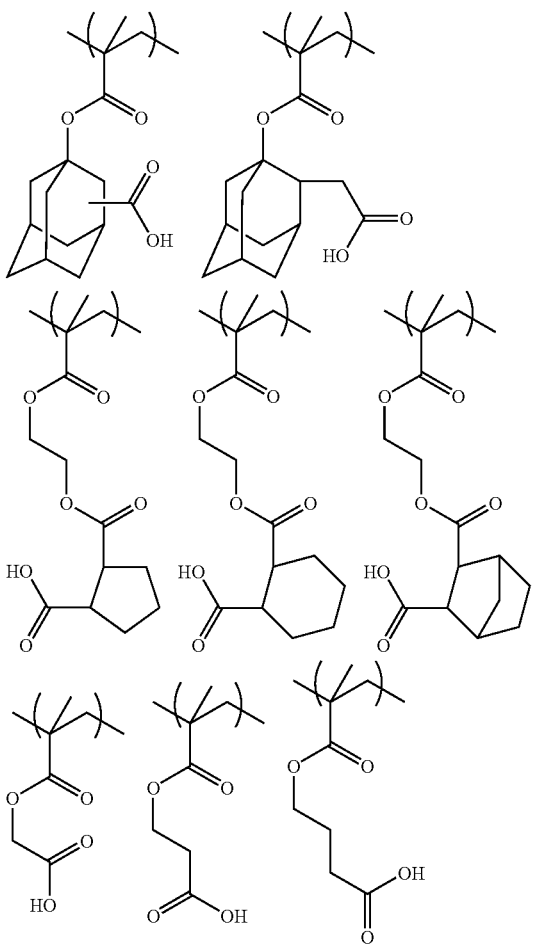

-continued
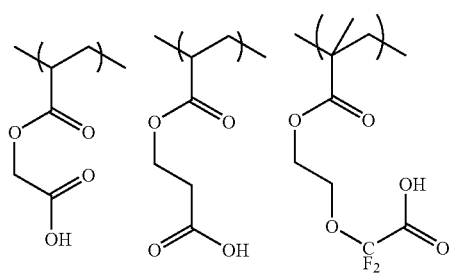
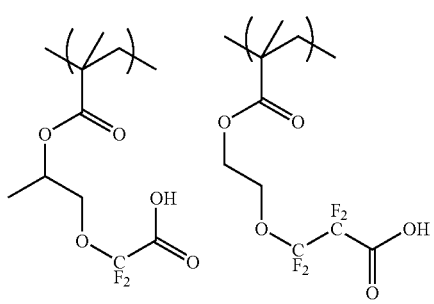
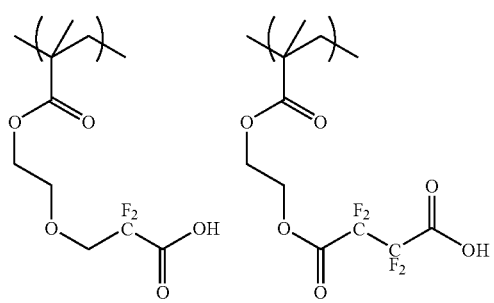
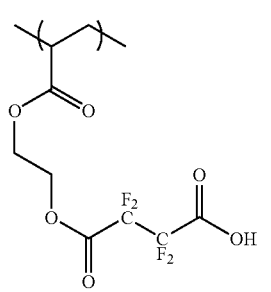
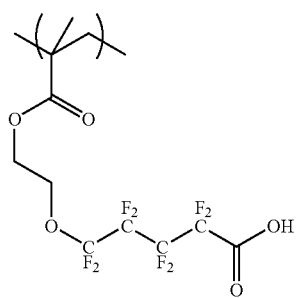
-continued
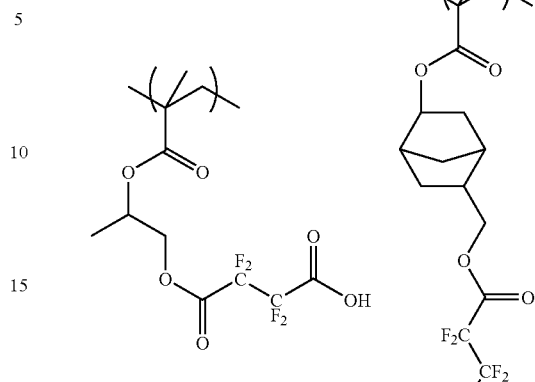
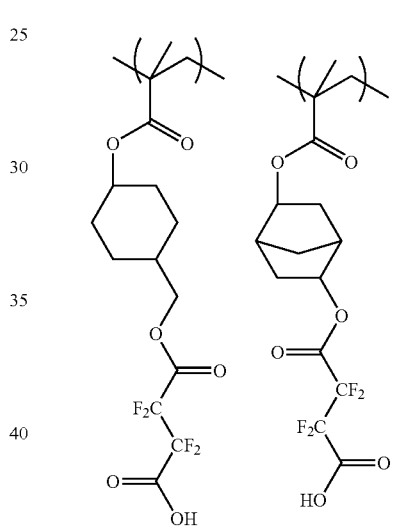
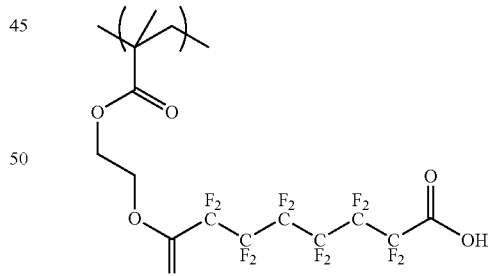
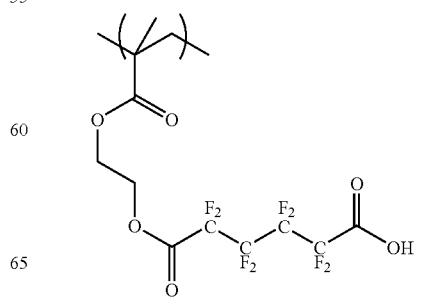

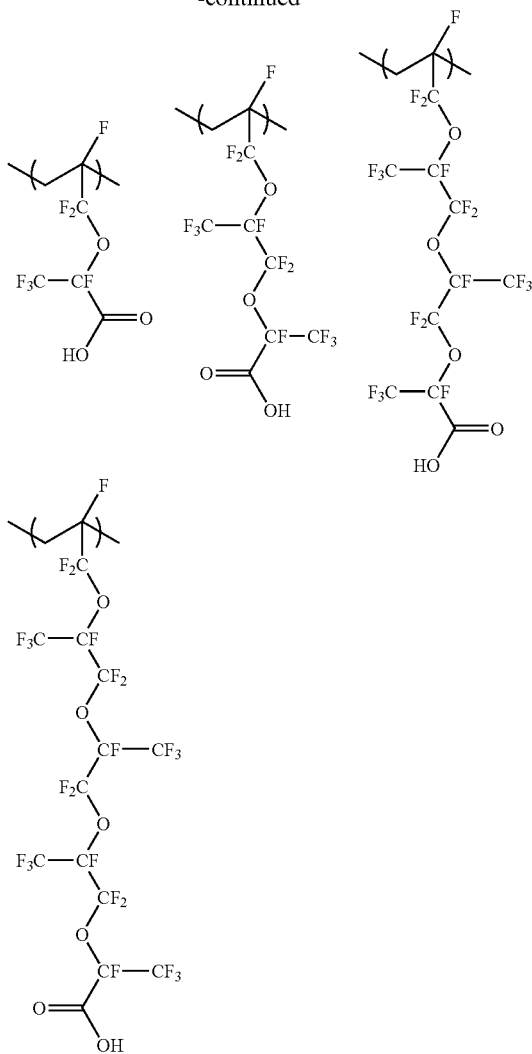

In addition to recurring units (a-1), (a-2), (b-1), and (b-2) in formula (1), recurring units "d" having an adhesive group of lactone and recurring units "e" having an acid labile group may be copolymerized in the polymer to be added to the resist composition, if desired, for the purpose of improving miscibility with the resist base polymer and/or inhibiting a slimming on the resist surface. The recurring units "d" having an adhesive group of lactone and recurring units "e" having an acid labile group may be selected from those units used in the resist base polymer, which will be described later.

Desirably the polymer comprising recurring units (a-1), (a-2), (b-1), and (b-2) in formula (1) has a weight average molecular weight (Mw) of about 1,000 to about 100,000, and especially about 2,000 to about 30,000, as determined by gel permeation chromatography (GPC) using polystyrene standards. The Mw of the polymer is not limited thereto. A polymer with Mw of at least 1,000 exerts sufficient barrier property against water during immersion lithography and is effective for preventing photoresist components from being leached with water. A polymer with Mw of up to 100,000 has a sufficiently high rate of dissolution in an alkaline developer, minimizing the risk that when a resist film having the polymer incorporated therein is patterned, resin residues are left attached to the substrate.

When used in the resist composition, the polymers comprising recurring units (a-1), (a-2), (b-1), and (b-2) in formula (1) may be compounded alone or as a mixture in any desired proportion of two or more polymers having different copolymerization ratio or molecular weight or obtained through copolymerization of distinct monomers.

The subscripts (a-1), (a-2), (b-1), and (b-2) representative of copolymerization ratios (on a molar basis) of the corresponding units are in the range: $0 \leq (a\text{-}1) < 1.0$, $0 \leq (a\text{-}2) < 1.0$, $0 < (a\text{-}1)+(a\text{-}2) < 1.0$, $0 \leq (b\text{-}1) < 1.0$, $0 \leq (b\text{-}2) < 1.0$, $0 < (b\text{-}1)+(b\text{-}2) < 1.0$, and $0.5 \leq (a\text{-}1)+(a\text{-}2)+(b\text{-}1)+(b\text{-}2) \leq 1.0$, and preferably $0 \leq (a\text{-}1) < 1.0$, $0 \leq (a\text{-}2) < 1.0$, $0.1 \leq (a\text{-}1)+(a\text{-}2) \leq 0.9$, $0 \leq (b\text{-}1) < 1.0$, $0 \leq (b\text{-}2) < 1.0$, $0.1 \leq (b\text{-}1)+(b\text{-}2) \leq 0.9$, and $0.6 \leq (a\text{-}1)+(a\text{-}2)+(b\text{-}1)+(b\text{-}2) \leq 1.0$.

The additional recurring units "c", "d" and "e" may be present in the range; $0 \leq c \leq 0.8$, more specifically $0 \leq c \leq 0.7$, $0 \leq d \leq 0.8$, more specifically $0 \leq d \leq 0.7$, and $0 \leq e \leq 0.8$, more specifically $0 \leq e \leq 0.7$, provided that $(a\text{-}1)+(a\text{-}2)+(b\text{-}1)+(b\text{-}2)+c+d+e=1$.

It is noted that the meaning of $(a\text{-}1)+(a\text{-}2)+(b\text{-}1)+(b\text{-}2)=1$ is that in a polymer comprising recurring units (a-1), (a-2), (b-1), and (b-2), the sum of recurring units (a-1), (a-2), (b-1) and (b-2) is 100 mol % based on the total amount of entire recurring units. The meaning of $(a\text{-}1)+(a\text{-}2)+(b\text{-}1)+(b\text{-}2) < 1$ is that the sum of recurring units (a-1), (a-2), (b-1), and (b-2) is less than 100 mol % based on the total amount of entire recurring units, indicating the inclusion of other recurring units.

In the resist composition of the invention, the polymeric surfactant(s) of formula (1) may be compounded in a total amount of 0.01 to 50 parts by weight, and preferably 0.1 to 10 parts by weight per 100 parts by weight of the base resin. At least 0.01 phr of the polymer is effective in improving the receding contact angle with water of the photoresist film at its surface. Up to 50 phr of the polymer is effective in forming a photoresist film having a low rate of dissolution in an alkaline developer and capable of maintaining the height of a fine pattern formed therein.

The resist composition of the invention is advantageously used as a chemically amplified positive resist composition. In addition to the polymeric surfactant described above, the chemically amplified positive resist composition generally comprises at least a base resin, specifically a base resin comprising recurring units having acid labile groups and recurring units having hydroxy groups and/or adhesive groups of lactone ring.

Since the base resin includes recurring units having hydroxy groups and/or adhesive groups of lactone ring, the chemically amplified positive resist composition ensures tight adhesion to a substrate. Since the base resin includes recurring units having acid labile groups, the acid labile groups are deprotected with the acid generated by the acid generator during exposure so that the exposed area of resist is converted to be soluble in a developer, ensuring that a pattern is formed at a very high precision.

Base Resin

Suitable base resins include, but are not limited to, those polymers comprising units of the following formula (R1) and/or (R2) and having a weight average molecular weight (Mw) of about 1,000 to about 100,000, especially about 3,000 to about 30,000, as measured by GPC versus polystyrene standards.

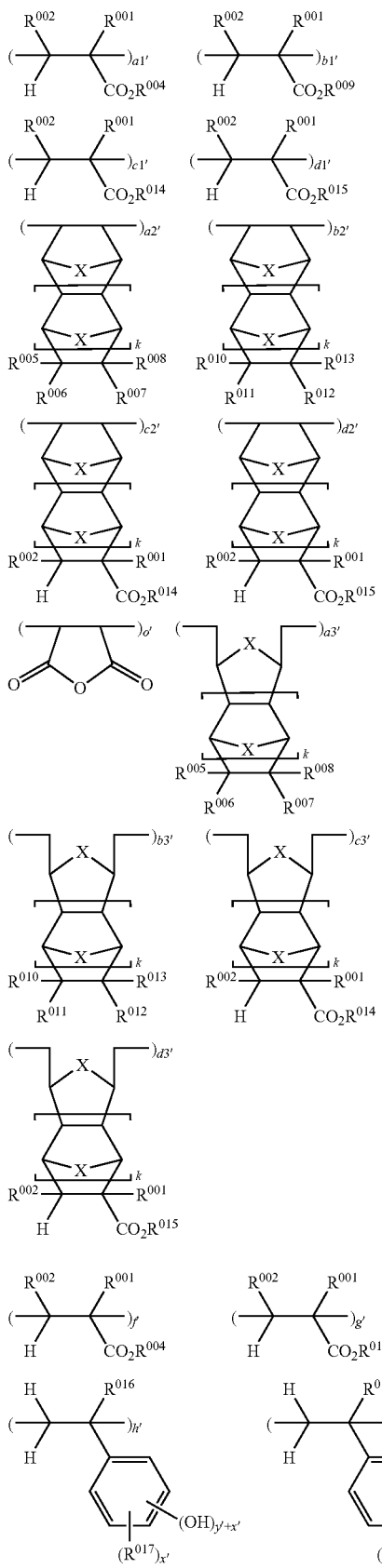

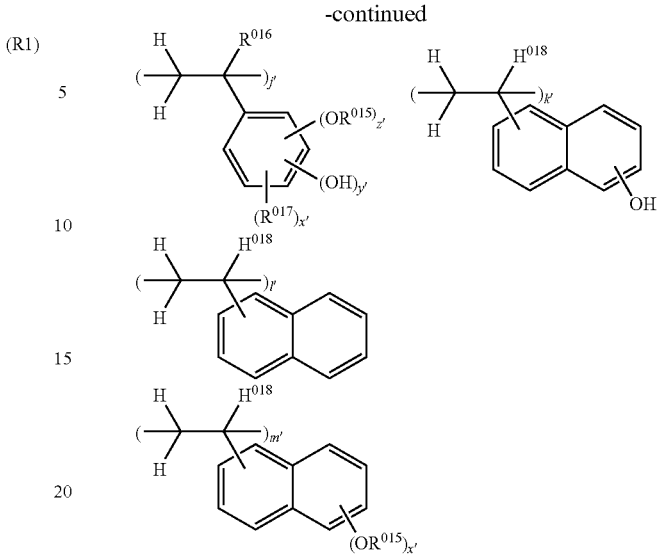

Herein, $R^{001}$ is hydrogen, methyl or —CH$_2$CO$_2$R$^{003}$.

$R^{002}$ is hydrogen, methyl or —CO$_2$R$^{003}$.

$R^{003}$ is a straight, branched or cyclic $C_1$-$C_{15}$ alkyl group, for example, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent $C_1$-$C_{15}$ hydrocarbon group having at least one of fluorinated substituent groups, carboxyl groups and hydroxyl groups, for example, hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, hydroxyhexafluoroisopropylcyclohexyl, and di(hydroxyhexafluoroisopropyl)cyclohexyl.

At least one of $R^{005}$ to $R^{008}$ represents a monovalent $C_1$-$C_{15}$ hydrocarbon group having at least one of fluorinated substituent groups, carboxyl groups and hydroxyl groups while the remaining R's independently represent hydrogen or straight, branched or cyclic $C_1$-$C_{15}$ alkyl groups. Examples of the monovalent $C_1$-$C_{15}$ hydrocarbon group having at least one of fluorinated substituent groups, carboxyl groups and hydroxyl groups include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, hydroxyadamantyloxycarbonyl, hydroxyhexafluoroisopropylcyclohexyloxycarbonyl, and di(hydroxyhexafluoroisopropyl)cyclohexyloxycarbonyl.

Examples of the straight, branched or cyclic $C_1$-$C_{15}$ alkyl group are the same as exemplified for $R^{003}$.

Alternatively, $R^{005}$ to $R^{008}$ may bond together to form a ring. In that event, at least one of $R^{005}$ to $R^{008}$ is a divalent $C_1$-$C_{15}$ hydrocarbon group having at least one of fluorinated substituent groups, carboxyl groups and hydroxyl groups, while the remaining are independently a single bond or a straight, branched or cyclic $C_1$-$C_{15}$ alkylene group. Examples of the divalent $C_1$-$C_{15}$ hydrocarbon group having at least one of fluorinated substituent groups, carboxyl groups and hydroxyl groups include the groups exemplified as the monovalent hydrocarbon group having at least one of fluorinated substituent groups, carboxyl groups and hydroxyl groups, with one hydrogen atom eliminated therefrom. Examples of the straight, branched or cyclic $C_1$-$C_{15}$ alkyl groups include the groups exemplified for $R^{003}$, with one hydrogen atom eliminated therefrom.

$R^{009}$ is a monovalent $C_3$-$C_{15}$ hydrocarbon group containing a —$CO_2$— partial structure, for example, 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent $C_2$-$C_{15}$ hydrocarbon group containing a —$CO_2$— partial structure, while the remaining R's are independently hydrogen or straight, branched or cyclic $C_1$-$C_{15}$ alkyl groups. Examples of the monovalent $C_2$-$C_{15}$ hydrocarbon group containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the straight, branched or cyclic $C_1$-$C_{15}$ alkyl groups are the same as exemplified for $R^{003}$.

Alternatively, $R^{010}$ to $R^{013}$ may bond together to form a ring. In that event, at least one of $R^{010}$ to $R^{013}$ is a divalent $C_2$-$C_{15}$ hydrocarbon group containing a —$CO_2$— partial structure, while the remaining are independently a single bond or a straight, branched or cyclic $C_1$-$C_{15}$ alkylene group. Examples of the divalent $C_2$-$C_{15}$ hydrocarbon group containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as the groups exemplified as the monovalent hydrocarbon group containing a —$CO_2$— partial structure, with one hydrogen atom eliminated therefrom. Examples of the straight, branched or cyclic $C_1$-$C_{15}$ alkylene groups include the groups exemplified for $R^{003}$, with one hydrogen atom eliminated therefrom.

$R^{014}$ is a polycyclic $C_7$-$C_{15}$ hydrocarbon group or an alkyl group containing a polycyclic hydrocarbon group, for example, norbornyl, bicyclo[3.3.1]nonyl, tricyclo[5.2.1.0$^{2,6}$]decyl, adamantyl, ethyladamantyl, butyladamantyl, norbornylmethyl, and adamantylmethyl.

$R^{015}$ is an acid labile group, which will be described later.

X is —$CH_2$ or an oxygen atom.

The subscript k is 0 or 1.

The acid labile groups represented by $R^{015}$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

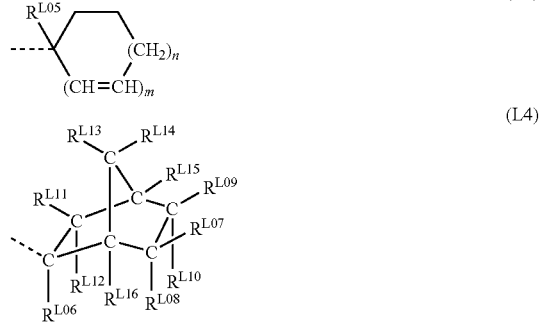

The broken line indicates a valence bond.

In formula (L1), $R^{L01}$ and $R^{L02}$ are hydrogen or straight, branched or cyclic alkyl groups of 1 to 18 carbon atoms, preferably 1 to 10 carbon atoms. Examples include hydrogen, methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Examples of the straight, branched or cyclic alkyl groups are as exemplified above for $R^{L01}$ and $R^{L02}$, and examples of the substituted alkyl groups are shown below.

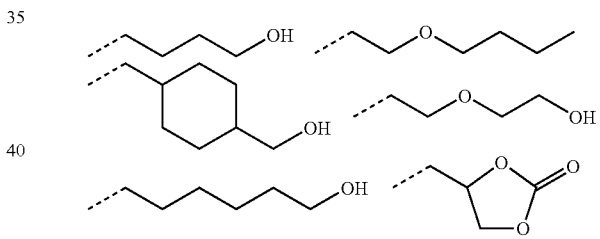

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. In formula (L2), y is an integer of 0 to 6.

In formula (L3), $R^{L05}$ is a substituted or unsubstituted, $C_1$-$C_{10}$ straight, branched or cyclic alkyl group or a substituted or unsubstituted $C_6$-$C_{20}$ aryl group. Examples of the substituted or unsubstituted alkyl groups include straight, branched or cyclic ones such as methyl, ethyl, propyl, isopropyl, n-butyl, sec-butyl, tert-butyl, tert-amyl, n-pentyl, n-hexyl, cyclopentyl, cyclohexyl and bicyclo[2.2.1]heptyl; substituted forms of the foregoing in which some hydrogen atoms are replaced by hydroxyl, alkoxy, carboxy, alkoxycarbonyl, oxo, amino, alkylamino, cyano, mercapto, alkylthio, sulfo or other groups; and substituted forms of the foregoing in which some of the methylene groups are replaced by oxygen or sulfur atoms. Exemplary substituted or unsubstituted aryl groups are phenyl, methylphenyl, naphthyl, anthryl, phenanthryl, and pyrenyl. In formula (L3), m is 0 or 1, n is 0, 1, 2 or 3, and 2 m+n is equal to 2 or 3.

In formula (L4), $R^{L06}$ is a substituted or unsubstituted, $C_1$-$C_{10}$ straight, branched or cyclic alkyl group or a substituted or unsubstituted $C_6$-$C_{20}$ aryl group. Examples of these groups are the same as exemplified for $R^{L05}$. $R^{L07}$ to $R^{L16}$ independently represent hydrogen or monovalent $C_1$-$C_{15}$ hydrocarbon groups. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of the foregoing in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms (for example, a pair of $R^{L07}$ and $R^{L09}$, $R^{L09}$ and $R^{L15}$, $R^{L13}$ and $R^{L15}$, or a similar pair) may bond together directly to form a double bond.

Of the acid labile groups of formula (L1), the straight and branched ones are exemplified by the following groups.

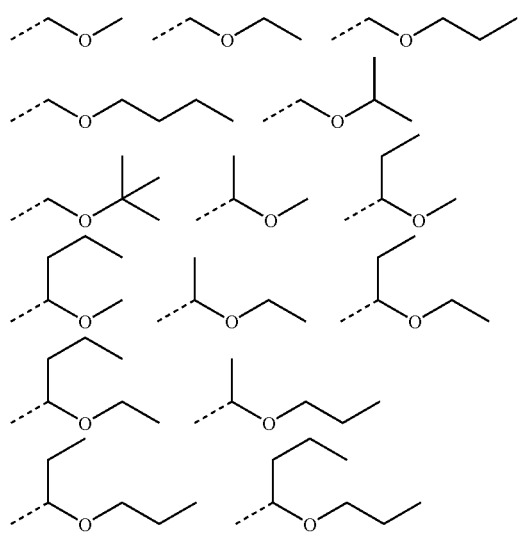

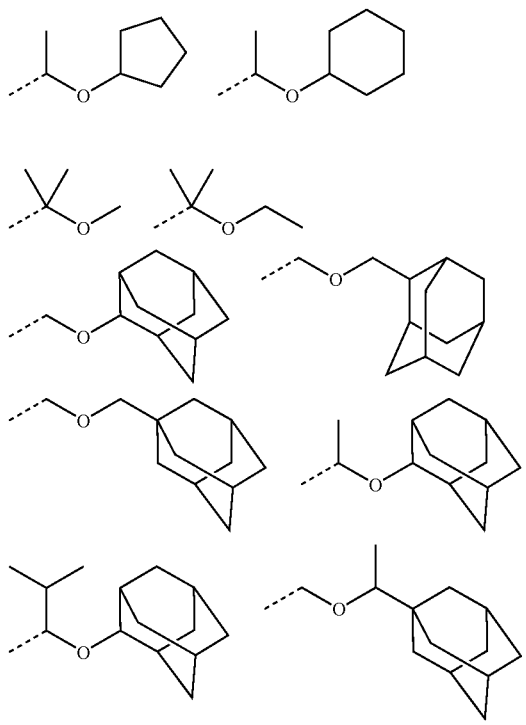

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

The acid labile groups of formula (L4) are preferably groups of the following formulae (L4-1) to (L4-4).

(L4-1)

(L4-2)

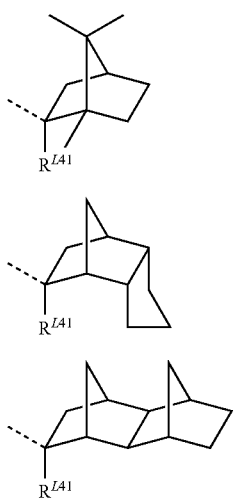

(L4-3)

(L4-4)

In formulae (L4-1) to (L4-4), the broken line indicates a bonding site and direction. $R^{L41}$ is each independently selected from monovalent hydrocarbon groups, typically straight, branched or cyclic $C_1$-$C_{10}$ alkyl groups, for example, methyl, ethyl, propyl, isopropyl, n-butyl, sec-butyl, tert-butyl, tert-amyl, n-pentyl, n-hexyl, cyclopentyl, and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

(L4-3-1)

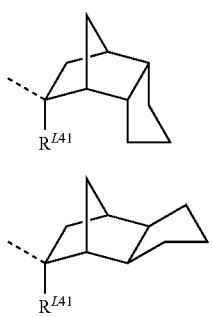

(L4-3-2)

Herein $R^{L41}$ is as defined above.

Similarly, the general formula (L4-4) represents one or a mixture of two or more selected from groups having the following general formulas (L4-4-1) to (L4-4-4).

(L4-4-1)

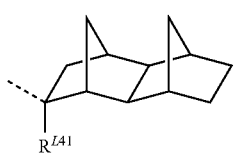

(L4-4-2)

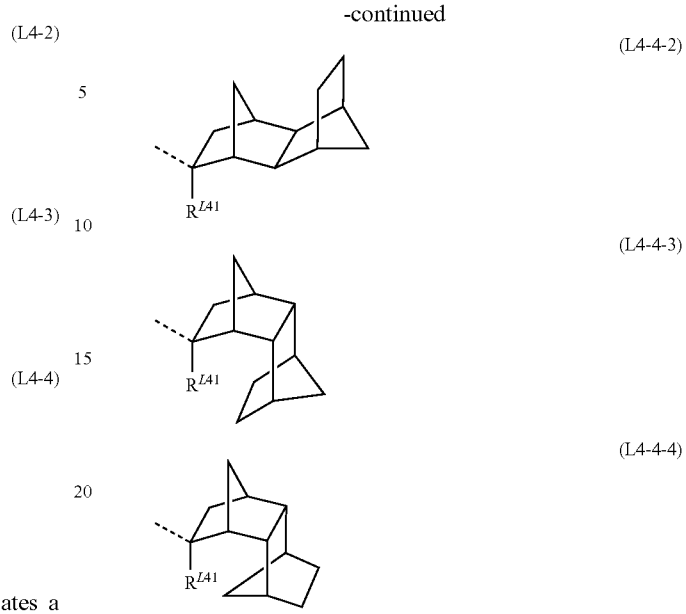

(L4-4-3)

(L4-4-4)

Herein $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo [2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

(L4-1-endo)

(L4-2-endo)

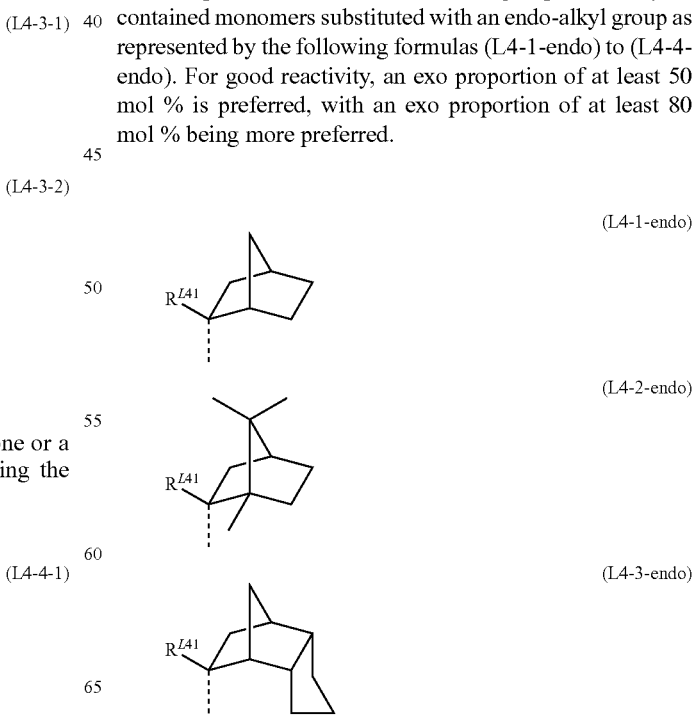

(L4-3-endo)

-continued (L4-4-endo)

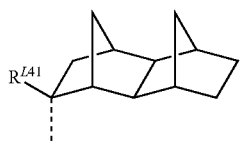

Herein $R^{L41}$ is as defined above.

Illustrative examples of the acid labile group of formula (L4) are given below.

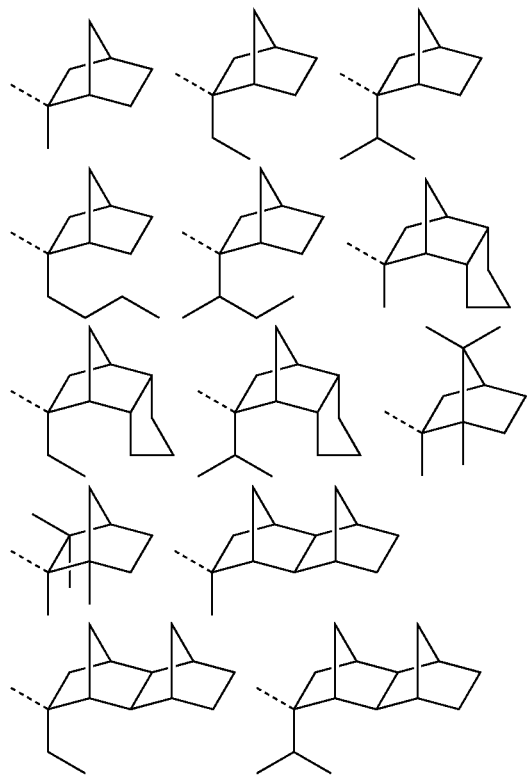

Examples of the tertiary $C_4$-$C_{20}$ alkyl, tri($C_1$-$C_6$-alkyl)silyl and $C_4$-$C_{20}$ oxoalkyl groups included in the acid labile groups represented by $R^{015}$ are as exemplified above for $R^{L04}$.

In formula (R2), $R^{016}$ and $R^{018}$ each are hydrogen or methyl. $R^{017}$ is a straight, branched or cyclic $C_1$-$C_8$ alkyl group.

In formula (R1), the subscripts a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1. In formula (R2), f', g', h', i', j', k', l', and m' are numbers from 0 to less than 1, satisfying f'+g'+h'+i'+j'+k'+l'+m'=1; x', y' and z' are each an integer of 0 to 3, satisfying $1 \leq x'+y'+z' \leq 5$ and $1 \leq y'+z' \leq 3$. In addition, one or more monomers selected from indenes, norbornadienes, acenaphthylenes and vinyl ethers may be copolymerized.

Examples of the recurring units incorporated at compositional ratio a1' in formula (R1) are shown below, though not limited thereto.

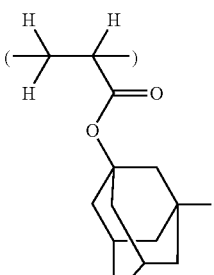
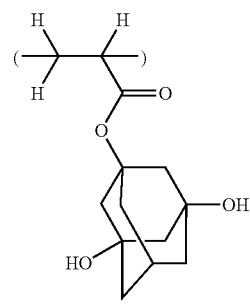
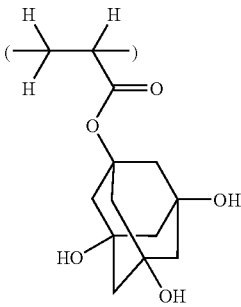
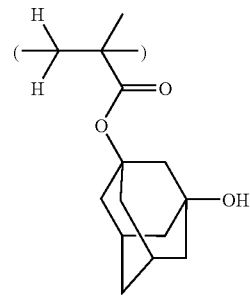
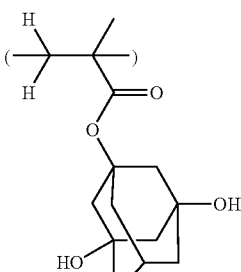
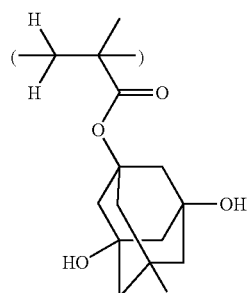
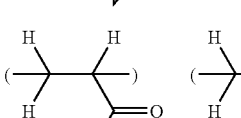
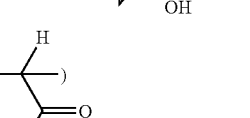
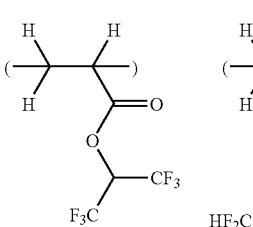
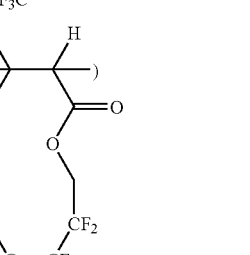
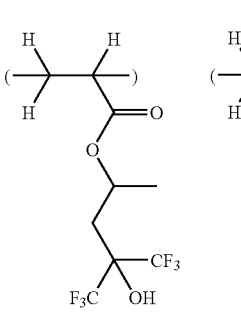
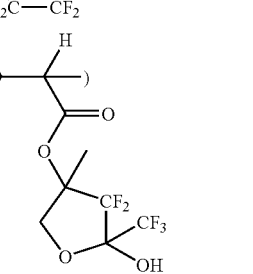

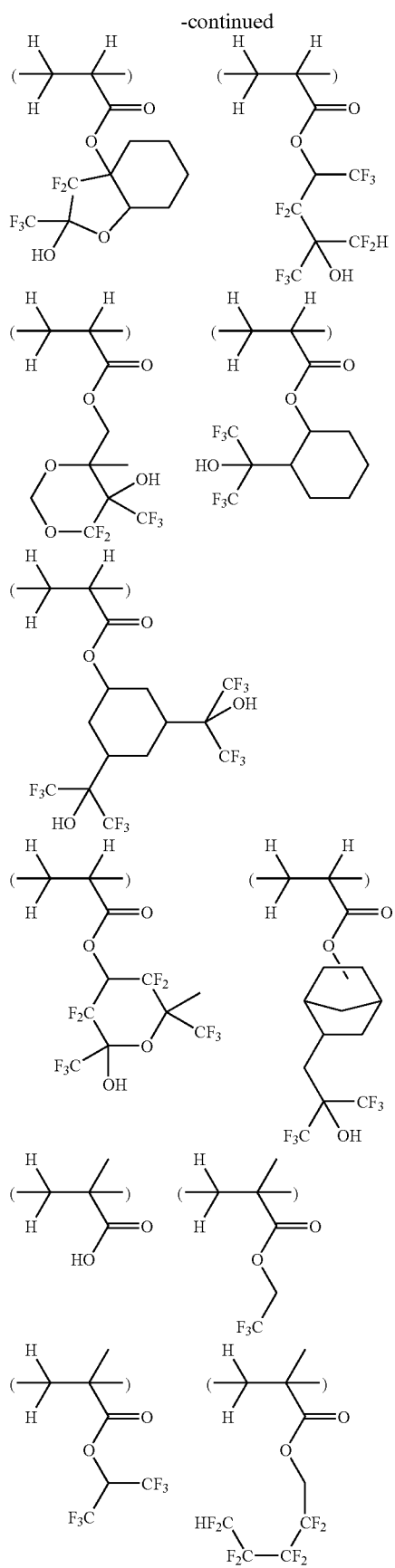
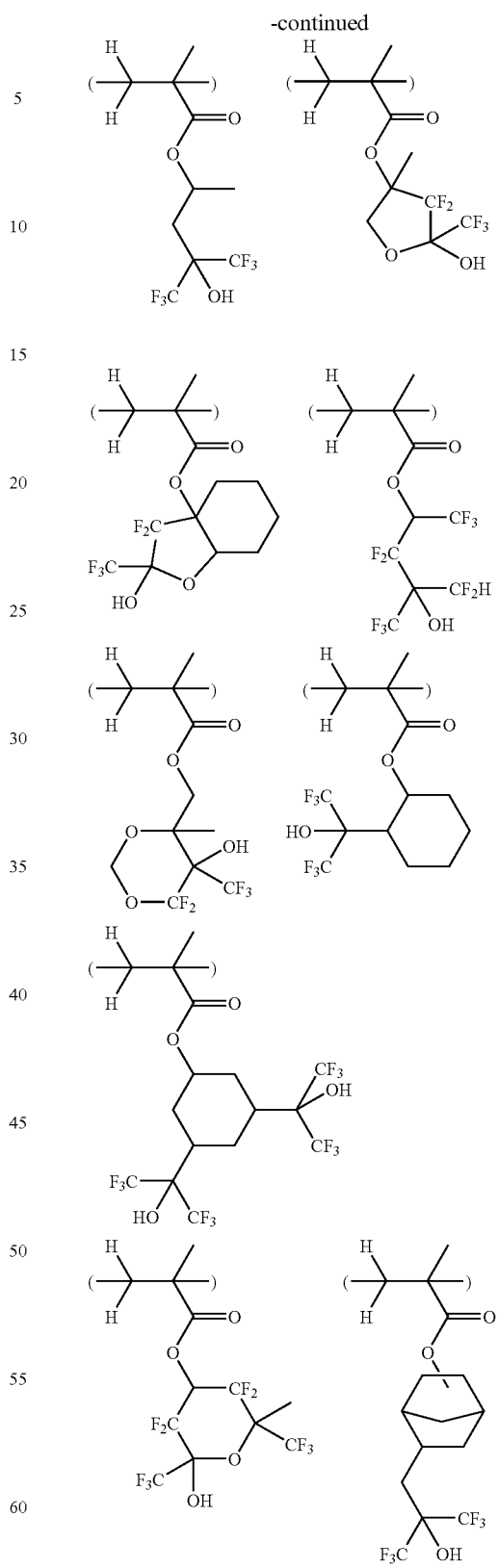
Examples of the recurring units incorporated at compositional ratio b1' in formula (R1) are shown below, though not limited thereto.

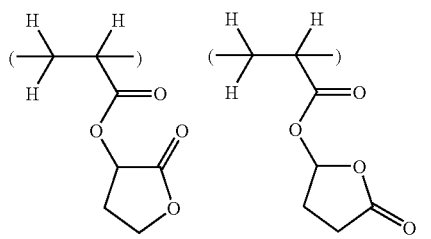
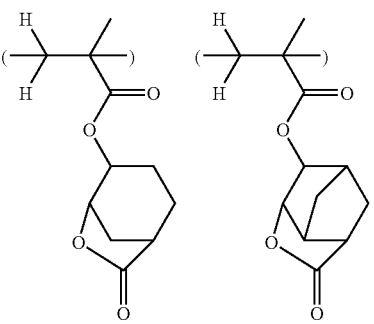
-continued
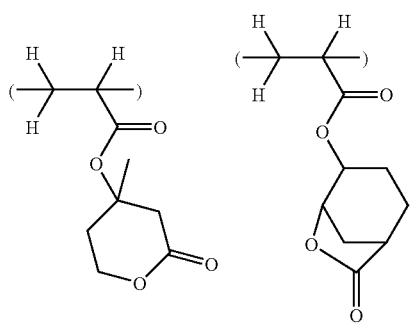
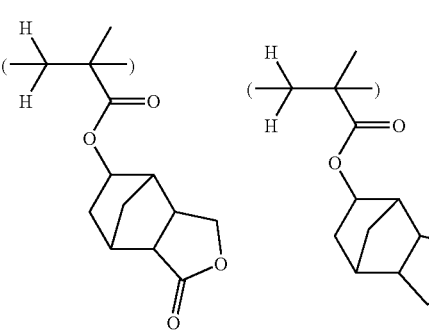
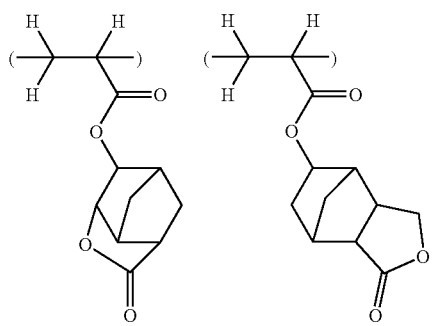
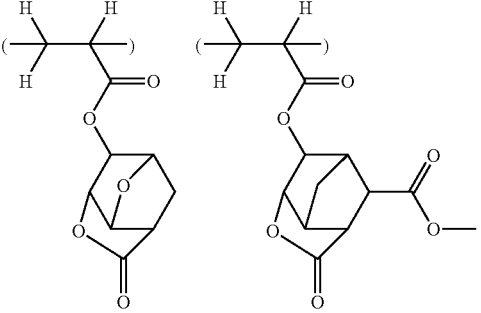
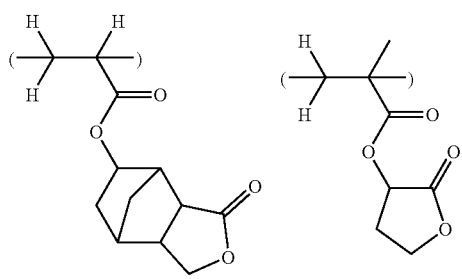
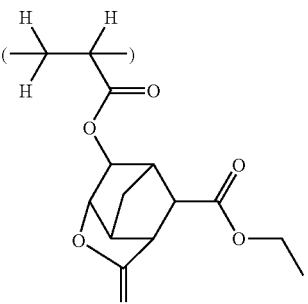
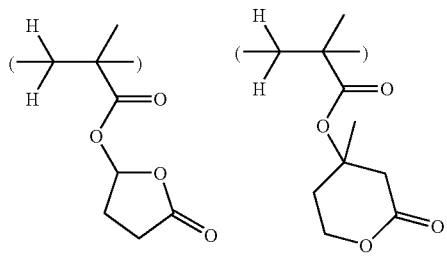
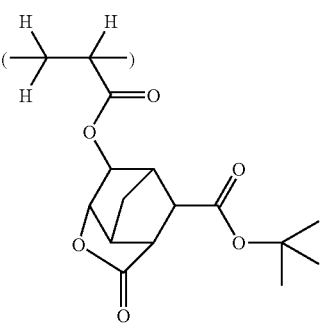

-continued
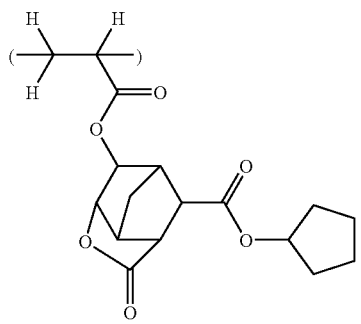
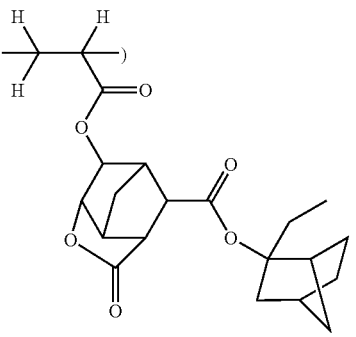
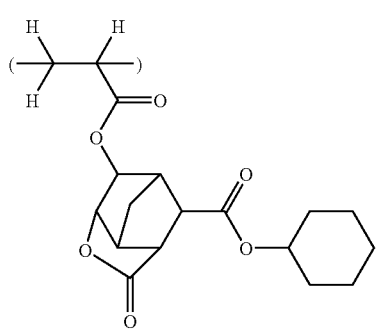
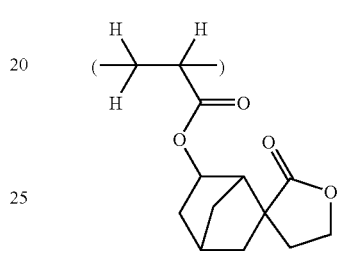
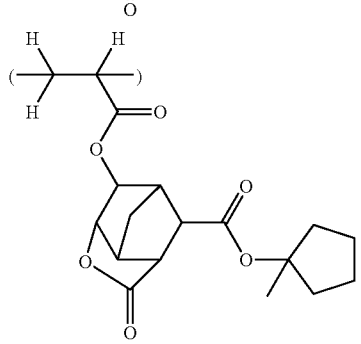
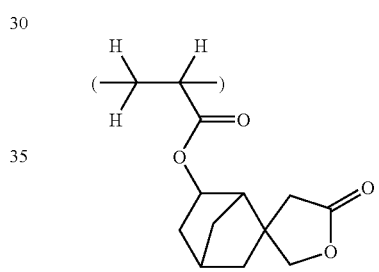
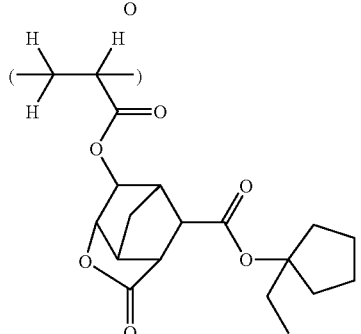
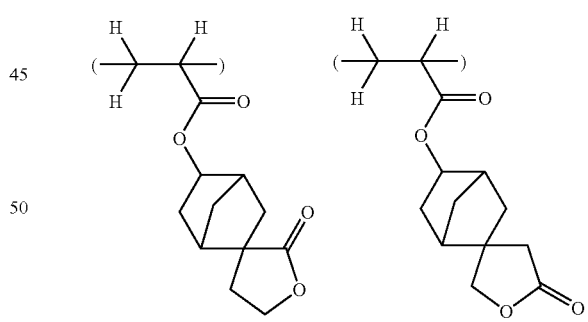
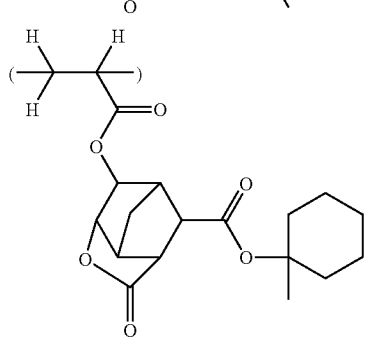
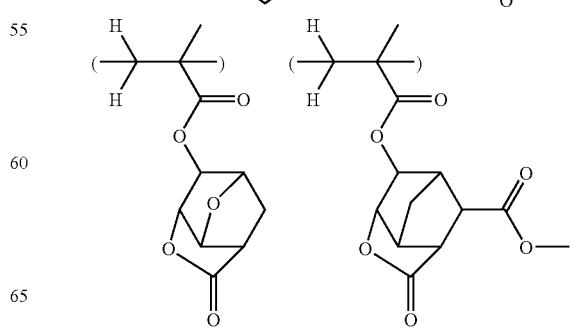

-continued
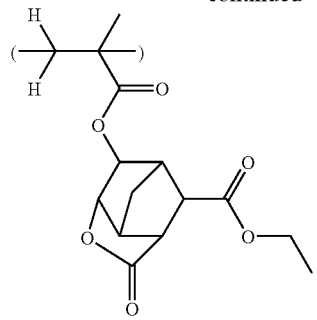
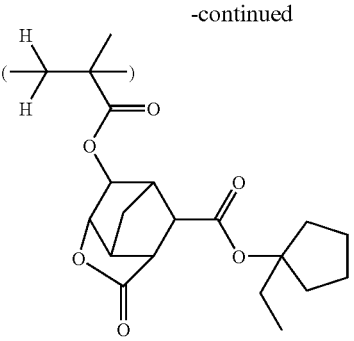
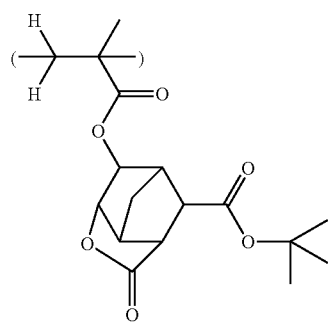
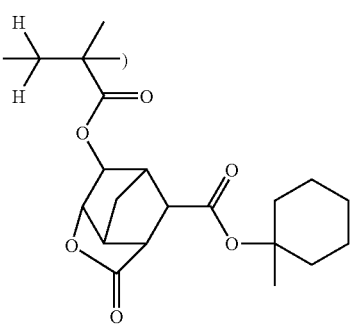
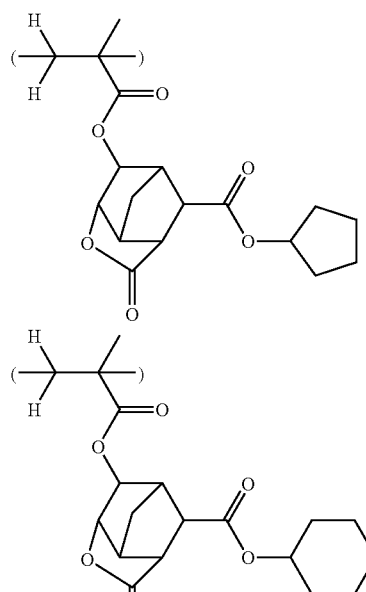
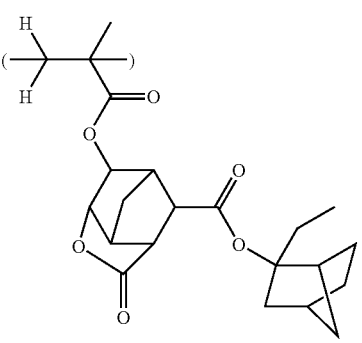
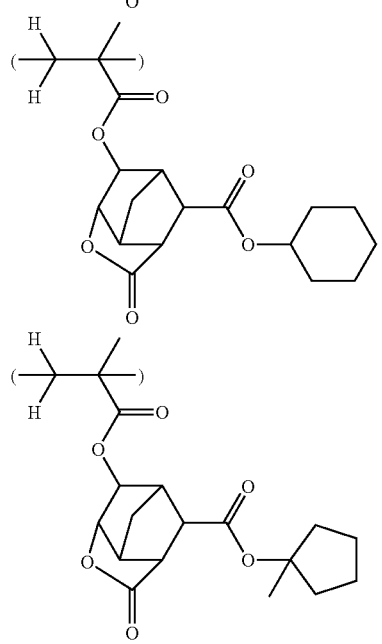
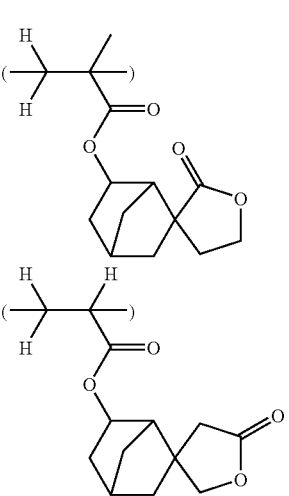

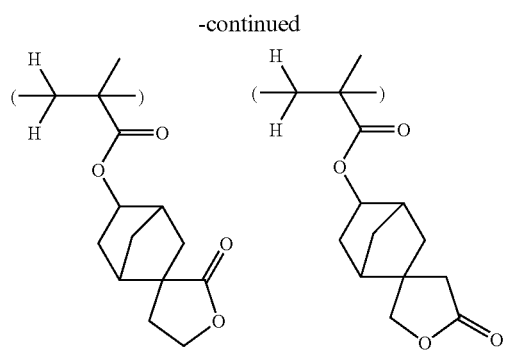
Examples of the recurring units incorporated at compositional ratio d1' in formula (R1) are shown below, though not limited thereto.
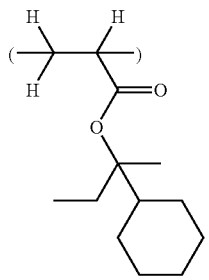
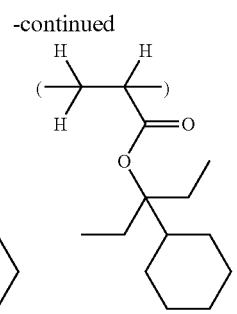
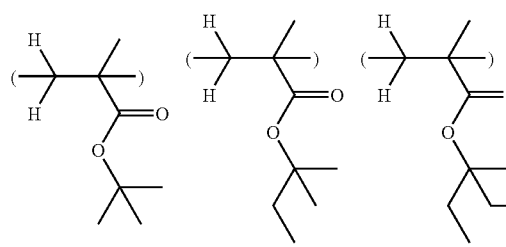
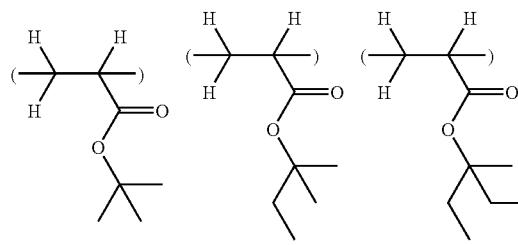
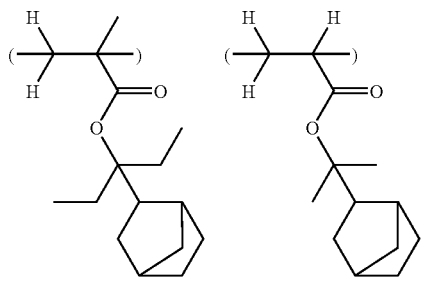
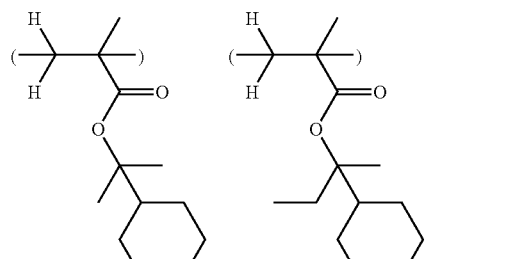
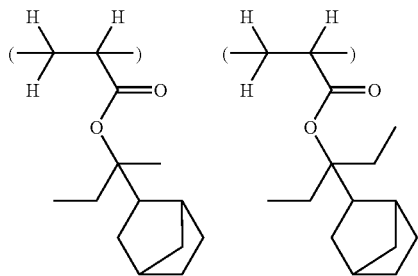
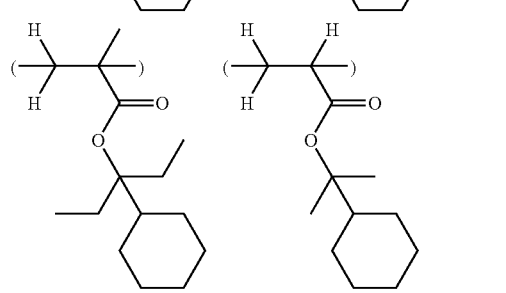
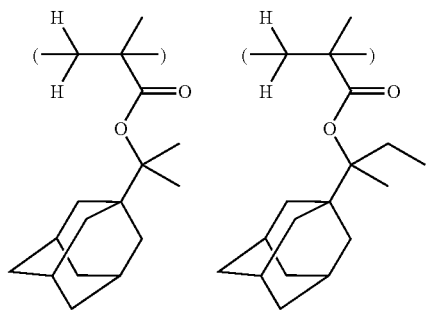

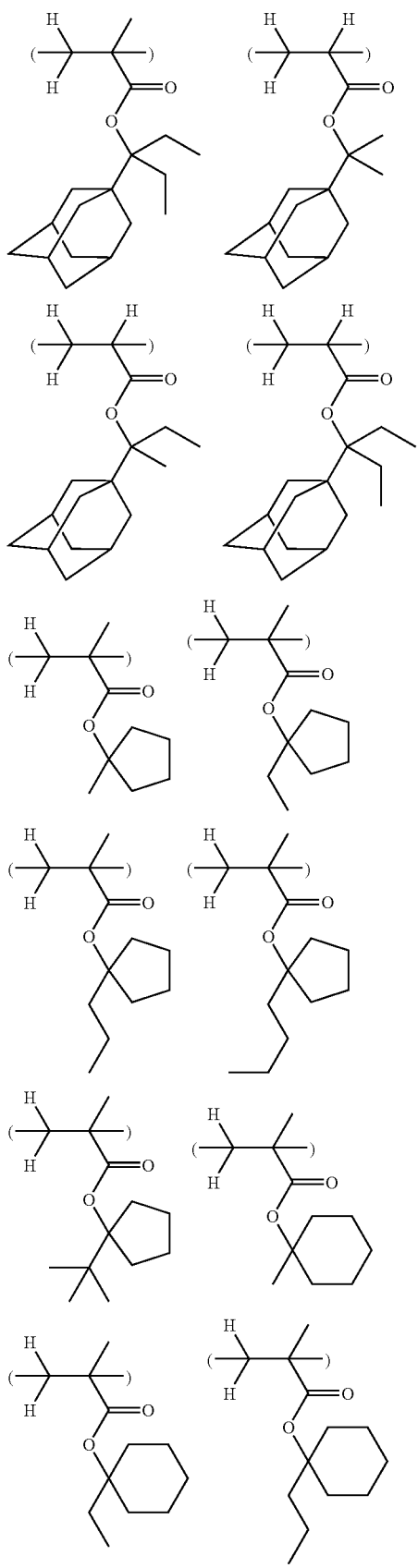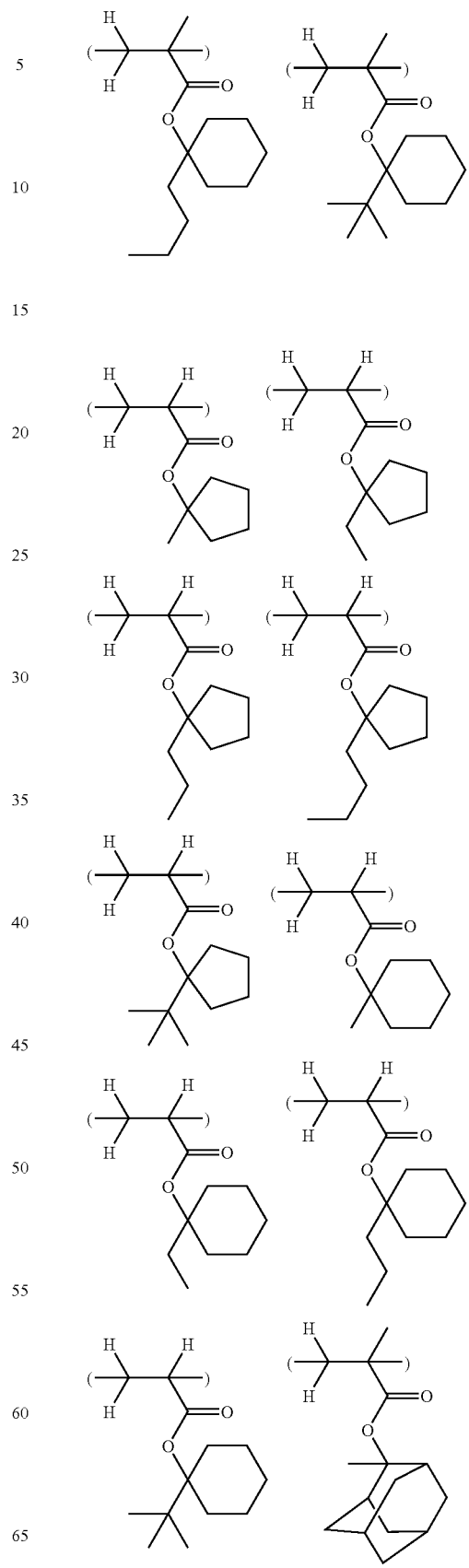

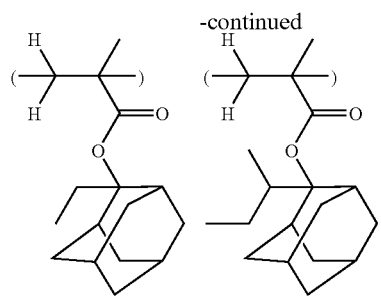
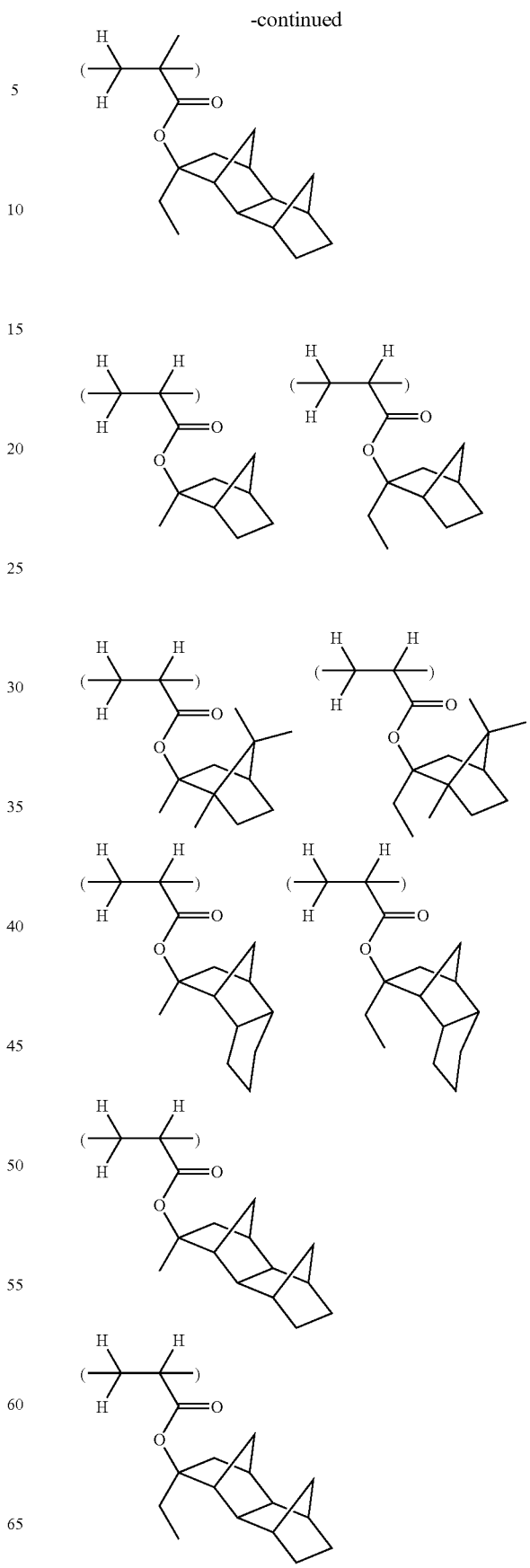

-continued
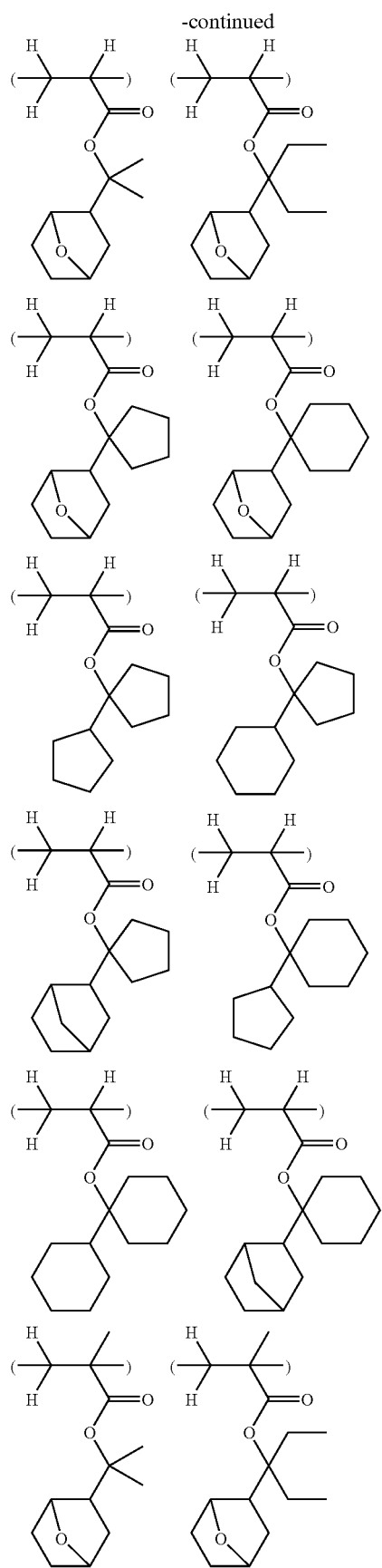
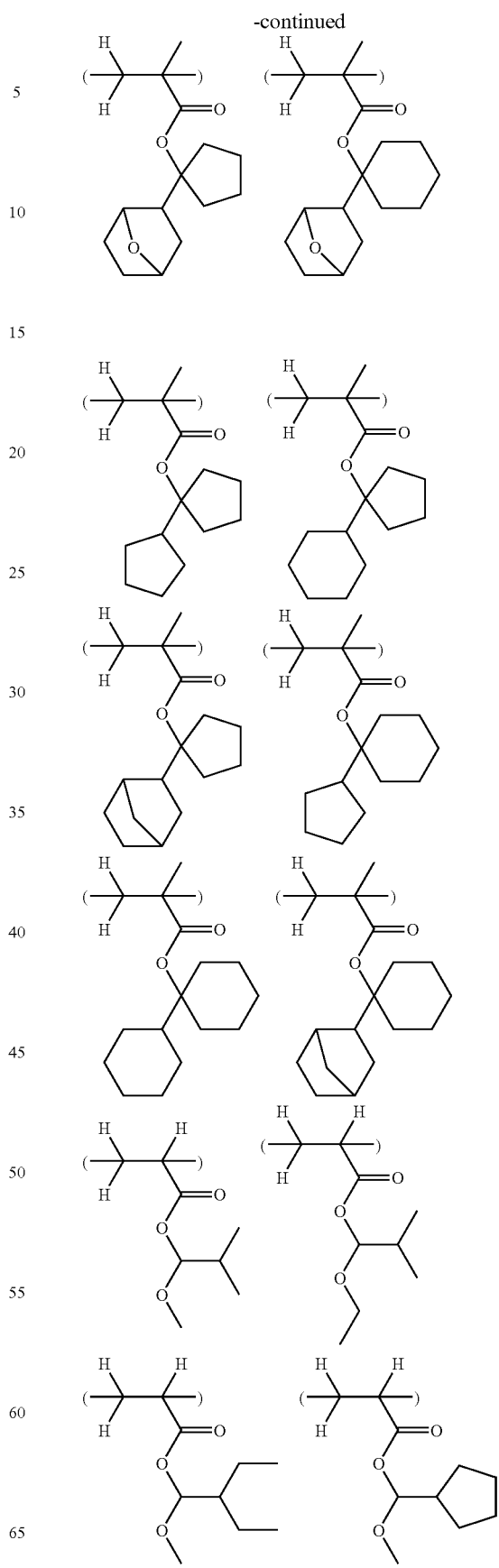

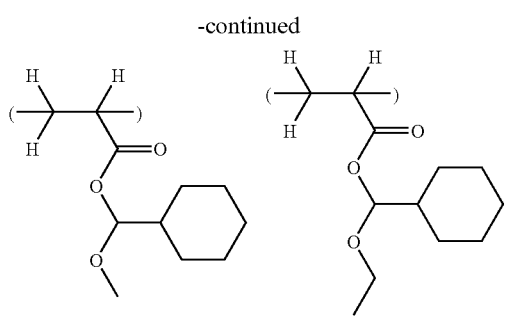
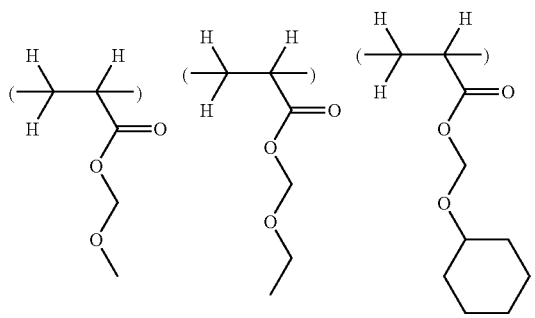
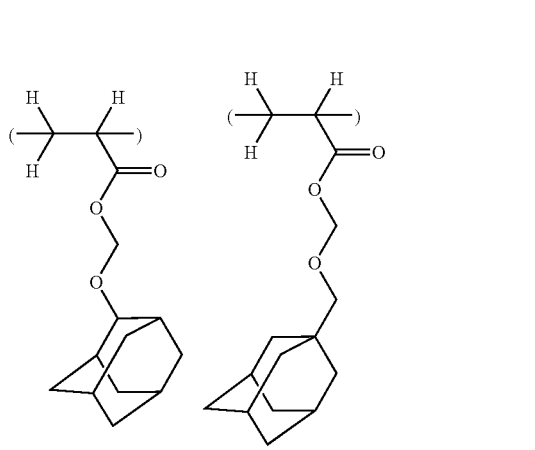
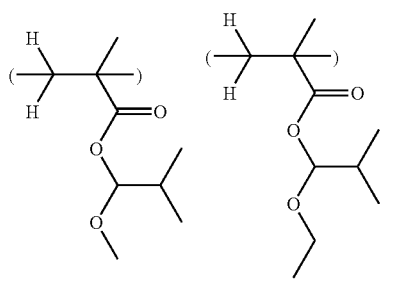
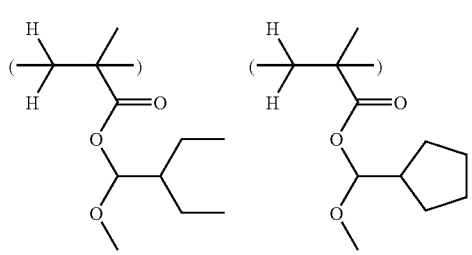
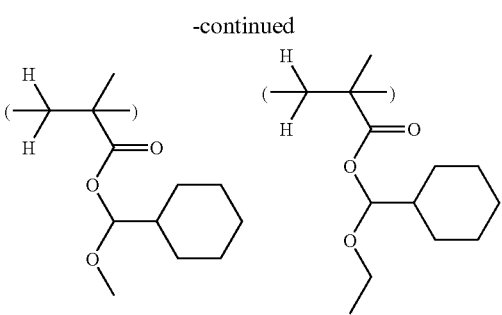
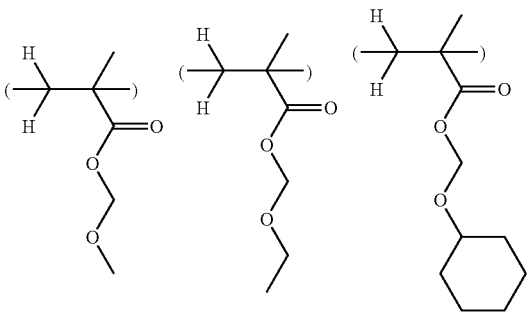
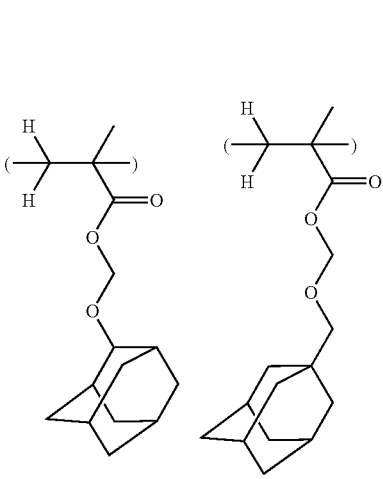
Examples of polymers comprising recurring units in compositional ratios a3', b3', c3' and d3' in formula (R1) are shown below, though not limited thereto.
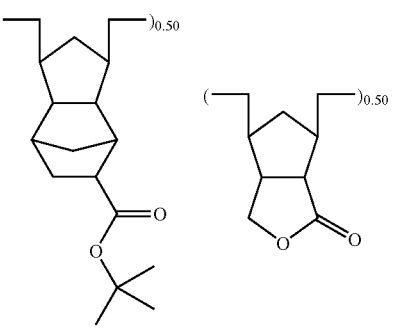

-continued
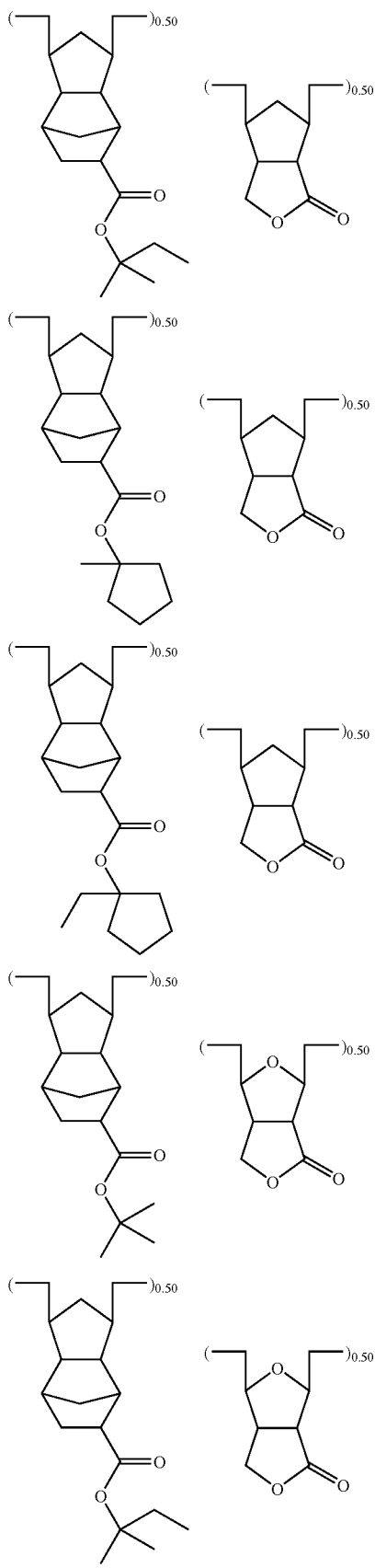
-continued
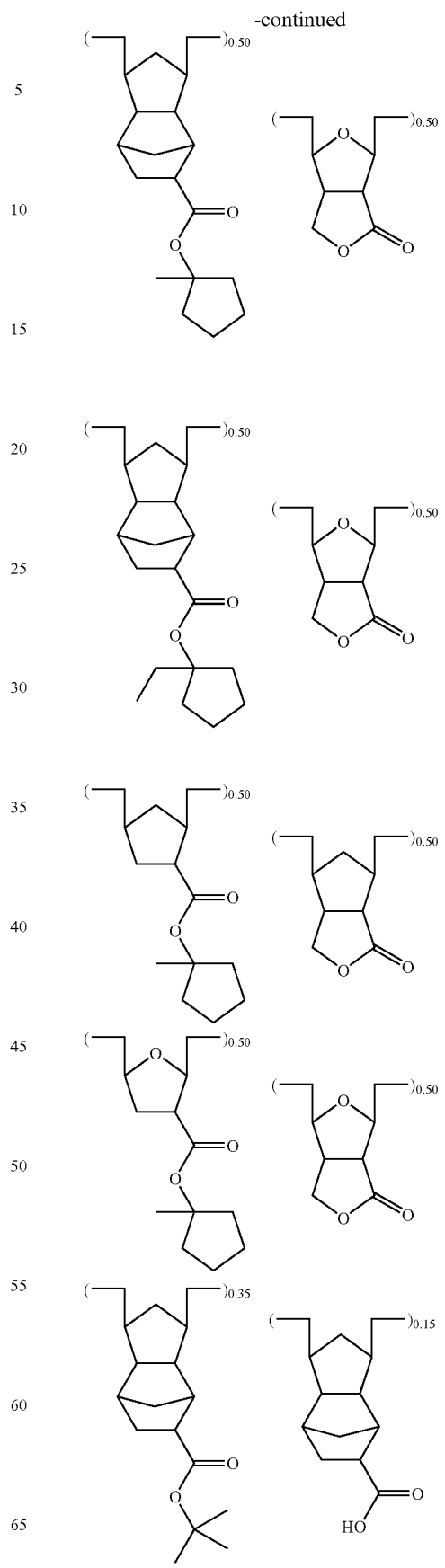

-continued
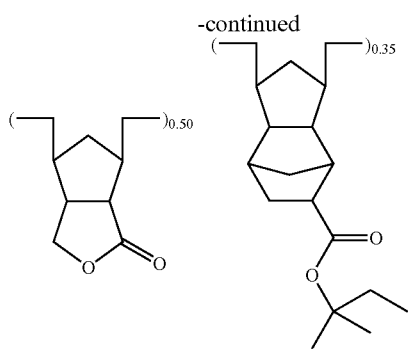
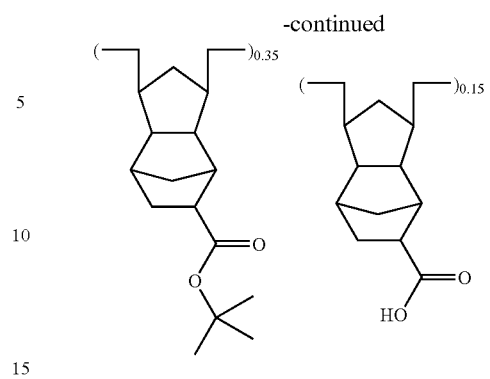
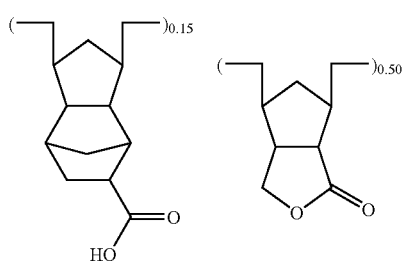
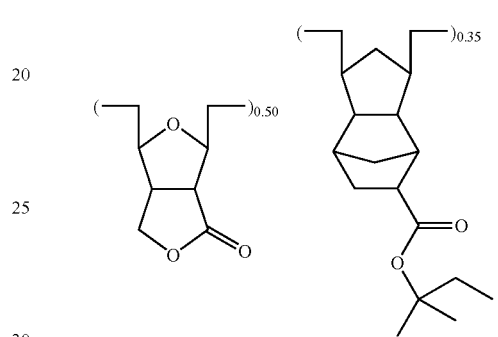
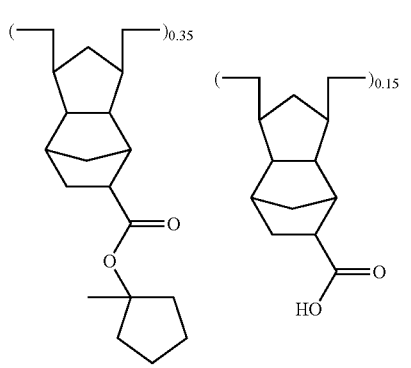
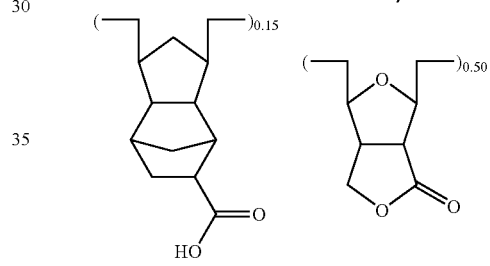
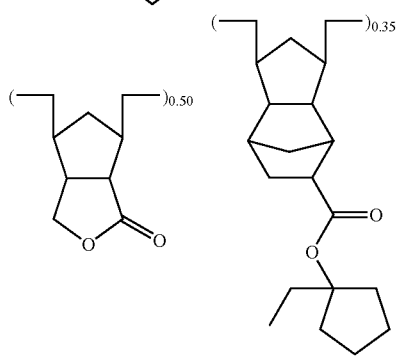
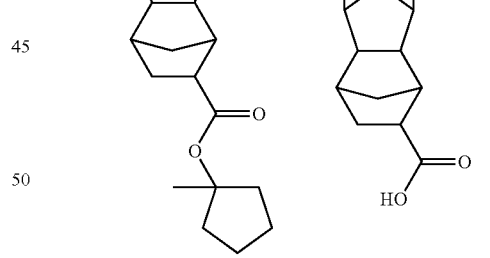
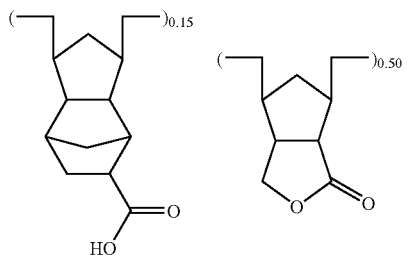
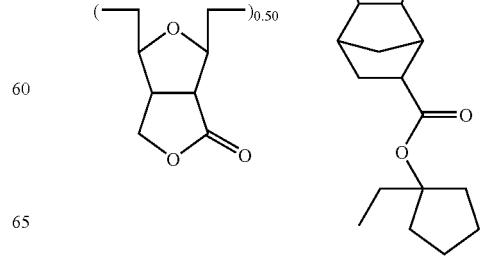

-continued

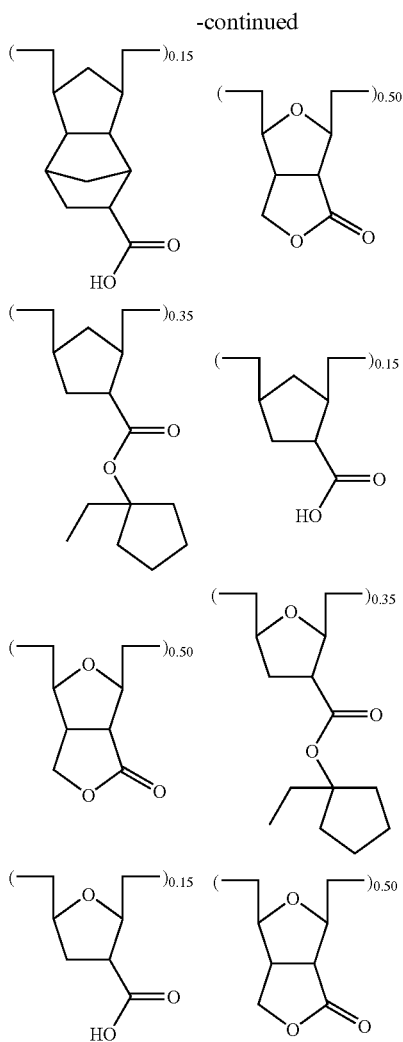

Furthermore, recurring units having a photosensitive sulfonium salt as represented by the general formula (PA) may be copolymerized with (R1) and/or (R2) and incorporated in the polymers.

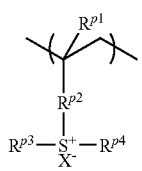
(PA)

Herein $R^{p1}$ is hydrogen or methyl. $R^{p2}$ is a phenylene group, —O—$R^{p5}$— or —C(=O)—X—$R^{p5}$— wherein $X^-$ is an oxygen atom or NH, and $R^{p5}$ is a straight, branched or cyclic $C_1$-$C_6$ alkylene, alkenylene or phenylene group which may contain a carbonyl, ester or ether group. $R^{p3}$ and $R^{p4}$ are each independently a straight, branched or cyclic $C_1$-$C_{12}$ alkyl group which may contain a carbonyl, ester or ether group, or a $C_6$-$C_{12}$ aryl group, $C_7$-$C_{20}$ aralkyl group or thiophenyl group. $X^-$ is a non-nucleophilic counter ion.

The polymer used as the base resin is not limited to one type and a mixture of two or more polymers may be added. The use of plural polymers allows for easy adjustment of resist properties.

Acid Generator

In the resist composition of the invention, an acid generator, specifically a compound capable of generating an acid in response to actinic light or radiation may be included in order that the resist composition function as a chemically amplified positive resist composition. The acid generator may be any compound capable of generating an acid upon exposure of high-energy radiation, which is generally referred to as "photoacid generator" or PAG. Suitable photoacid generators include sulfonium salts, iodonium salts, sulfonyldiazomethane, N-sulfonyloxyimide, and oxime-O-sulfonate acid generators. Exemplary acid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris (3-tert-butoxyphenyl)sulfonium, (3,4-di-tert-butoxyphenyl) diphenylsulfonium, bis(3,4-di-tert-butoxyphenyl) phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, 4-n-butoxynaphthyl-1-thiacyclopentanium, and 2-n-butoxynaphthyl-1-thiacyclopentanium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropane-sulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1, 1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl) ethanesulfonate, and 1,1,2,2-tetrafluoro-2-(tetracyclo [4.4.0.1$^{2,5}$.1$^{7,10}$]dodec-3-en-8-yl)ethanesulfonate.

Exemplary bis(substituted alkylsulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropane-sulfonate, 1,1,3,3,3-pentafluoro-2-furoyloxypropanesulfonate, 2-naphthoyloxy-1,1,3,3,3-pentafluoropropane-sulfonate, 2-(4-tert-butylbenzoyloxy)-1,1,3,3,3-pentafluoropropane-sulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate. Exemplary bis(substituted alkyl-sulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Iodonium salts based on combination of the foregoing examples are included.

Exemplary sulfonyldiazomethane compounds include bis-sulfonyldiazomethane compounds and sulfonyl-carbonyldiazomethane compounds such as
bis(ethylsulfonyl)diazomethane,
bis(1-methylpropylsulfonyl)diazomethane,
bis(2-methylpropylsulfonyl)diazomethane,
bis(1,1-dimethylethylsulfonyl)diazomethane,
bis(cyclohexylsulfonyl)diazomethane,
bis(perfluoroisopropylsulfonyl)diazomethane,
bis(phenylsulfonyl)diazomethane,
bis(4-methylphenylsulfonyl)diazomethane,
bis(2,4-dimethylphenylsulfonyl)diazomethane,
bis(2-naphthylsulfonyl)diazomethane,
bis(4-acetyloxyphenylsulfonyl)diazomethane,
bis(4-methanesulfonyloxyphenylsulfonyl)diazomethane,
bis(4-(4-toluenesulfonyloxy)phenylsulfonyl)diazomethane,
bis(4-(n-hexyloxy)phenylsulfonyl)diazomethane,
bis(2-methyl-4-(n-hexyloxy)phenylsulfonyl)diazomethane,
bis(2,5-dimethyl-4-(n-hexyloxy)phenylsulfonyl)diazomethane,
bis(3,5-dimethyl-4-(n-hexyloxy)phenylsulfonyl)diazomethane,
bis(2-methyl-5-isopropyl-4-(n-hexyloxy)phenylsulfonyl)diazo-methane,
4-methylphenylsulfonylbenzoyldiazomethane,
tert-butylcarbonyl-4-methylphenylsulfonyldiazomethane,
2-naphthylsulfonylbenzoyldiazomethane,
4-methylphenylsulfonyl-2-naphthoyldiazomethane,
methylsulfonylbenzoyldiazomethane, and
tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropane-sulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropane-sulfonate, 2-acetyloxy-1,1,3,3,3-pentafluoropropane-sulfonate, 1,1,3,3,3-pentafluoro-2-hydroxypropane-sulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all the hydroxyl groups are substituted by trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropane-sulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropane-sulfonate, 2-acetyloxy-1,1,3,3,3-pentafluoropropane-sulfonate, 1,1,3,3,3-pentafluoro-2-hydroxypropane-sulfonate, 1,1,3,3,3-pentafluoro-2- tosyloxypropanesulfonate, 1,1-difluoro-2-naphthyl-ethanesulfonate, 1,1,2,2-tetrafluoro-2-(norbornan-2-yl) ethanesulfonate, and 1,1,2,2-tetrafluoro-2-(tetracyclo [4.4.0.1$^{2,5}$.1$^{7,10}$]dodec-3-en-8-yl)ethanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropane-sulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropane-sulfonate, 2-acetyloxy-1,1,3,3,3-pentafluoropropane-sulfonate, 1,1,3,3,3-pentafluoro-2-hydroxypropane-sulfonate, 1,1,3,3,3-pentafluoro-2-tosyloxypropanesulfonate, 1,1-difluoro-2-naphthyl-ethanesulfonate, 1,1,2,2-tetrafluoro-2-(norbornan-2-yl) ethanesulfonate, and 1,1,2,2-tetrafluoro-2-(tetracyclo [4.4.0.1$^{2,5}$1$^{7,10}$]dodec-3-en-8-yl)ethanesulfonate. Also useful are analogous nitrobenzyl sulfonate compounds in which the nitro group on the benzyl side is substituted by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives are described in Japanese Patent No. 2,906,999 and JP-A 9-301948 and include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(methanesulfonyl)-α-dimethylglyoxime,
bis-O-(trifluoromethanesulfonyl)-α-dimethylglyoxime,
bis-O-(2,2,2-trifluoroethanesulfonyl)-α-dimethylglyoxime,
bis-O-(10-camphorsulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-trifluoromethylbenzenesulfonyl)-α-dimethylglyoxime,
bis-O-(xylenesulfonyl)-α-dimethylglyoxime,
bis-O-(trifluoromethanesulfonyl)-nioxime,
bis-O-(2,2,2-trifluoroethanesulfonyl)-nioxime,
bis-O-(10-camphorsulfonyl)-nioxime,
bis-O-(benzenesulfonyl)-nioxime,
bis-O-(p-fluorobenzenesulfonyl)-nioxime,
bis-O-(p-trifluoromethylbenzenesulfonyl)-nioxime, and
bis-O-(xylenesulfonyl)-nioxime.

Also included are the oxime sulfonates described in U.S. Pat. No. 6,004,724, for example,
(5-(4-toluenesulfonyl)oxyimino-5H-thiophen-2-ylidene) phenyl-acetonitrile,
(5-(10-camphorsulfonyl)oxyimino-5H-thiophen-2-ylidene) phenyl-acetonitrile,
(5-n-octanesulfonyloxyimino-5H-thiophen-2-ylidene)phenyl-acetonitrile,
(5-(4-toluenesulfonyl)oxyimino-5H-thiophen-2-ylidene)(2-methylphenyl)acetonitrile,
(5-(10-camphorsulfonyl)oxyimino-5H-thiophen-2-ylidene) (2-methylphenyl)acetonitrile,
(5-n-octanesulfonyloxyimino-5H-thiophen-2-ylidene)(2-methyl-phenyl)acetonitrile, etc.

Also included are the oxime sulfonates described in U.S. Pat. No. 6,916,591, for example, (5-(4-(4-toluenesulfonyloxy) benzenesulfonyl)oxyimino-5H-thiophen-2-ylidene)phenylacetonitrile and (5-(2,5-bis(4-toluenesulfonyloxy)benzenesulfonyl)oxyimino-5H-thiophen-2-ylidene) phenylacetonitrile.

Also included are the oxime sulfonates described in U.S. Pat. No. 6,261,738 and JP-A 2000-314956, for example, 2,2,2-trifluoro-1-phenyl-ethanone oxime-O-methylsulfonate; 2,2,2-trifluoro-1-phenyl-ethanone oxime-O-(10-camphorylsulfonate); 2,2,2-trifluoro-1-phenyl-ethanone oxime-O-(4-methoxyphenylsulfonate); 2,2,2-trifluoro-1-phenyl-ethanone oxime-O-(1-naphthylsulfonate); 2,2,2-trifluoro-1-phenyl-ethanone oxime-O-(2-naphthylsulfonate); 2,2,2-trifluoro-1-phenyl-ethanone oxime-O-(2,4,6-trimethylphenylsulfonate); 2,2,2-trifluoro-1-(4-methylphenyl)-ethanone oxime-O-(10-camphorylsulfonate); 2,2,2-trifluoro-1-(4-methylphenyl)-ethanone oxime-O-(methylsulfonate); 2,2,2-trifluoro-1-(2-methylphenyl)-ethanone oxime-O-(10-camphorylsulfonate); 2,2,2-trifluoro-1-(2,4-dimethylphenyl)-ethanone oxime-O-(10-camphorylsulfonate); 2,2,2-trifluoro-1-(2,4-dimethylphenyl)-ethanone oxime-O-(1-naphthylsulfonate); 2,2,2-trifluoro-1-(2,4-dimethylphenyl)-ethanone oxime-O-(2-naphthylsulfonate); 2,2,2-trifluoro-1-(2,4,6-trimethylphenyl)-ethanone oxime-O-(10-camphorylsulfonate); 2,2,2-trifluoro-1-(2,4,6-trimethyl-phenyl)-ethanone oxime-O-(1-naphthylsulfonate); 2,2,2-trifluoro-1-(2,4,6-trimethylphenyl)-ethanone oxime-O-(2-naphthylsulfonate); 2,2,2-trifluoro-1-(4-methoxyphenyl)-ethanone oxime-O-methylsulfonate; 2,2,2-trifluoro-1-(4-methylthiophenyl)-ethanone oxime-O-methylsulfonate; 2,2,2-trifluoro-1-(3,4-dimethoxyphenyl)-ethanone oxime-O-methylsulfonate; 2,2,3,3,4,4,4-heptafluoro-1-phenyl-butanone oxime-O-(10-camphorylsulfonate); 2,2,2-trifluoro-1-(phenyl)-ethanone oxime-O-methylsulfonate; 2,2,2-trifluoro-1-(phenyl)-ethanone oxime-O-10-camphorylsulfonate; 2,2,2-trifluoro-1-(phenyl)-ethanone oxime-O-(4-methoxyphenyl)sulfonate; 2,2,2-trifluoro-1-(phenyl)-ethanone oxime-O-(1-naphthyl)sulfonate; 2,2,2-trifluoro-1-(phenyl)-ethanone oxime-O-(2-naphthyl)sulfonate; 2,2,2-trifluoro-1-(phenyl)-ethanone oxime-O-(2,4,6-trimethylphenyl)sulfonate; 2,2,2-trifluoro-1-(4-methylphenyl)-ethanone oxime-O-(10-camphoryl)sulfonate; 2,2,2-trifluoro-1-(4-methylphenyl)-ethanone oxime-O-methyl-sulfonate; 2,2,2-trifluoro-1-(2-methylphenyl)-ethanone oxime-O-(10-camphoryl)sulfonate; 2,2,2-trifluoro-1-(2,4-dimethyl-phenyl)-ethanone oxime-O-(1-naphthyl)sulfonate; 2,2,2-trifluoro-1-(2,4-dimethylphenyl)- ethanone oxime-O-(2-naphthyl)sulfonate; 2,2,2-trifluoro-1-(2,4,6-trimethyl-phenyl)-ethanone oxime-O-(10-camphoryl) sulfonate; 2,2,2-trifluoro-1-(2,4,6-trimethylphenyl)-ethanone oxime-O-(1-naphthyl)sulfonate; 2,2,2-trifluoro-1-(2,4,6-trimethyl-phenyl)-ethanone oxime-O-(2-naphthyl) sulfonate; 2,2,2-trifluoro-1-(4-methoxyphenyl)-ethanone oxime-O-methylsulfonate; 2,2,2-trifluoro-1-(4-thiomethylphenyl)-ethanone oxime-O-methylsulfonate; 2,2,2-trifluoro-1-(3,4-dimethoxyphenyl)-ethanone oxime-O-methylsulfonate; 2,2,2-trifluoro-1-(4-methoxyphenyl)-ethanone oxime-O-(4-methylphenyl)sulfonate; 2,2,2-trifluoro-1-(4-methoxyphenyl)-ethanone oxime-O-(4-methoxyphenyl)sulfonate; 2,2,2-trifluoro-1-(4-methoxyphenyl)-ethanone oxime-O-(4-dodecylphenyl)-sulfonate; 2,2,2-trifluoro-1-(4-methoxyphenyl)-ethanone oxime-O-octylsulfonate; 2,2,2-trifluoro-1-(4-thiomethyl-phenyl)-ethanone oxime-O-(4-methoxyphenyl)sulfonate; 2,2,2-trifluoro-1-(4-thiomethylphenyl)-ethanone oxime-O-(4-dodecylphenyl) sulfonate; 2,2,2-trifluoro-1-(4-thiomethyl-phenyl)-ethanone oxime-O-otylsulfonate; 2,2,2-trifluoro-1-(4-thiomethylphenyl)-ethanone oxime-O-(2-naphthyl)sulfonate; 2,2,2-trifluoro-1-(2-methylphenyl)-ethanone oxime-O-methyl-sulfonate; 2,2,2-trifluoro-1-(4-methylphenyl)ethanone oxime-O-phenylsulfonate; 2,2,2-trifluoro-1-(4-chlorophenyl)-ethanone oxime-O-phenylsulfonate; 2,2,3,3,4,4,4-heptafluoro-1-(phenyl)-butanone oxime-O-(10-camphoryl) sulfonate; 2,2,2-trifluoro-1-naphthyl-ethanone oxime-O-methylsulfonate; 2,2,2-trifluoro-2-naphthyl-ethanone oxime-O-methylsulfonate; 2,2,2-trifluoro-1-[4-benzylphenyl]-ethanone oxime-O-methyl-sulfonate; 2,2,2-trifluoro-1-[4-(phenyl-1,4-dioxa-but-1-yl)phenyl]-ethanone oxime-O-methylsulfonate; 2,2,2-trifluoro-1-naphthyl-ethanone oxime-O-propylsulfonate; 2,2,2-trifluoro-2-naphthyl-ethanone oxime-O-propylsulfonate; 2,2,2-trifluoro-1-[4-benzylphenyl]-ethanone oxime-O-propylsulfonate; 2,2,2-trifluoro-1-[4-methylsulfonylphenyl]-ethanone oxime-0-propylsulfonate; 1,3-bis[1-(4-phenoxyphenyl)-2,2,2-trifluoro-ethanone oxime-O-sulfonyl]phenyl; 2,2,2-trifluoro-1-[4-methylsulfonyloxyphenyl]-ethanone oxime-O-propylsulfonate; 2,2,2-trifluoro-1-[4-methylcarbonyloxyphenyl]-ethanone oxime-O-propylsulfonate; 2,2,2-trifluoro-1-[6H,7H-5,8-dioxonaphth-2-yl]-ethanone oxime-O-propylsulfonate; 2,2,2-trifluoro-1-[4-methoxycarbonylmethoxyphenyl]-ethanone oxime-O-propyl-sulfonate; 2,2,2-trifluoro-1-[4-(methoxycarbonyl)-(4-amino-1-oxa-pent-1-yl)-phenyl]-ethanone oxime-O-propylsulfonate; 2,2,2-trifluoro-1-[3,5-dimethyl-4-ethoxyphenyl]-ethanone oxime-O-propylsulfonate; 2,2,2-trifluoro-1-[4-benzyloxy-phenyl]-ethanone oxime-O-propylsulfonate; 2,2,2-trifluoro-1-[2-thiophenyl]-ethanone oxime-O-propylsulfonate; 2,2,2-trifluoro-1-[1-dioxa-thiophen-2-yl)]-ethanone oxime-O-propylsulfonate; 2,2,2-trifluoro-1-(4-(3-(4-(2,2,2-trifluoro-1-(trifluoromethane-sulfonyloxyimino)-ethyl)-phenoxy)-propoxy)-phenyl) ethanone oxime(trifluoromethanesulfonate); 2,2,2-trifluoro-1-(4-(3-(4-(2,2,2-trifluoro-1-(1-propane-sulfonyloxyimino)-ethyl)-phenoxy)-propoxy)-phenyl)ethanone oxime(1-propanesulfonate); and 2,2,2-trifluoro-1-(4-(3-(4-(2,2,2-trifluoro-1-(1-butanesulfonyloxyimino)-ethyl)-phenoxy)-propoxy)-phenyl)ethanone oxime(1-butanesulfonate). Also included are the oxime sulfonates described in U.S. Pat. No. 6,916,591, for example, 2,2,2-trifluoro-1-(4-(3-(4-(2,2,2-trifluoro-1-(4-(4-methylphenylsulfonyloxy)phenylsulfonyloxy-imino)-phenoxy)-propoxy)-phenyl)ethanone oxime(4-(4-methylphenylsulfonyloxy)phenylsulfonate) and 2,2,2-trifluoro-1-(4-(3-(4-(2,2,2-trifluoro-1-(2,5-bis(4-methylphenylsulfonyloxy)benzenesulfonyloxy)phenylsulfonyloxy-imino)-ethyl)-phenoxy)-propoxy)-phenyl)ethanone oxime(2,5-bis(4-methylphenylsulfonyloxy)benzenesulfonyloxy)phenyl-sulfonate).

Also included are the oxime sulfonates described in JP-A 9-95479 and JP-A 9-230588 and the references cited therein, for example, α-(p-toluenesulfonyloxyimino)-phenylacetonitrile,
α-(p-chlorobenzenesulfonyloxyimino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile,
α-(benzenesulfonyloxyimino)-4-methoxyphenylacetonitrile,
α-(2-chlorobenzenesulfonyloxyimino)-4-methoxyphenylaceto-nitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl] aceto-nitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Also included are oxime sulfonates having the formula:

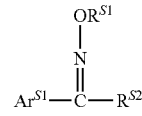

wherein $R^{s1}$ is a substituted or unsubstituted haloalkylsulfonyl or halobenzenesulfonyl group of 1 to 10 carbon atoms, $R^{s2}$ is a haloalkyl group of 1 to 11 carbon atoms, and $Ar^{s1}$ is substituted or unsubstituted aromatic or hetero-aromatic group, as described in WO 2004/074242. Examples include 2-[2,2,3,3,4,4,5,5-octafluoro-1-(nonafluorobutylsulfonyloxyimino)-pentyl]-fluorene, 2-[2,2,3,3,4,4-pentafluoro-1-(nonafluorobutylsulfonyloxy-imino)-butyl]-fluorene, 2-[2,2,3,3,4,4,5,5,6,6-decafluoro-1-(nonafluorobutylsulfonyl-oxyimino)-hexyl]-fluorene, 2-[2,2,3,3,4,4,5,5-octafluoro-1-(nonafluorobutylsulfonyloxy-imino)-pentyl]-4-biphenyl, 2-[2,2,3,3,4,4-pentafluoro-1-(nonafluorobutylsulfonyloxy-imino)-butyl]-4-biphenyl, and 2-[2,2,3,3,4,4,5,5,6,6-decafluoro-1-(nonafluorobutylsulfonyl-oxyimino)-hexyl]-4-biphenyl.

Suitable bisoxime sulfonates include those described is in JP-A 9-208554, for example,
bis(α-(4-toluenesulfonyloxy) imino)-p-phenylenediacetonitrile,
bis(α-(benzenesulfonyloxy)imino)-p-phenylenediacetonitrile, bis(α-(methanesulfonyloxy)imino)-p-phenylenediacetonitrile,
bis(α-(butanesulfonyloxy)imino)-p-phenylenediacetonitrile,
bis(α-(10-camphorsulfonyloxy)imino)-p-phenylenediacetonitrile,
bis(α-(4-toluenesulfonyloxy)imino)-p-phenylenediacetonitrile,
bis(α-(trifluoromethanesulfonyloxy)imino)-p-phenylenediaceto-nitrile,
bis(α-(4-methoxybenzenesulfonyloxy)imino)-p-phenylenediaceto-nitrile,
bis(α-(4-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediaceto-nitrile,
bis(α-(4-toluenesulfonyloxy)imino)-m-phenylenediacetonitrile,
bis(α-(trifluoromethanesulfonyloxy)imino)-m-phenylenediaceto-nitrile,
bis(α-(4-methoxybenzenesulfonyloxy)imino)-m-phenylenediaceto-nitrile, etc.

Of these, preferred photoacid generators are sulfonium salts, bissulfonyldiazomethanes, N-sulfonyloxyimides, oxime-O-sulfonates and glyoxime derivatives. More preferred photoacid generators are sulfonium salts, bissulfonyldiazomethanes, N-sulfonyloxyimides, and oxime-O-sulfonates. Typical examples include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluenesulfonyl-oxy)benzenesulfonate, tris(4-methylphenyl)sulfonium camphorsulfonate, tris(4-tert-butylphenyl)sulfonium camphorsulfonate, 4-tert-butylphenyldiphenylsulfonium camphorsulfonate, 4-tert-butylphenyldiphenylsulfonium nonafluoro-1-butane-sulfonate, 4-tert-butylphenyldiphenylsulfonium pentafluoroethyl-perfluorocyclohexanesulfonate, 4-tert-butylphenyldiphenylsulfonium perfluoro-1-octane-sulfonate, triphenylsulfonium 1,1-difluoro-2-naphthyl-ethanesulfonate, triphenylsulfonium 1,1,2,2-tetrafluoro-2-(norbornan-2-yl)-ethanesulfonate, bis(tert-butylsulfonyl)diazomethane, bis(cyclohexylsulfonyl)diazomethane, bis(2,4-dimethylphenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazo-methane, bis(4-tert-butylphenylsulfonyl)diazomethane, N-camphorsulfonyloxy-5-norbornene-2,3-dicarboxylic acid imide, N-p-toluenesulfonyloxy-5-norbornene-2,3-dicarboxylic acid imide, 2-[2,2,3,3,4,4,5,5-octafluoro-1-(nonafluorobutylsulfonyloxy-imino)-pentyl]-fluorene, 2-[2,2,3,3,4,4-pentafluoro-1-(nonafluorobutylsulfonyloxy-imino)-butyl]-fluorene, and 2-[2,2,3,3,4,4,5,5,6,6-decafluoro-1-(nonafluorobutylsulfonyl-oxyimino)-hexyl]-fluorene.

In the chemically amplified resist composition, an appropriate amount of the photoacid generator is, but not limited to, 0.1 to 20 parts, and especially 0.1 to 10 parts by weight per 100 parts by weight of the base resin. If the amount of the PAG is up to 20 phr, the resulting photoresist film has a sufficiently high transmittance to minimize a risk of degrading resolution. The PAG may be used alone or in admixture of two or more. The transmittance of the resist film can be controlled by using a PAG having a low transmittance at the exposure wavelength and adjusting the amount of the PAG added.

In the resist composition, there may be added a compound which is decomposed with an acid to generate another acid, that is, acid-amplifier compound. For these compounds, reference should be made to J. Photopolym. Sci. and Tech., 8, 43-44, 45-46 (1995), and ibid., 9, 29-30 (1996).

Examples of the acid-amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition, an appropriate amount of the acid-amplifier compound is up to 2 parts, and preferably up to 1 part by weight per 100 parts by weight of the base resin. Up to 2 phr of the acid-amplifier compound allows for diffusion control, minimizing a risk of degrading resolution and pattern profile.

In addition to the base resin and PAG as well as the polymeric surfactant, the resist composition of the invention may further comprise at least one of an organic solvent, a basic compound, a dissolution regulator, a crosslinker, and a surfactant.

Solvent

The organic solvent used herein may be any organic solvent in which the base resin, acid generator, and other components are soluble. Illustrative, non-limiting, examples of the organic solvent include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the acid generator is most soluble therein.

An appropriate amount of the organic solvent used is about 200 to 3,000 parts, especially about 400 to 2,500 parts by weight per 100 parts by weight of the base resin.

Basic Compound

In the resist composition, an organic nitrogen-containing compound or compounds may be compounded as the basic compound. The organic nitrogen-containing compound used herein is preferably a compound capable of suppressing the rate of diffusion when the acid generated by the acid generator diffuses within the resist film. The inclusion of organic nitrogen-containing compound holds down the rate of acid diffusion within the resist film, resulting in better resolution. In addition, it suppresses changes in sensitivity following exposure and reduces substrate and environment dependence, as well as improving the exposure latitude and the pattern profile.

Suitable organic nitrogen-containing compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and carbamate derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole and oxazolidinone.

In addition, organic nitrogen-containing compounds of the following general formula (B)-1 may also be included alone or in admixture.

$$N(X)_n(Y)_{3-n} \qquad \text{(B)-1}$$

In the formula, n is equal to 1, 2 or 3; side chain Y is independently hydrogen or a straight, branched or cyclic alkyl group of 1 to 20 carbon atoms which may contain an ether or hydroxyl group; and side chain X is independently selected from groups of the following general formulas (X1) to (X3), and two or three X's may bond together to form a ring.

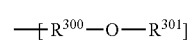

(X1)

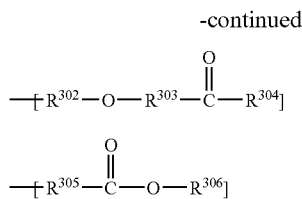

In the formulas, $R^{300}$, $R^{302}$ and $R^{305}$ are independently straight or branched alkylene groups of 1 to 4 carbon atoms; $R^{301}$ and $R^{304}$ are independently hydrogen or a straight, branched or cyclic alkyl group of 1 to 20 carbon atoms which may contain at least one hydroxyl, ether, ester group or lactone ring; $R^{303}$ is a single bond or a straight or branched alkylene group of 1 to 4 carbon atoms; and $R^{306}$ is a straight, branched or cyclic alkyl group of 1 to 20 carbon atoms which may contain at least one hydroxyl, ether, ester group or lactone ring.

Illustrative examples of the compounds of formula (B)-1 include tris(2-methoxymethoxyethyl)amine,
tris{2-(2-methoxyethoxy)ethyl}amine,
tris{2-(2-methoxyethoxymethoxy)ethyl}amine,
tris{2-(1-methoxyethoxy)ethyl}amine,
tris{2-(1-ethoxyethoxy)ethyl}amine,
tris{2-(1-ethoxypropoxy)ethyl}amine,
tris[2-{2-(2-hydroxyethoxy)ethoxy}ethyl]amine,
4,7,13,16,21,24-hexaoxa-1,10-diazabicyclo[8.8.8]hexacosane,
4,7,13,18-tetraoxa-1,10-diazabicyclo[8.5.5]eicosane,
1,4,10,13-tetraoxa-7,16-diazabicyclooctadecane,
1-aza-12-crown-4, 1-aza-15-crown-5, 1-aza-18-crown-6,
tris(2-formyloxyethyl)amine, tris(2-acetoxyethyl)amine,
tris(2-propionyloxyethyl)amine, tris(2-butyryloxyethyl)amine,
tris(2-isobutyryloxyethyl)amine, tris(2-valeryloxyethyl)amine,
tris(2-pivaloyloxyethyl)amine,
N,N-bis(2-acetoxyethyl)-2-(acetoxyacetoxy)ethylamine,
tris(2-methoxycarbonyloxyethyl)amine,
tris(2-tert-butoxycarbonyloxyethyl)amine,
tris[2-(2-oxopropoxy)ethyl]amine,
tris[2-(methoxycarbonylmethyl)oxyethyl]amine,
tris[2-(tert-butoxycarbonylmethyloxy)ethyl]amine,
tris[2-(cyclohexyloxycarbonylmethyloxy)ethyl]amine,
tris(2-methoxycarbonylethyl)amine,
tris(2-ethoxycarbonylethyl)amine,
N,N-bis(2-hydroxyethyl)-2-(methoxycarbonyl)ethylamine,
N,N-bis(2-acetoxyethyl)-2-(methoxycarbonyl)ethylamine,
N,N-bis(2-hydroxyethyl)-2-(ethoxycarbonyl)ethylamine,
N,N-bis(2-acetoxyethyl)-2-(ethoxycarbonyl)ethylamine,
N,N-bis(2-hydroxyethyl)-2-(2-methoxyethoxycarbonyl)ethylamine,
N,N-bis(2-acetoxyethyl)-2-(2-methoxyethoxycarbonyl)ethylamine,
N,N-bis(2-hydroxyethyl)-2-(2-hydroxyethoxycarbonyl)ethylamine,
N,N-bis(2-acetoxyethyl)-2-(2-acetoxyethoxycarbonyl)ethylamine,
N,N-bis(2-hydroxyethyl)-2-[(methoxycarbonyl)methoxycarbonyl]-ethylamine,
N,N-bis(2-acetoxyethyl)-2-[(methoxycarbonyl)methoxycarbonyl]-ethylamine,
N,N-bis(2-hydroxyethyl)-2-(2-oxopropoxycarbonyl)ethylamine,
N,N-bis(2-acetoxyethyl)-2-(2-oxopropoxycarbonyl)ethylamine,
N,N-bis(2-hydroxyethyl)-2-(tetrahydrofurfuryloxycarbonyl)-ethylamine,
N,N-bis(2-acetoxyethyl)-2-(tetrahydrofurfuryloxycarbonyl)-ethylamine,
N,N-bis(2-hydroxyethyl)-2-[(2-oxotetrahydrofuran-3-yl)oxy-carbonyl]ethylamine,
N,N-bis(2-acetoxyethyl)-2-[(2-oxotetrahydrofuran-3-yl)oxy-carbonyl]ethylamine,
N,N-bis(2-hydroxyethyl)-2-(4-hydroxybutoxycarbonyl)ethylamine,
N,N-bis(2-formyloxyethyl)-2-(4-formyloxybutoxycarbonyl)-ethylamine,
N,N-bis(2-formyloxyethyl)-2-(2-formyloxyethoxycarbonyl)-ethylamine,
N,N-bis(2-methoxyethyl)-2-(methoxycarbonyl)ethylamine,
N-(2-hydroxyethyl)-bis[2-(methoxycarbonyl)ethyl]amine,
N-(2-acetoxyethyl)-bis[2-(methoxycarbonyl)ethyl]amine,
N-(2-hydroxyethyl)-bis[2-(ethoxycarbonyl)ethyl]amine,
N-(2-acetoxyethyl)-bis[2-(ethoxycarbonyl)ethyl]amine,
N-(3-hydroxy-1-propyl)-bis[2-(methoxycarbonyl)ethyl]amine,
N-(3-acetoxy-1-propyl)-bis[2-(methoxycarbonyl)ethyl]amine,
N-(2-methoxyethyl)-bis[2-(methoxycarbonyl)ethyl]amine,
N-butyl-bis[2-(methoxycarbonyl)ethyl]amine,
N-butyl-bis[2-(2-methoxyethoxycarbonyl)ethyl]amine,
N-methyl-bis(2-acetoxyethyl)amine,
N-ethyl-bis(2-acetoxyethyl)amine,
N-methyl-bis(2-pivaloyloxyethyl)amine,
N-ethyl-bis[2-(methoxycarbonyloxy)ethyl]amine,
N-ethyl-bis[2-(tert-butoxycarbonyloxy)ethyl]amine,
tris(methoxycarbonylmethyl)amine,
tris(ethoxycarbonylmethyl)amine,
N-butyl-bis(methoxycarbonylmethyl)amine,
N-hexyl-bis(methoxycarbonylmethyl)amine, and
β-(diethylamino)-δ-valerolactone.

Also useful are one or more organic nitrogen-containing compounds having cyclic structure represented by the following general formula (B)-2.

Herein X is as defined above, and $R^{307}$ is a straight or branched alkylene group of 2 to 20 carbon atoms which may contain one or more carbonyl, ether, ester or sulfide groups.

Illustrative examples of the organic nitrogen-containing compounds having formula (B)-2 include
1-[2-(methoxymethoxy)ethyl]pyrrolidine,
1-[2-(methoxymethoxy)ethyl]piperidine,
4-[2-(methoxymethoxy)ethyl]morpholine,
1-[2-[(2-methoxyethoxy)methoxy]ethyl]pyrrolidine,
1-[2-[(2-methoxyethoxy)methoxy]ethyl]piperidine,
4-[2-[(2-methoxyethoxy)methoxy]ethyl]morpholine,
2-(1-pyrrolidinyl)ethyl acetate, 2-piperidinoethyl acetate,
2-morpholinoethyl acetate, 2-(1-pyrrolidinyl)ethyl formate,
2-piperidinoethyl propionate,
2-morpholinoethyl acetoxyacetate,
2-(1-pyrrolidinyl)ethyl methoxyacetate,
4-[2-(methoxycarbonyloxy)ethyl]morpholine,
1-[2-(t-butoxycarbonyloxy)ethyl]piperidine, 4-[2-(2-methoxyethoxycarbonyloxy)ethyl]morpholine,
methyl 3-(1-pyrrolidinyl)propionate,
methyl 3-piperidinopropionate, methyl 3-morpholinopropionate,
methyl 3-(thiomorpholino)propionate,
methyl 2-methyl-3-(1-pyrrolidinyl)propionate,
ethyl 3-morpholinopropionate,
methoxycarbonylmethyl 3-piperidinopropionate,
2-hydroxyethyl 3-(1-pyrrolidinyl)propionate,
2-acetoxyethyl 3-morpholinopropionate,
2-oxotetrahydrofuran-3-yl 3-(1-pyrrolidinyl)propionate,
tetrahydrofurfuryl 3-morpholinopropionate,
glycidyl 3-piperidinopropionate,
2-methoxyethyl 3-morpholinopropionate,
2-(2-methoxyethoxy)ethyl 3-(1-pyrrolidinyl)propionate,
butyl 3-morpholinopropionate,
cyclohexyl 3-piperidinopropionate,
α-(1-pyrrolidinyl)methyl-γ-butyrolactone,
β-piperidino-γ-butyrolactone, β-morpholino-δ-valerolactone,
methyl 1-pyrrolidinylacetate, methyl piperidinoacetate,
methyl morpholinoacetate, methyl thiomorpholinoacetate,
ethyl 1-pyrrolidinylacetate, 2-methoxyethyl morpholinoacetate,
2-morpholinoethyl 2-methoxyacetate,
2-morpholinoethyl 2-(2-methoxyethoxy)acetate,
2-morpholinoethyl 2-[2-(2-methoxyethoxy)ethoxy]acetate,
2-morpholinoethyl hexanoate, 2-morpholinoethyl octanoate,
2-morpholinoethyl decanoate, 2-morpholinoethyl laurate,
2-morpholinoethyl myristate, 2-morpholinoethyl palmitate, and
2-morpholinoethyl stearate.

Also, one or more organic nitrogen-containing compounds having cyano group represented by the following general formulae (B)-3 to (B)-6 may be blended.

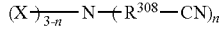
(B)-3

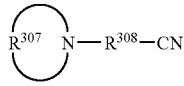
(B)-4

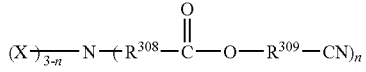
(B)-5

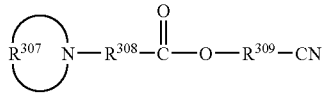
(B)-6

Herein, X, $R^{307}$ and n are as defined above, and $R^{308}$ and $R^{309}$ are each independently a straight or branched alkylene group of 1 to 4 carbon atoms.

Illustrative examples of the organic nitrogen-containing compounds having cyano represented by formulae (B)-3 to (B)-6 include
3-(diethylamino)propiononitrile,
N,N-bis(2-hydroxyethyl)-3-aminopropiononitrile,
N,N-bis(2-acetoxyethyl)-3-aminopropiononitrile,
N,N-bis(2-formyloxyethyl)-3-aminopropiononitrile,
N,N-bis(2-methoxyethyl)-3-aminopropiononitrile,
N,N-bis[2-(methoxymethoxy)ethyl]-3-aminopropiononitrile,
methyl N-(2-cyanoethyl)-N-(2-methoxyethyl)-3-aminopropionate,
methyl N-(2-cyanoethyl)-N-(2-hydroxyethyl)-3-aminopropionate,
methyl N-(2-acetoxyethyl)-N-(2-cyanoethyl)-3-aminopropionate,
N-(2-cyanoethyl)-N-ethyl-3-aminopropiononitrile,
N-(2-cyanoethyl)-N-(2-hydroxyethyl)-3-aminopropiononitrile,
N-(2-acetoxyethyl)-N-(2-cyanoethyl)-3-aminopropiononitrile,
N-(2-cyanoethyl)-N-(2-formyloxyethyl)-3-aminopropiononitrile,
N-(2-cyanoethyl)-N-(2-methoxyethyl)-3-aminopropiononitrile,
N-(2-cyanoethyl)-N-[2-(methoxymethoxy)ethyl]-3-aminopropiononitrile,
N-(2-cyanoethyl)-N-(3-hydroxy-1-propyl)-3-aminopropiononitrile,
N-(3-acetoxy-1-propyl)-N-(2-cyanoethyl)-3-aminopropiononitrile,
N-(2-cyanoethyl)-N-(3-formyloxy-1-propyl)-3-aminopropiononitrile,
N-(2-cyanoethyl)-N-tetrahydrofurfuryl-3-aminopropiononitrile,
N,N-bis(2-cyanoethyl)-3-aminopropiononitrile, diethylaminoacetonitrile,
N,N-bis(2-hydroxyethyl)aminoacetonitrile,
N,N-bis(2-acetoxyethyl)aminoacetonitrile,
N,N-bis(2-formyloxyethyl)aminoacetonitrile,
N,N-bis(2-methoxyethyl)aminoacetonitrile,
N,N-bis[2-(methoxymethoxy)ethyl]aminoacetonitrile,
methyl N-cyanomethyl-N-(2-methoxyethyl)-3-aminopropionate,
methyl N-cyanomethyl-N-(2-hydroxyethyl)-3-aminopropionate,
methyl N-(2-acetoxyethyl)-N-cyanomethyl-3-aminopropionate,
N-cyanomethyl-N-(2-hydroxyethyl)aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile,
N-cyanomethyl-N-(2-(methoxymethoxy)ethyl)aminoacetonitrile,
N-cyanomethyl-N-(3-hydroxy-1-propyl)aminoacetonitrile,
N-(3-acetoxy-1-propyl)-N-(cyanomethyl)aminoacetonitrile,
N-cyanomethyl-N-(3-formyloxy-1-propyl)aminoacetonitrile,
N,N-bis(cyanomethyl)aminoacetonitrile,
1-pyrrolidinepropiononitrile, 1-piperidinepropiononitrile,
4-morpholinepropiononitrile, 1-pyrrolidineacetonitrile,
1-piperidineacetonitrile, 4-morpholineacetonitrile,
cyanomethyl 3-diethylaminopropionate,
cyanomethyl N,N-bis(2-hydroxyethyl)-3-aminopropionate,
cyanomethyl N,N-bis(2-acetoxyethyl)-3-aminopropionate,
cyanomethyl N,N-bis(2-formyloxyethyl)-3-aminopropionate,
cyanomethyl N,N-bis(2-methoxyethyl)-3-aminopropionate,
cyanomethyl N,N-bis[2-(methoxymethoxy)ethyl]-3-aminopropionate,
2-cyanoethyl 3-diethylaminopropionate,
2-cyanoethyl N,N-bis(2-hydroxyethyl)-3-aminopropionate,
2-cyanoethyl N,N-bis(2-acetoxyethyl)-3-aminopropionate,
2-cyanoethyl N,N-bis(2-formyloxyethyl)-3-aminopropionate,
2-cyanoethyl N,N-bis(2-methoxyethyl)-3-aminopropionate, 2-cyanoethyl N,N-bis[2-(methoxymethoxy)ethyl]-3-amino-propionate,
cyanomethyl 1-pyrrolidinepropionate,
cyanomethyl 1-piperidinepropionate,
cyanomethyl 4-morpholinepropionate,
2-cyanoethyl 1-pyrrolidinepropionate,
2-cyanoethyl 1-piperidinepropionate, and
2-cyanoethyl 4-morpholinepropionate.

Also included are organic nitrogen-containing compounds having an imidazole structure and a polar functional group, represented by the general formula (B)-7.

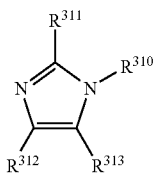 (B)-7

Herein, $R^{310}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{311}$, $R^{312}$ and $R^{313}$ are each independently a hydrogen atom, a straight, branched or cyclic alkyl group, aryl group or aralkyl group having 1 to 10 carbon atoms.

Also included are organic nitrogen-containing compounds having a benzimidazole structure and a polar functional group, represented by the general formula (B)-8.

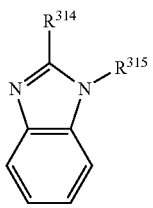 (B)-8

Herein, $R^{314}$ is a hydrogen atom, a straight, branched or cyclic alkyl group, aryl group or aralkyl group having 1 to 10 carbon atoms. $R^{315}$ is a polar functional group-bearing, straight, branched or cyclic alkyl group of 1 to 20 carbon atoms, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

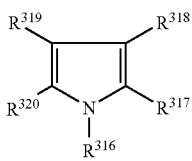 (B)-9

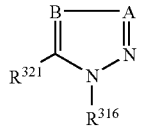 (B)-10

Herein, A is a nitrogen atom or $=C-R^{322}$, B is a nitrogen atom or $=C-R^{323}$, $R^{316}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{317}$, $R^{318}$, $R^{319}$ and $R^{320}$ are each independently a hydrogen atom, a straight, branched or cyclic alkyl group or aryl group having 1 to 10 carbon atoms, or a pair of $R^{317}$ and $R^{318}$ and a pair of $R^{319}$ and $R^{320}$, taken together, may form a benzene, naphthalene or pyridine ring; $R^{321}$ is a hydrogen atom, a straight, branched or cyclic alkyl group or aryl group having 1 to 10 carbon atoms; $R^{322}$ and $R^{323}$ each are a hydrogen atom, a straight, branched or cyclic alkyl group or aryl group having 1 to 10 carbon atoms, or a pair of $R^{321}$ and $R^{323}$, taken together, may form a benzene or naphthalene ring.

Also included are organic nitrogen-containing compounds of aromatic carboxylic ester structure having the general formulae (B)-11 to (B)-14.

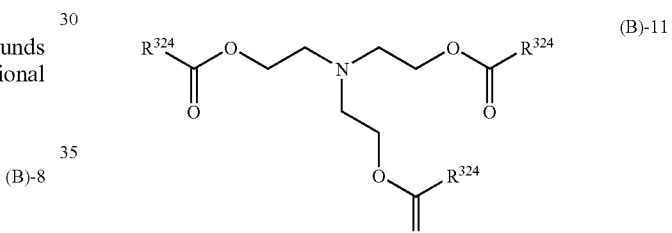 (B)-11

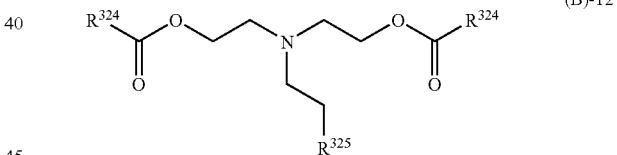 (B)-12

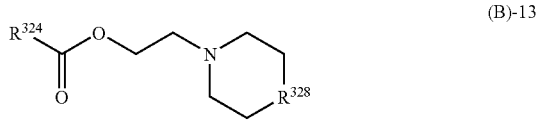 (B)-13

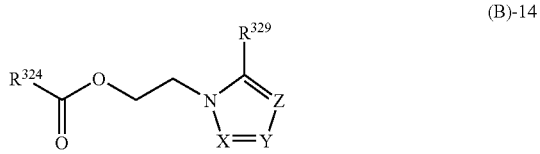 (B)-14

Herein $R^{324}$ is a $C_6$-$C_{20}$ aryl group or $C_4$-$C_{20}$ hetero-aromatic group, in which some or all of hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —O(CH$_2$CH$_2$O)$_n$— group wherein n is 0, 1, 2, 3 or 4. R$^{329}$ is hydrogen, methyl, ethyl or phenyl. X is a nitrogen atom or CR$^{330}$. Y is a nitrogen atom or CR$^{331}$. Z is a nitrogen atom or CR$^{332}$. R$^{330}$, R$^{331}$ and R$^{332}$ are each independently hydrogen, methyl or phenyl. Alternatively, a pair of R$^{330}$ and R$^{331}$ or a pair of R$^{331}$ and R$^{332}$ may bond together to form a C$_6$-C$_{20}$ aromatic ring or C$_2$-C$_{20}$ heteroaromatic ring.

Further included are organic nitrogen-containing compounds of 7-oxanorbornane-2-carboxylic ester structure having the general formula (B)-15.

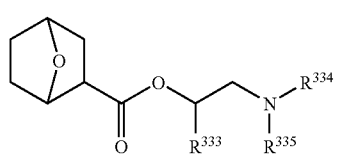
(B)-15

Herein R$^{333}$ is hydrogen or a straight, branched or cyclic C$_1$-C$_{10}$ alkyl group. R$^{334}$ and R$^{335}$ are each independently a C$_1$-C$_{20}$ alkyl group, C$_6$-C$_{20}$ aryl group or C$_7$-C$_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. R$^{334}$ and R$^{335}$, taken together, may form a heterocyclic or hetero-aromatic ring of 2 to 20 carbon atoms.

The organic nitrogen-containing compounds may be used alone or in admixture of two or more. The organic nitrogen-containing compound is preferably formulated in an amount of 0.001 to 2 parts, and especially 0.01 to 1 part by weight, per 100 parts by weight of the base resin. At least 0.001 phr of the nitrogen-containing compound achieves a desired addition effect whereas up to 2 phr minimizes a risk of lowering sensitivity.

The resist composition of the invention may include a surfactant which is commonly used for improving the coating characteristics. It may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M, Ltd., Surflon S-141, S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Fluorad FC-430 from Sumitomo 3M, Ltd., KH-20 and KH-30 from Asahi Glass Co., Ltd., and X-70-093 from Shin-Etsu Chemical Co., Ltd.

Also, if desired, other components including dissolution regulators, carboxylic acid compounds and acetylene alcohol derivatives may be added to the resist composition of the invention. Optional components may be added in conventional amounts so long as this does not compromise the objects of the invention.

Dissolution Regulator

The dissolution regulator which can be added to the resist composition is a compound having on the molecule at least two phenolic hydroxyl groups, in which an average of from 0 to 100 mol % of all the hydrogen atoms on the phenolic hydroxyl groups are replaced by acid labile groups or a compound having on the molecule at least one carboxyl group, in which an average of 50 to 100 mol % of all the hydrogen atoms on the carboxyl groups are replaced by acid labile groups, both the compounds having a weight average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

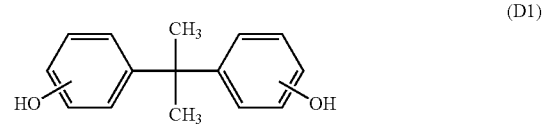
(D1)

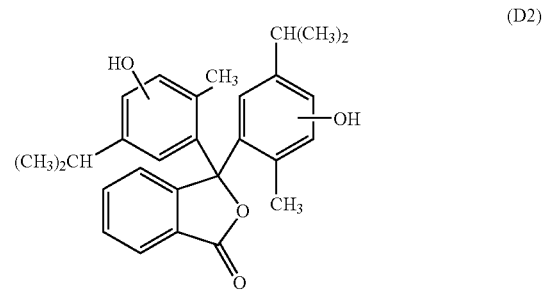
(D2)

(D3)

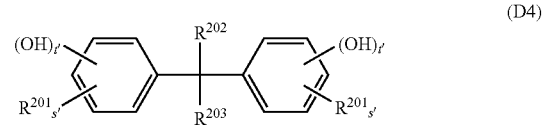
(D4)

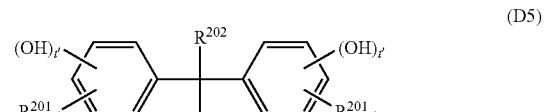
(D5)

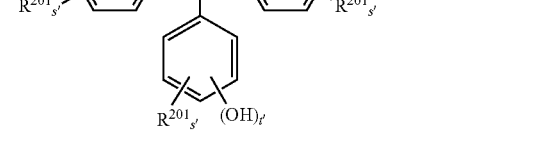

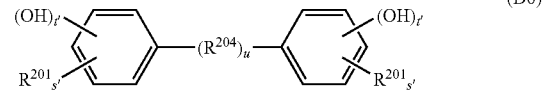
(D6)

-continued

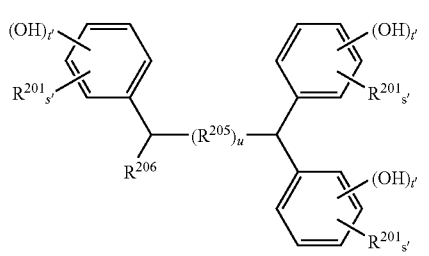
(D7)

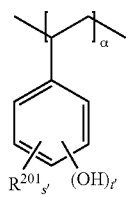
(D8)

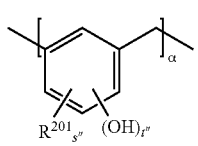
(D9)

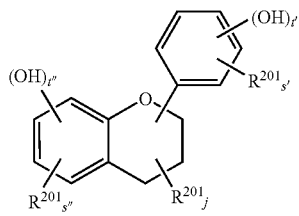
(D10)

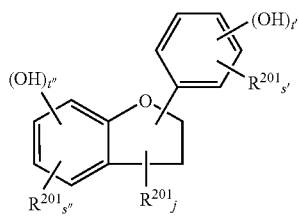
(D11)

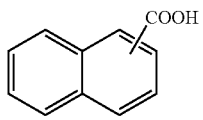
(D12)

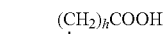
(D13)

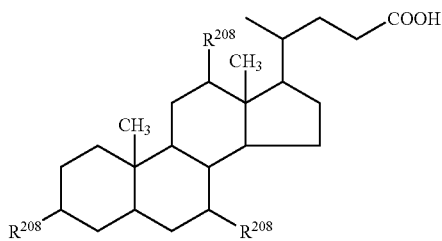
(D14)

In these formulas, $R^{201}$ and $R^{202}$ are each hydrogen or a straight or branched $C_1$-$C_8$ alkyl or alkenyl group, for example, hydrogen, methyl, ethyl, butyl, propyl, ethynyl and cyclohexyl.

$R^{203}$ is hydrogen, a straight or branched $C_1$-$C_8$ alkyl or alkenyl group, or —$(R^{207})_h$—COOH wherein $R^{207}$ is a straight or branched $C_1$-$C_{10}$ alkylene and h is 0 or 1, for example, those exemplified for $R^{201}$ and $R^{202}$ and —COOH and —CH$_2$COOH.

$R^{204}$ is —$(CH_2)_i$— wherein i=2 to 10, $C_6$-$C_{10}$ arylene, carbonyl, sulfonyl, an oxygen atom, or a sulfur atom, for example, ethylene, phenylene, carbonyl, sulfonyl, oxygen atom or sulfur atom.

$R^{205}$ is a $C_1$-$C_{10}$ alkylene, a $C_6$-$C_{10}$ arylene, carbonyl, sulfonyl, an oxygen atom, or a sulfur atom, for example, methylene and those exemplified for $R^{204}$.

$R^{206}$ is hydrogen, a straight or branched $C_1$-$C_8$ alkyl or alkenyl group, or a phenyl or naphthyl group having hydroxyl substituted thereon, for example, hydrogen, methyl, ethyl, butyl, propyl, ethynyl, cyclohexyl, hydroxyl-substituted phenyl, and hydroxyl-substituted naphthyl.

$R^{208}$ is hydrogen or hydroxyl.

The letter j is an integer from 0 to 5; u and h are each 0 or 1; s, t, s', t', s", and t" are each numbers which satisfy s+t=8, s'+t'=5, and s"+t"=4, and are such that each phenyl skeleton has at least one hydroxyl group; and α is a number such that the compounds of formula (D8) or (D9) have a weight average molecular weight of from 100 to 1,000.

Exemplary acid labile groups on the dissolution regulator include a variety of such groups, typically groups of the general formulae (L1) to (L4), tertiary alkyl groups of 4 to 20 carbon atoms, trialkylsilyl groups in which each of the alkyls has 1 to 6 carbon atoms, and oxoalkyl groups of 4 to 20 carbon atoms. Examples of the respective groups are as previously described.

The dissolution regulator may be formulated in an amount of 0 to 50 parts, preferably 0 to 40 parts, and more preferably 0 to 30 parts by weight, per 100 parts by weight of the base resin, and may be used singly or as a mixture of two or more thereof. Up to 50 phr of the dissolution regulator minimizes a risk of slimming the patterned film and reducing the resolution.

The dissolution regulator can be synthesized by introducing acid labile groups into a compound having phenolic hydroxyl or carboxyl groups in accordance with an organic chemical formulation.

In the resist composition, a carboxylic acid compound may be blended. Exemplary, non-limiting carboxylic acid compounds include one or more compounds selected from Groups I and II below. Including this compound improves the PED stability of the resist and ameliorates edge roughness on nitride film substrates.

Group I:

Compounds in which some or all of the hydrogen atoms on the phenolic hydroxyl groups of the compounds of general formulas (A1) to (A10) below are replaced by —$R^{401}$—COOH (wherein $R^{401}$ is a straight or branched alkylene of 1 to 10 carbon atoms), and in which the molar ratio C/(C+D) of phenolic hydroxyl groups (C) to ≡C—COOH groups (D) in the molecule is from 0.1 to 1.0.

(A1)
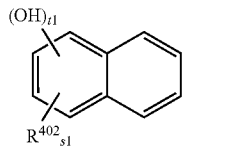

(A2)
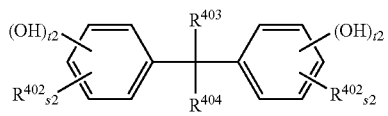

(A3)
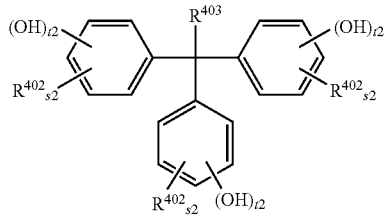

(A4)
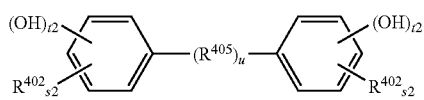

(A5)
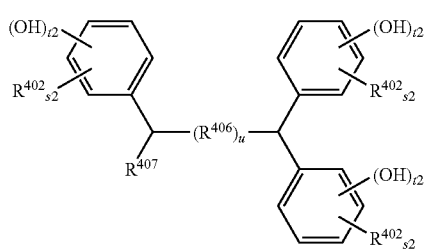

(A6)
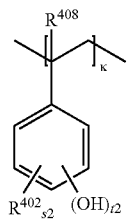

(A7)
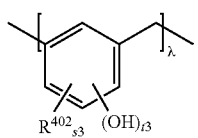

(A8)
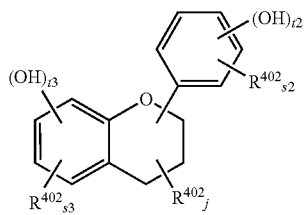

(A9)
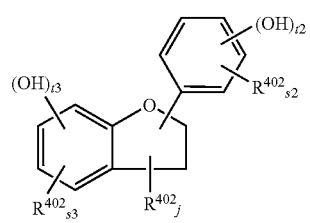

(A10)
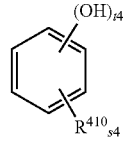

In these formulas, $R^{402}$ and $R^{403}$ are each hydrogen or a straight or branched $C_1$-$C_8$ alkyl or alkenyl; $R^{404}$ is hydrogen, a straight or branched $C_1$-$C_8$ alkyl or alkenyl, or a —$(R^{409})_h$—COOR' group (R' being hydrogen or —$R^{409}$—COOH); $R^{405}$ is —$(CH_2)_i$— (wherein i is 2 to 10), a $C_6$-$C_{10}$ arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a hydroxyl-substituted phenyl or naphthyl; $R^{408}$ is hydrogen or methyl; $R^{409}$ is a straight or branched $C_1$-$C_{10}$ alkylene; $R^{410}$ is hydrogen, a straight or branched $C_1$-$C_8$ alkyl or alkenyl, or a —$R^{411}$—COOH group; $R^{411}$ is a straight or branched $C_1$-$C_{10}$ alkylene; the letter j is an integer from 0 to 3; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; u is a number from 1 to 4, h is a number from 1 to 4; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below.

(A11)
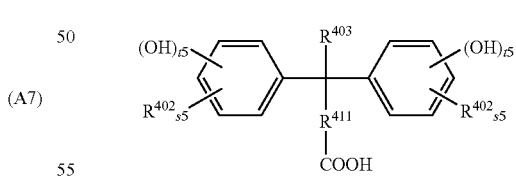

(A12)
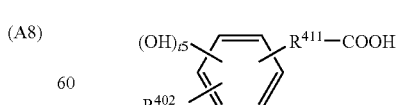

(A13)
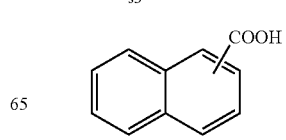

In these formulas, $R^{402}$, $R^{403}$, and $R^{411}$ are as defined above; $R^{412}$ is hydrogen or hydroxyl; s5 and t5 are numbers which satisfy $s5 \geqq 0$, $t5 \geqq 0$, and $s5+t5=5$; and h is a number from 1 to 4.

Illustrative, non-limiting examples of the compound having a carboxyl group include compounds of the general formulas AI-1 to AI-14 and AII-1 to AII-10 below.

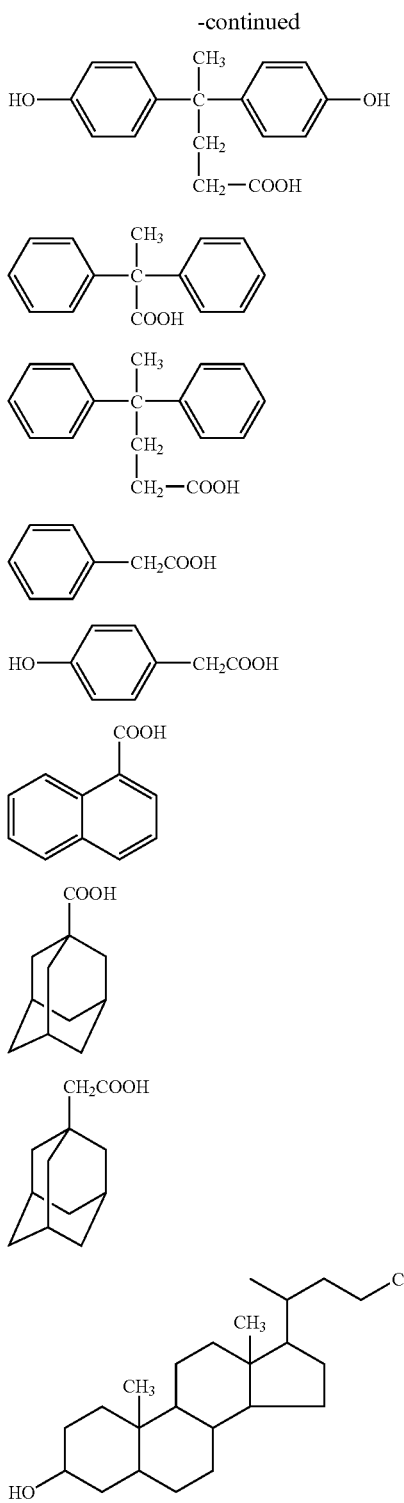

In the above formulas, R" is hydrogen or a —CH₂COOH group such that the —CH₂COOH group accounts for 10 to 100 mol % of R" in each compound, κ and λ are as defined above.

The compound having a ≡C—COOH group in the molecule is added in an amount ranging from 0 to 5 parts, preferably 0.1 to 5 parts, more preferably 0.1 to 3 parts, even more preferably 0.1 to 2 parts by weight, per 100 parts by weight of the base resin. Up to 5 phr of the compound minimizes a risk of the resist composition reducing its resolution.

The resist composition of the invention may additionally include an acetylene alcohol derivative. Preferred acetylene alcohol derivatives are those having the general formula (S1) or (S2) below.

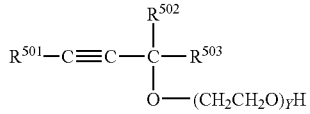

(S1)

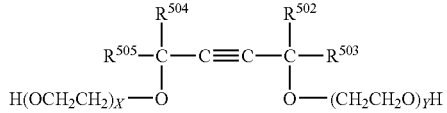

(S2)

In the formulas, $R^{501}$, $R^{502}$, $R^{503}$, $R^{504}$, and $R^{505}$ are each hydrogen or a straight, branched or cyclic $C_1$-$C_8$ alkyl; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K.

The acetylene alcohol derivative is preferably added in an amount of 0.01 to 2% by weight, and more preferably 0.02 to 1% by weight, based on the weight of the resist composition. At least 0.01 wt % is fully effective in improving the coating operation and shelf stability. Up to 2 wt % minimizes a risk of the resist composition reducing its resolution.

The resist composition of the invention may be used in a pattern forming process adopting the immersion lithography. In the immersion lithography, a protective layer is formed on a photoresist layer, and a liquid is held between the protective layer and a projection lens. That is, the protective layer intervenes between the photoresist layer and the liquid. The protective layer is preferably an alkali-soluble protective layer based on a polymer having α-trifluoromethylalcohol groups as the alkali-soluble group. The polymers having α-trifluoromethylalcohol groups may be obtained through polymerization of monomers similar to the monomers from which recurring units (b-1) in formula (1) are derived. Also, monomers similar to the monomers from which recurring units (b-2) in formula (1) are derived may be copolymerized for preventing water penetration and/or improving a receding contact angle. Moreover, monomers having alkali-soluble groups in the form of α-trifluoromethylalcohol groups as shown below may be polymerized.

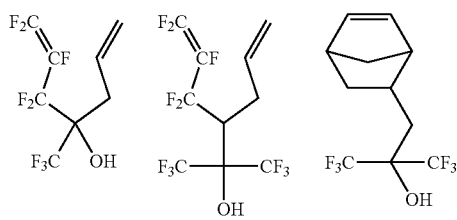

-continued
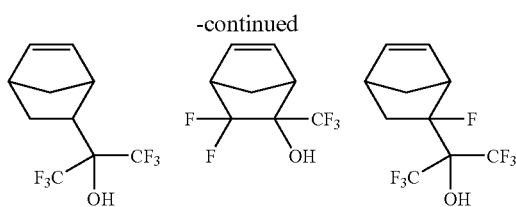
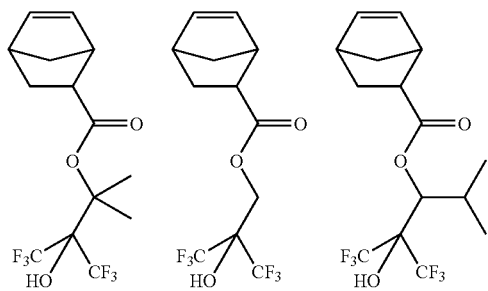
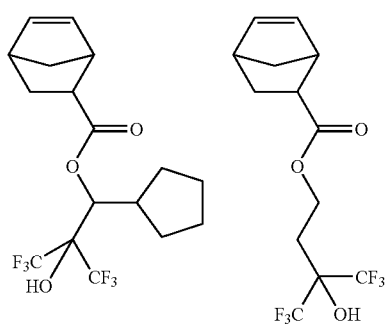
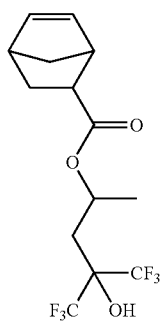
Also, monomers having a water repellent group may be polymerized, examples of which are shown below.
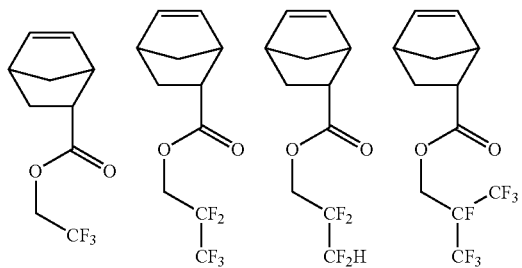
-continued
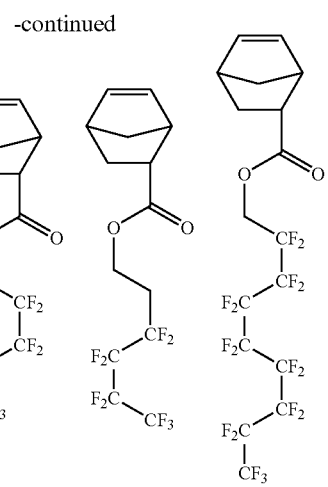
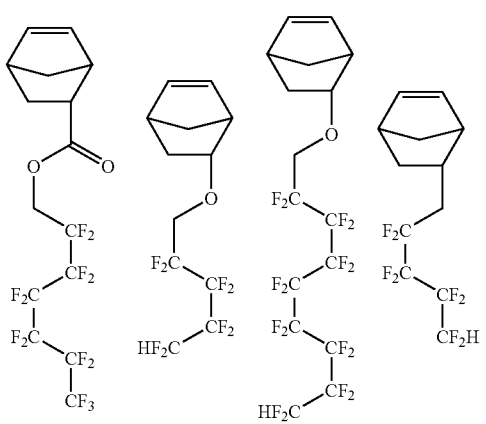

-continued
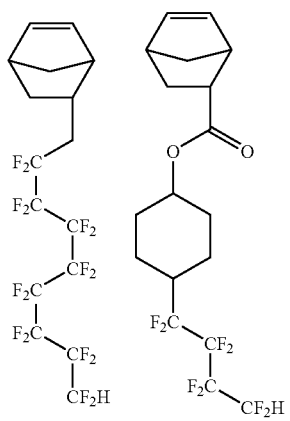
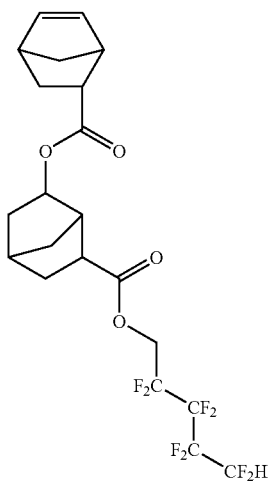
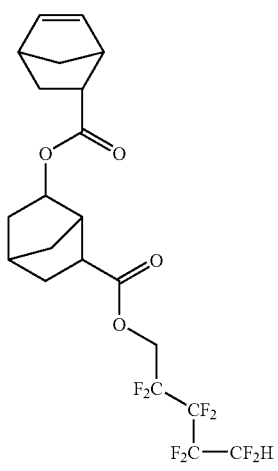
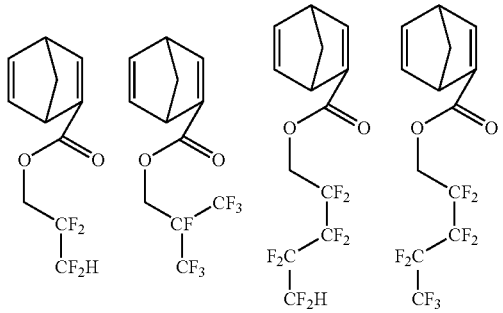
-continued
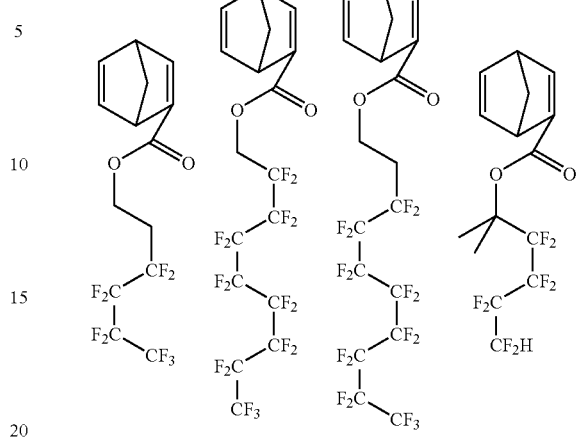
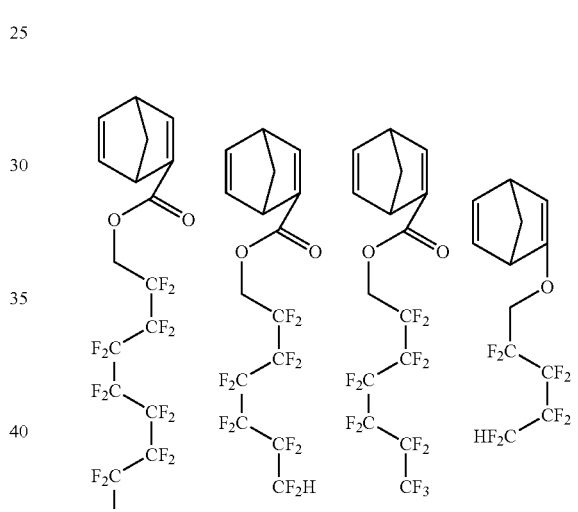
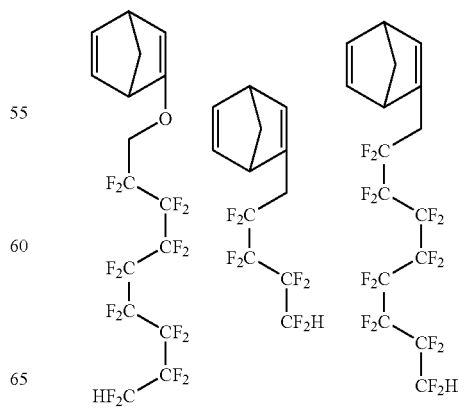

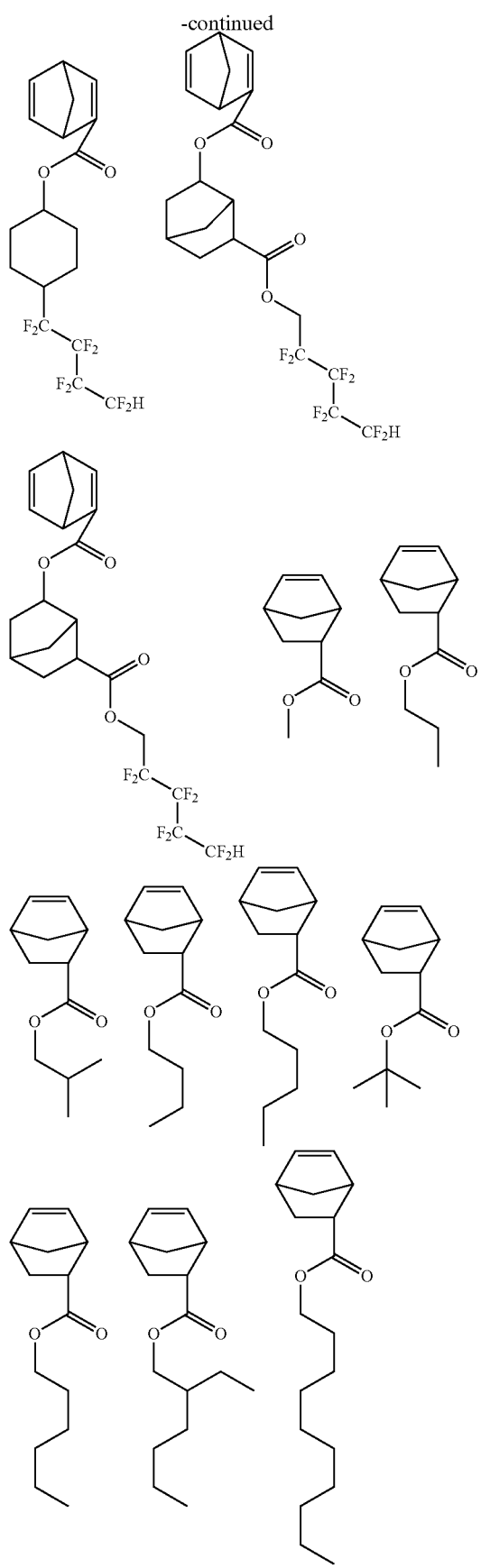
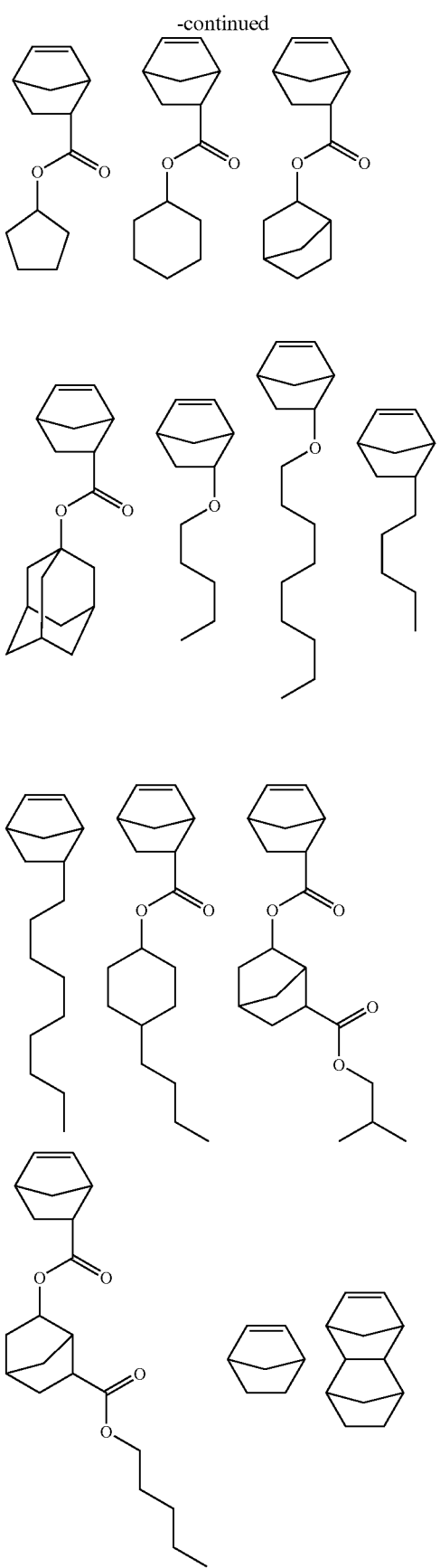

101
-continued
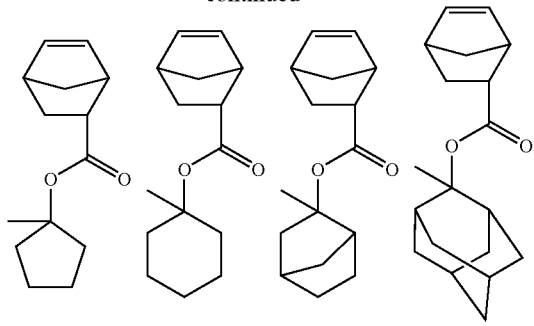
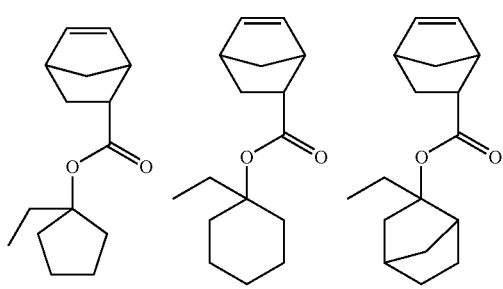
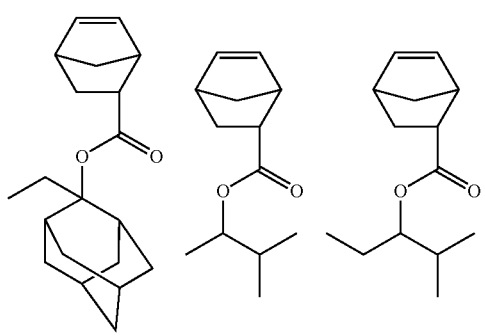
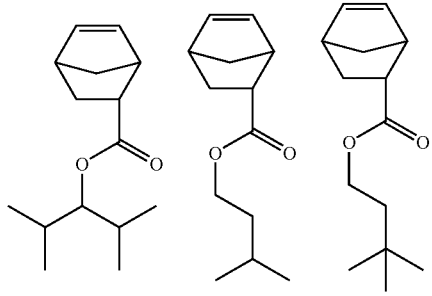
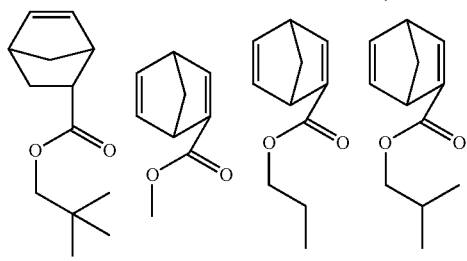
102
-continued
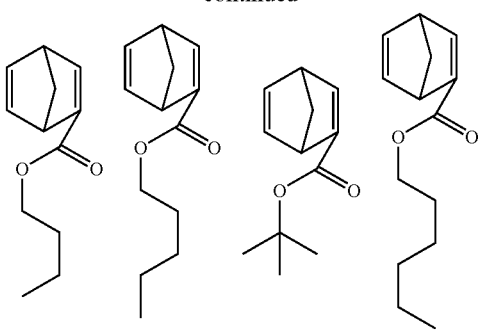
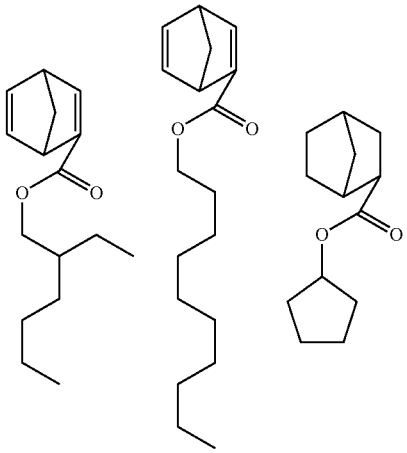
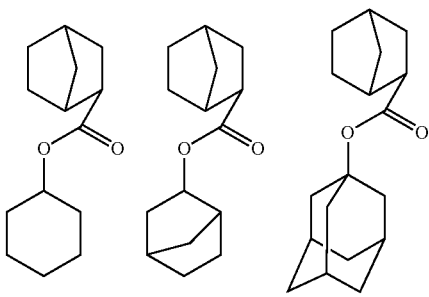
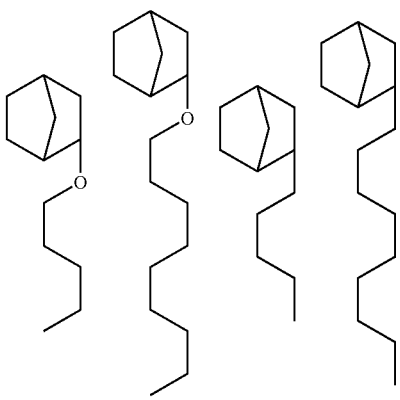

-continued

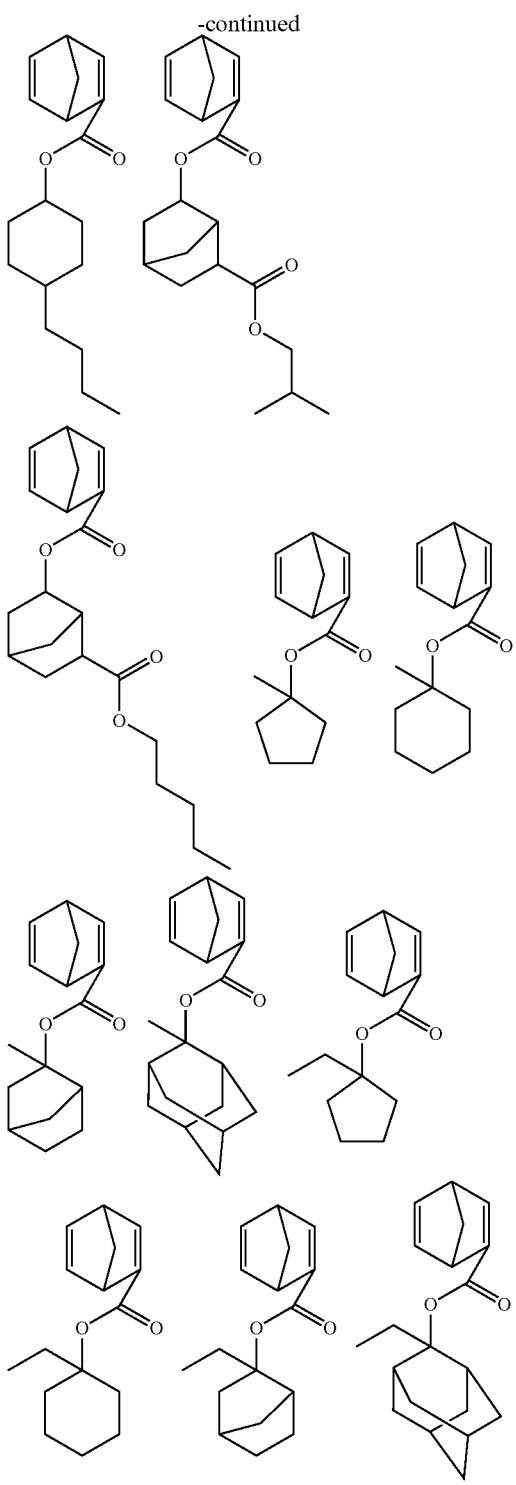

Provided that A stands for a proportion of a monomer having a α-trifluoromethylalcohol group, B stands for a proportion of a monomer similar to the monomers from which recurring units (b-2) are derived, C stands for a proportion of a monomer having a water repellent group, and A+B+C=100 mol %, these monomers are preferably (co)polymerized in such proportions that A is in the range of 10 to 100 mol %, more specifically 30 to 100 mol %, B is in the range of 0 to 90 mol %, more specifically 0 to 70 mol %, C is in the range of 0 to 90 mol %, more specifically 0 to 70 mol %. The polymer thus obtained is preferred as a protective coating material.

The protective coating should preferably have an alkali dissolution rate of at least 50 nm/sec, and more preferably at least 100 nm/sec, as measured in an aqueous solution of 2.38 wt % tetramethylammonium hydroxide. The polymer for the protective coating should preferably have a weight average molecular weight of 1,000 to 100,000.

The solvent used for protective coating is not particularly limited although those solvents in which resist layers can be dissolved should be avoided. It is recommended to avoid the use of conventional resist solvents, for example, ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Suitable solvents in which resist layers are not dissolvable include nonpolar solvents, for example, higher alcohols of at least 4 carbon atoms, toluene, xylene, anisole, hexane, cyclohexane and ethers. Of these, higher alcohols of at least 4 carbon atoms are most desirable. Examples of suitable solvents include, but are not limited to, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol as well as diisopropyl ether, diisobutyl ether, diisopentyl ether, di-n-pentyl ether, methylcyclopentyl ether, and methylcyclohexyl ether. These solvents may be used alone or in admixture.

Fluorinated solvents are also preferred because resist layers are not dissolvable therein. Examples include, but are not limited to, 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trlfluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3- tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro(2,5-dimethyl-3,6-dioxane anionic) acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxa-octadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, 1,1,1-trifluoro-5,5-dimethyl-2,4-hexanedione, 1,1,1,3,3,3-hexafluoro-2-propanol, 1,1,1,3,3,3-hexafluoro-2-methyl-2-propanol, 2,2,3,4,4,4-hexafluoro-1-butanol, 2-trifluoromethyl-2-propanol, 2,2,3,3-tetrafluoro-1-propanol, 3,3,3-trifluoro-1-propanol, and 4,4,4-trifluoro-1-butanol, which may be used alone or in admixture.

Process

The invention also provides a pattern forming process comprising the steps of applying the aforementioned resist composition onto a substrate to form a coating, heat treating the coating, exposing it to high-energy radiation, and developing the exposed coating with a developer. The preferred high-energy radiation has a wavelength in the range of 180 to 250 nm.

The exposing step may be performed by immersion lithography involving exposing the coating to high-energy radiation through a liquid. In an exemplary embodiment of the immersion lithography, high-energy radiation having a wavelength of 180 to 250 nm is used, a liquid is introduced between the substrate having a resist coating and a protective coating formed thereon and a projection lens, and the substrate is exposed to the high-energy radiation through the liquid. An exemplary liquid is water.

In forming a resist pattern from the resist composition of the invention, any well-known lithography may be used. For example, the resist composition is applied onto a substrate (e.g., Si, SiO$_2$, SiN, SiON, TiN, WSi, BPSG, SOG, low-dielectric-constant film, etc.) for integrated circuit microfabrication by a suitable coating technique such as spin coating. The coating is prebaked on a hot plate at 50 to 150° C. for about 1 to 10 minutes, preferably at 60 to 140° C. for 1 to 5 minutes. The resulting resist film is generally 10 to 200 nm thick.

By forming an antireflective coating (ARC) between the substrate for integrated circuit microfabrication and the photoresist, substrate reflection may be suppressed. Suitable antireflective coatings include inorganic coatings of amorphous carbon and SiON and organic coatings formed by spin coating, with the latter being widely employed.

As the immersion lithography uses a projection lens having a NA in excess of 1 and allows the incident angle of light to the resist and ARC to increase, the prior-art single-layer ARC is difficult to control reflection. In this regard, bilayer ARC has been proposed. Also to overcome a lowering of etching margin by a thickness reduction of resist film, a trilayer process has been proposed involving forming a silicon-containing film as an underlay beneath the resist, and forming an undercoat layer with a high carbon density on a substrate for integrated circuit microfabrication. Films each consisting of one or more of many various layers may be formed beneath the photoresist.

After a photoresist layer is formed on a wafer, a water-insoluble, alkali-soluble resist protective coating material is applied to the photoresist layer by suitable techniques, typically spin coating. The coating thickness is preferably in a range of 10 to 500 nm. The lithography used herein may be either dry lithography wherein a gas such as air or nitrogen is present between the resist protective coating and the projection lens, or immersion lithography wherein a liquid fills in between the resist protective coating and the projection lens. The immersion lithography favors water. In the immersion lithography, whether or not the wafer edge and rear side are cleaned and the cleaning technique are important in preventing flowing of water to the wafer rear side and leaching from the substrate. After spin coating, the resist protective coating is baked at a temperature of 40 to 130° C. for 10 to 300 seconds for evaporating off the solvent. In the case of resist layer formation and dry lithography, edge cleaning is performed during the spin coating. In the case of immersion lithography, contact of water with the substrate surface which is fully hydrophilic is undesirable because water may be left on the substrate surface at the edge. It is then recommended to omit edge cleaning during the spin coating of the resist protective coating.

Once the resist protective coating is formed, exposure is carried out by immersion lithography. This is followed by post-exposure bake (PEB) and development in an alkaline developer for 10 to 300 seconds. An aqueous solution of 2.38 wt % tetramethylammonium hydroxide (TMAH), which is commonly used as the alkaline developer, is used herein. Sometimes water is left on the resist protective coating prior to PEB. If PEB is performed in the presence of residual water, water can penetrate through the protective coating to suck up the acid in the resist, impeding pattern formation. To fully remove the water on the protective coating prior to PEB, the water on the protective coating should be dried or recovered by suitable means, for example, spin drying prior to PEB, purging of the protective coating surface with dry air or nitrogen, or post-soaking after the exposure.

The type of photoresist material is not particularly limited. The photoresist may be either positive or negative working and also either a monolayer resist of conventional hydrocarbon or a bilayer resist containing silicon atoms and the like. For KrF lithography resist materials, the preferred base resins are polyhydroxystyrene or polyhydroxystyrene-(meth)acrylate copolymers in which some or all hydrogen atoms of hydroxyl or carboxyl groups are replaced by acid labile groups.

For ArF lithography resist materials, the base resin must have a structure free of aromatics other than naphthalene. Illustrative polymers include polyacrylic acid and derivatives thereof, norbornene derivative-maleic anhydride alternating copolymers and ternary or quaternary copolymers thereof with polyacrylic acid or derivatives thereof, tetracyclododecene derivative-maleic anhydride alternating copolymers and ternary or quaternary copolymers thereof with polyacrylic acid or derivatives thereof, norbornene derivative-maleimide alternating copolymers and ternary or quaternary copolymers thereof with polyacrylic acid or derivatives thereof, tetracyclododecene derivative-maleimide alternating copolymers and ternary or quaternary copolymers thereof with polyacrylic acid or derivatives thereof, and polynorbornene and metathesis ring-opening polymers, which may be used alone or in a combination of any.

As discussed earlier, the photoresist layer formed from the resist composition of the invention substantially prevents formation of a mixing layer with the protective coating and remains fully hydrophilic after development, eliminating the occurrence of defects like residues known as blobs.

Resist materials for use with mask blanks often include novolac resins and hydroxystyrene based resins. Those resins in which hydroxyl groups are substituted by acid labile groups are used for positive resists while these resins in combination with crosslinking agents are used for negative resists. Base polymers which can be used herein include copolymers of hydroxystyrene with one or more of (meth)acrylic derivatives, styrenes, vinyl naphthalenes, vinyl anthracenes, vinyl pyrenes, hydroxyvinyl naphthalenes, hydroxyvinyl anthracenes, indenes, hydroxyindenes, acenaphthylenes, and norbornadienes.

Where the resist coating is for use with mask blanks, the photoresist composition of the invention is coated on a mask blank substrate of $SiO_2$, Cr, CrO, CrN, MoSi or the like. By further forming a SOG film and an organic undercoat film between the photoresist and the blank substrate, there is provided a three-layer structure which is also acceptable herein. Once the resist coating is formed, the structure is exposed using an electron beam writing system. The exposure is followed by post-exposure baking (PEB) and development in an alkaline developer for 10 to 300 seconds.

EXAMPLE

Examples of the invention are given below by way of illustration and not by way of limitation. The abbreviations used herein are GPC for gel permeation chromatography, NMR for nuclear magnetic resonance, Mw for weight average molecular weight, Mn for number average molecular weight, and Mw/Mn for molecular weight dispersity. Mw and Mn are determined by GPC versus polystyrene standards. All parts are by weight (pbw).

Preparation of Polymers

Additive polymers to be added to resist compositions were prepared by combining monomers, effecting copolymerization reaction in isopropyl alcohol as a solvent, pouring the polymerization solution into hexane for crystallization, washing the polymer with hexane, isolating and drying. The resulting polymers were analyzed for composition by $^1$H-NMR and for Mw and Mw/Mn by GPC.

Polymer 1

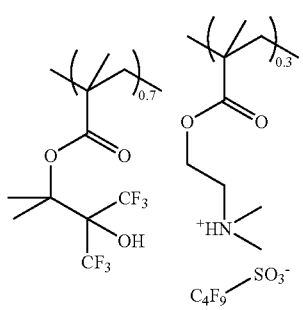

Mw = 8,600 Mw/Mn = 1.81

Polymer 2

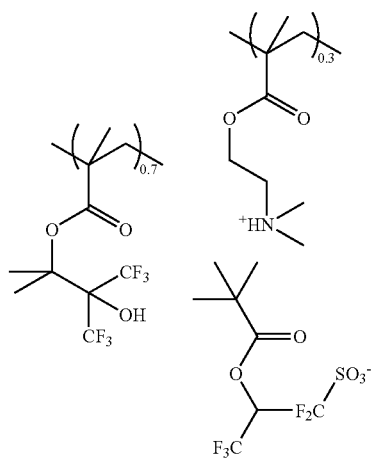

Mw = 8,500 Mw/Mn = 1.82

Polymer 3

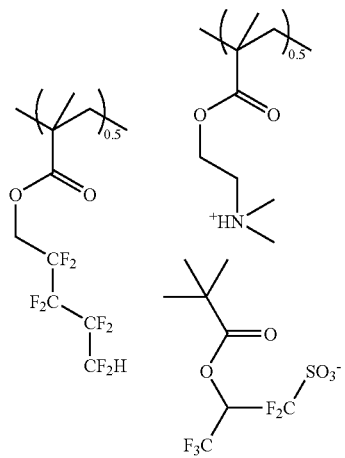

Mw = 8,200 Mw/Mn = 1.68

Polymer 4

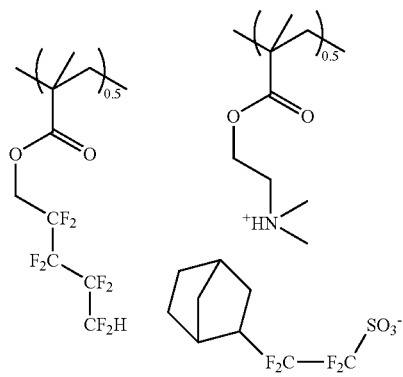

Mw = 8,200 Mw/Mn = 1.68

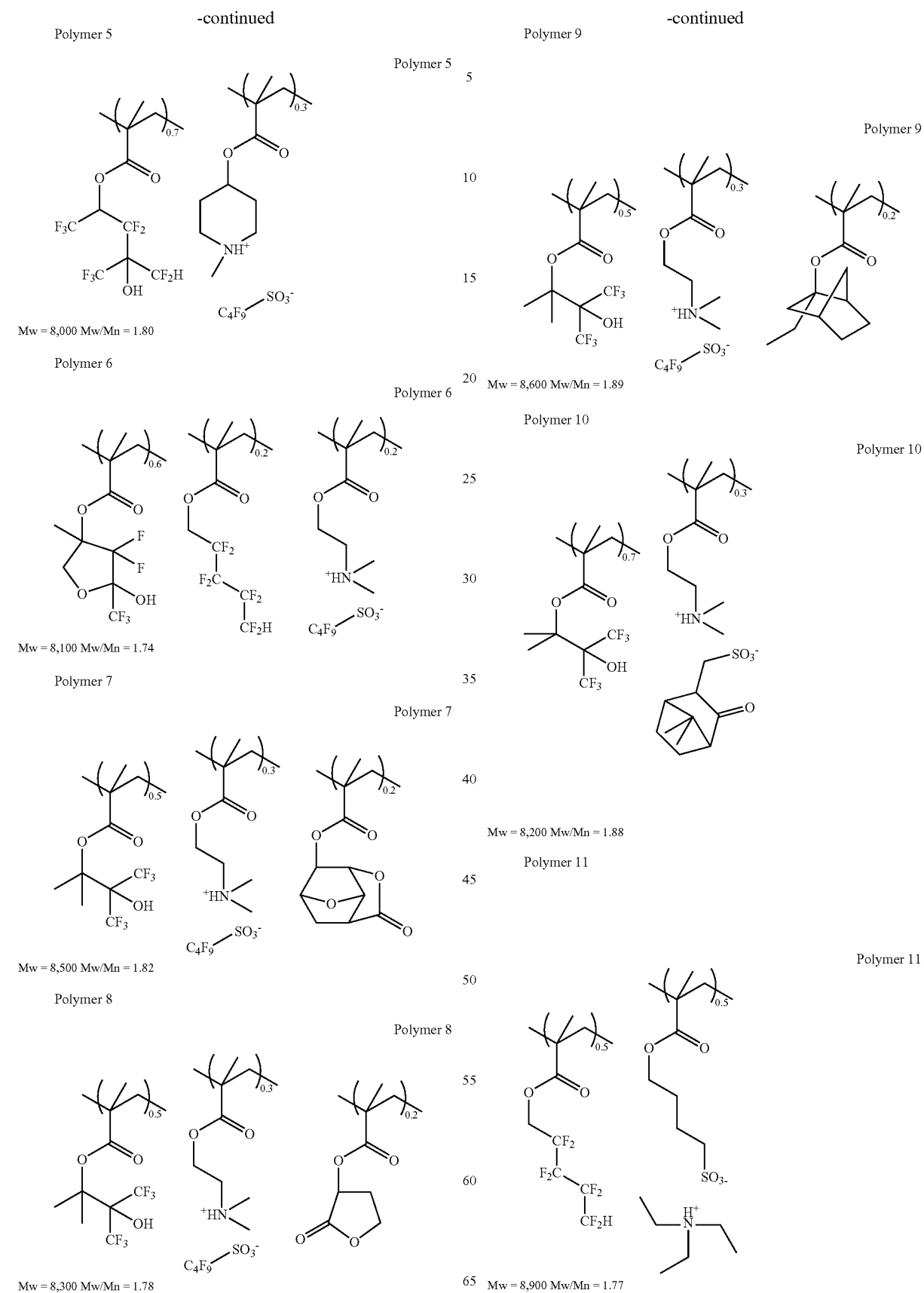

-continued

Polymer 12

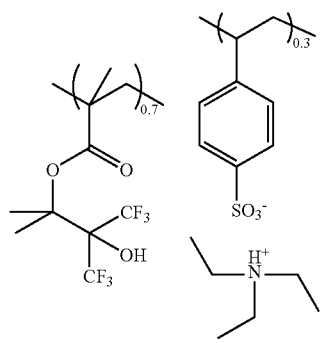

Polymer 12

Mw = 9,300 Mw/Mn = 1.97

-continued

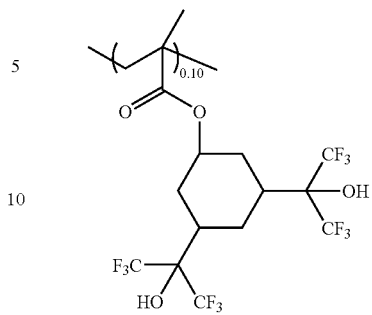

PAG-1: triphenylsulfonium nonafluorobutane-sulfonate

Basic compound (Quencher 1): 2-cyclohexylcarboxyethyl-morpholine

Organic solvent 1: 1-methoxyisopropyl acetate

Organic solvent 2: cyclohexanone

[Preparation of Protective Coating Material]

Protective topcoat compositions, designated TC1 to TC3, were prepared by combining and dissolving a base resin (TC Polymer 1, 2 or 3) in an organic solvent in accordance with the recipe shown below, and filtering through a Teflon® filter having a pore size of 0.2 μm.

[Preparation of Resist Compositions]

A resist composition, designated Resist 1, was prepared by combining and dissolving a base resin, a photoacid generator, and a basic compound in an organic solvent in accordance with the recipe shown below, and filtering through a Teflon® filter having a pore size of 0.2 μm.

Resist 1

Mixing composition:

| Base Resin 1 | 100 pbw |
|---|---|
| PAG-1 | 5 pbw |
| Basic compound | 1 pbw |
| Organic solvent 1 | 1330 pbw |
| Organic solvent 2 | 570 pbw |

Base Resin 1 has the following structural formula.

Base Resin 1

Mw: 7,600, Mw/Mn: 1.76

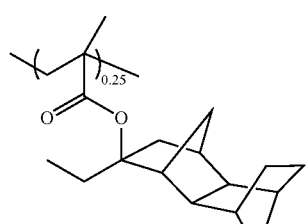
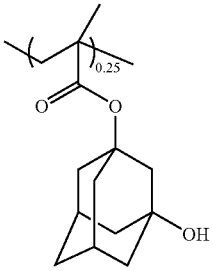
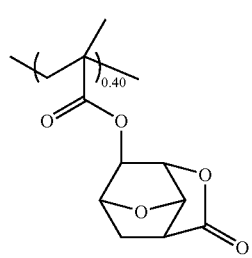

| | TC1 | |
|---|---|---|
| TC Polymer 1 | | 100 pbw |
| Organic solvent 3 | | 2600 pbw |
| Organic solvent 4 | | 260 pbw |
| | TC2 | |
| TC Polymer 2 | | 100 pbw |
| Organic solvent 3 | | 2600 pbw |
| Organic solvent 4 | | 260 pbw |
| | TC3 | |
| TC Polymer 3 | | 100 pbw |
| Organic solvent 3 | | 2600 pbw |
| Organic solvent 4 | | 260 pbw |

TC Polymers 1 to 3 have the structural formula below.

TC Polymer 1

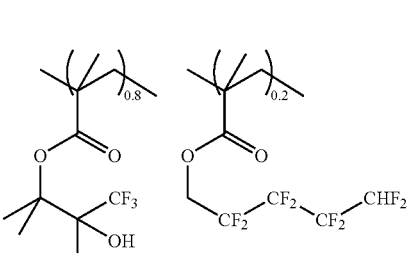

Mw: 7,600
Mw/Mn: 1.62

-continued

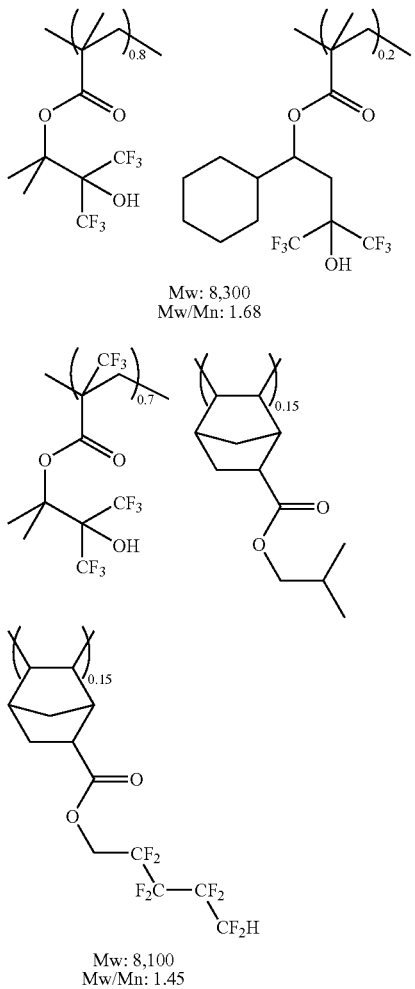

TC Polymer 2

TC Polymer 3

Organic solvent 3: isoamyl ether
Organic solvent 4: 2-methyl-1-butanol

Examples 1 to 14 and Comparative Examples 1 to 4

Resist coating solutions #1 to #13 were prepared by compounding the resist composition as a matrix with one of the above-prepared polymers (Polymers 1 to 12) in a suitable proportion. Table 1 shows a combination of the additive polymer and the matrix resist composition and a proportion. It is noted that the proportion of the additive polymer is expressed in parts by weight per 100 parts by weight of the base resin in the matrix resist composition.

Each resist solution was applied onto an antireflective coating ARC-29A (Nissan Chemical Co., Ltd.) of 87 nm thick formed on a silicon substrate and baked at 110° C. for 60 seconds, forming a resist film of 150 nm thick. A protective topcoat solution was coated thereon and baked at 100° C. for 60 seconds, forming a protective coating of 50 nm thick (TC1, TC2 or TC3). The structure was exposed by means of an ArF scanner model S307E (Nikon Corp., NA 0.85., σ 0.93, 4/5 annular illumination, 6% halftone phase shift mask), post-exposure baked (PEB) at 110° C. for 60 seconds, and developed with a 2.38 wt % TMAH aqueous solution for 60 seconds, forming a 75-nm line-and-space pattern over the wafer surface. A cross section of the wafer was observed for comparing the pattern profile.

In Comparative Examples 1 to 3, the polymeric additive was not added. In Comparative Example 4, the polymeric additive was not added and the protective coating was not applied.

A contact angle with water of the photoresist film after development was measured after dispensing 5 μL of deionized water on the photoresist film. For measurement, an inclination contact angle meter Drop Master 500 by Kyowa Interface Science Co., Ltd. was used.

TABLE 1

|  |  | Resist solution | Matrix resist composition | Protective topcoat material | Additive polymer (amount) | Pattern profile after development | Contact angle after development (°) |
|---|---|---|---|---|---|---|---|
| Example | 1 | Resist solution #1 | Resist 1 | TC1 | Polymer 1 (5 pbw) | Rectangular | 53 |
|  | 2 | Resist solution #2 | Resist 1 | TC1 | Polymer 2 (5 pbw) | Rectangular | 55 |
|  | 3 | Resist solution #3 | Resist 1 | TC1 | Polymer 3 (5 pbw) | Rectangular | 54 |
|  | 4 | Resist solution #4 | Resist 1 | TC1 | Polymer 4 (5 pbw) | Rectangular | 53 |
|  | 5 | Resist solution #5 | Resist 1 | TC1 | Polymer 5 (5 pbw) | Rectangular | 56 |
|  | 6 | Resist solution #6 | Resist 1 | TC1 | Polymer 6 (5 pbw) | Rectangular | 57 |
|  | 7 | Resist solution #7 | Resist 1 | TC1 | Polymer 7 (5 pbw) | Rectangular | 56 |
|  | 8 | Resist solution #8 | Resist 1 | TC1 | Polymer 8 (5 pbw) | Rectangular | 57 |
|  | 9 | Resist solution #9 | Resist 1 | TC1 | Polymer 9 (5 pbw) | Rectangular | 56 |
|  | 10 | Resist solution #10 | Resist 1 | TC1 | Polymer 10 (2 pbw) Polymer 1 (3 pbw) | Rectangular | 53 |
|  | 11 | Resist solution #11 | Resist 1 | TC1 | Polymer 11 (2 pbw) Polymer 1 (3 pbw) | Rectangular | 52 |
|  | 12 | Resist solution #12 | Resist 1 | TC1 | Polymer 12 (2 pbw) Polymer 1 (3 pbw) | Rectangular | 51 |
|  | 13 | Resist solution #1 | Resist 1 | TC2 | Polymer 1 (5 pbw) | Rectangular | 51 |
|  | 14 | Resist solution #1 | Resist 1 | TC3 | Polymer 1 (5 pbw) | Rectangular | 53 |

TABLE 1-continued

| | | Resist solution | Matrix resist composition | Protective topcoat material | Additive polymer (amount) | Pattern profile after development | Contact angle after development (°) |
|---|---|---|---|---|---|---|---|
| Comparative Example | 1 | Resist solution #13 | Resist 1 | TC1 | — | Rounded top | 66 |
| | 2 | Resist solution #13 | Resist 1 | TC2 | — | Rounded top | 62 |
| | 3 | Resist solution #13 | Resist 1 | TC3 | — | Rounded top | 64 |
| | 4 | — | Resist 1 | — | — | Rectangular | 61 |

In a further run, the resist solutions of Example 1 and Comparative Example 1 were precision filtered through a high-density polyethylene filter with a pore size of 0.02 μm. Protective topcoat composition TC1 was similarly precision filtered. The resist solution was applied onto an antireflective coating ARC-29A (Nissan Chemical Co., Ltd.) of 87 nm thick formed on a 8-inch silicon substrate and baked at 110° C. for 60 seconds, forming a resist film of 150 nm thick. The protective topcoat solution TC1 was coated thereon and baked at 100° C. for 60 seconds. Using an ArF scanner model S307E (Nikon Corp., NA 0.85, σ 0.93, Cr mask), the entire surface of the wafer was subjected to checkered-flag exposure including alternate exposure of open-frame exposed and unexposed portions having an area of 20 mm square. This was followed by post-exposure baking (PEB) at 110° C. for 60 seconds and development with a 2.38 wt % TMAH aqueous solution for 30 seconds.

Using a flaw detector Win-Win 50-1200 (Tokyo Seimitsu Co., Ltd.), the number of defects in the unexposed portion of the checkered-flag was counted at the pixel size of 0.125 μm. The results are shown in Table 2.

TABLE 2

| | Resist solution | Number of defects |
|---|---|---|
| Example 1 | Resist solution #1 | 5 |
| Comparative Example 1 | Resist solution #13 | >8,000 |

As is evident from Table 2, the resist composition having the polymeric additive incorporated therein is successful in dramatically reducing the number of defects after development when a protective coating is applied thereon.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

For example, although the resist composition applied to the immersion lithography has been described, it is also applicable to conventional lithography.

Japanese Patent Application No. 2006-288456 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising
   a polymer which increases its alkali solubility under the action of an acid as a base resin, and
   a copolymer comprising recurring units containing a sulfonic acid amine salt and recurring units containing at least one fluorine atom as an additive.

2. The resist composition of claim 1, wherein said copolymer has the general formula (1):

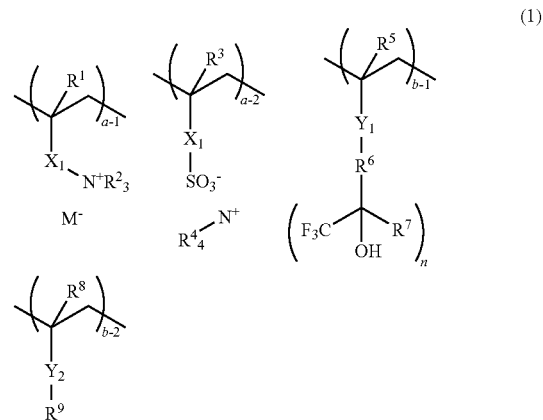

wherein $R^1$, $R^3$, $R^5$, and $R^8$ are each independently hydrogen or methyl, $X_1$ and $Y_2$ are each independently selected from the group consisting of a single bond, —O—$R^{10}$—, —C(=O)—O—$R^{10}$—, —C(=O)—NH—$R^{10}$—, a straight or branched $C_1$-$C_4$ alkylene, and phenylene group, wherein $R^{10}$ is a straight, branched or cyclic $C_1$-$C_{10}$ alkylene group which may contain an ester or ether group, n is 1 or 2, in case of n=1, $Y_1$ is selected from the group consisting of a single bond, —O—$R^{10}$—, —C(=O)—O—$R^{10}$—, —C(=O)—NH—$R^{10}$—, a straight or branched $C_1$-$C_4$ alkylene, and phenylene group, wherein $R^{10}$ is as defined above, in case of n=2, $Y_1$ is selected from the group consisting of —O—$R^{101}$=, —C(=O)—O—$R^{101}$=, —C(=O)—NH—$R^{101}$=, a straight or branched $C_1$-$C_4$ alkylene group with one hydrogen atom eliminated, and a phenyl group with one hydrogen atom eliminated, wherein $R^{101}$ is a straight, branched or cyclic $C_1$-$C_{10}$ alkylene group with one hydrogen atom eliminated which may contain an ester or ether group, $X_2$ is selected from the group consisting of a single bond, —O—$R^{11}$—, —C(=O)—O—$R^{11}$—, a straight or branched $C_1$-$C_4$ alkylene, and phenylene group, wherein $R^{11}$ is a straight, branched or cyclic $C_1$-$C_{10}$ alkylene group which may contain an ester or ether group and may contain a fluorine atom, $R^2$ and $R^4$ are each independently selected from the group consisting of hydrogen, a straight, branched or cyclic $C_1$-$C_{20}$ alkyl or $C_1$-$C_{20}$ alkenyl group which may contain a hydroxy, ether, ester, cyano, amino group, double bond or halogen atom, and a $C_6$-$C_{10}$ aryl group, plural $R^2$ or $R^4$ may bond together to form a ring of 3 to 20 carbon atoms, $M^-$ is a non-nucleophilic counter ion, $R^6$ is a straight, branched or Cyclic $C_1$-$C_{12}$ alkylene group, $R^7$ is hydrogen, fluorine, methyl, trifluoromethyl or difluoromethyl, or $R^7$ may bond with $R^6$ to form a ring which may contain an ether group, fluorinated alkylene group or trifluoromethyl group, $R^9$ is a straight, branched or cyclic $C_1$-$C_{20}$ alkyl group which has at least one fluorine atom substituted thereon and which may contain an ether, ester or sulfonamide group, the subscripts are numbers in the range: $0 \leq (a-1) < 1.0$, $0 \leq (a-2) < 1.0$, $0 < (a-1)+(a-2) < 1.0$, $0 \leq (b-1) < 1.0$, $0 \leq (b-2) < 1.0$, $0 < (b-1)+(b-2) < 1.0$, and $0.5 \leq (a-1)+(a-2)+(b-1)+(b-2) \leq 1.0$.

3. The resist composition of claim 1 which is a chemically amplified positive resist composition.

4. The resist composition of claim 3, wherein the base resin is a polymer comprising recurring units having acid labile groups and recurring units having hydroxy groups and/or adhesive groups of lactone ring.

5. The resist composition of claim 1, further comprising at least one member selected from the group consisting of an organic solvent, a basic compound, a dissolution regulator, and a surfactant.

6. A pattern forming process comprising the steps of:
applying the resist composition of claim 1 onto a substrate to form a coating,
heat treating the coating and exposing it to high-energy radiation, and
developing the exposed coating with a developer.

7. The process of claim 6, wherein the high-energy radiation has a wavelength of 180 to 250 nm.

8. The process of claim 6, wherein the exposing step is by immersion lithography involving exposing the coating to high-energy radiation through a liquid.

9. The process of claim 8, further comprising the step of forming a protective coating so that the protective coating intervenes between the photoresist coating and the liquid during the immersion lithography.

10. The process of claim 9, wherein the protective coating is an alkali-soluble protective film based on a polymer having an alpha-trifluoromethylhydroxy group.

11. The process of claim 8, wherein the immersion lithography involves using high-energy radiation having a wavelength of 180 to 250 nm, introducing a liquid between the substrate having a resist coating and a protective coating formed thereon and a projection lens, and exposing the substrate to the high-energy radiation through the liquid.

12. The process of claim 8, wherein the liquid is water.

* * * * *